US 11,863,188 B2

(12) United States Patent
Kang et al.

(10) Patent No.: US 11,863,188 B2
(45) Date of Patent: Jan. 2, 2024

(54) FLIP-FLOP CIRCUIT INCLUDING CONTROL SIGNAL GENERATION CIRCUIT

(71) Applicant: SAMSUNG ELECTRONICS CO., LTD., Suwon-si (KR)

(72) Inventors: Byounggon Kang, Seoul (KR); Dalhee Lee, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/843,585

(22) Filed: Jun. 17, 2022

(65) Prior Publication Data

US 2022/0407504 A1 Dec. 22, 2022

(30) Foreign Application Priority Data

Jun. 21, 2021 (KR) .................. 10-2021-0080359

(51) Int. Cl.
*H03K 3/03* (2006.01)
*H03K 3/037* (2006.01)
*H03K 19/20* (2006.01)

(52) U.S. Cl.
CPC .......... *H03K 3/0372* (2013.01); *H03K 19/20* (2013.01)

(58) Field of Classification Search
CPC .. H03K 3/02332; H03K 3/0372; H03K 3/289; H03K 3/3562
See application file for complete search history.

(56) References Cited

U.S. PATENT DOCUMENTS

| | | | |
|---|---|---|---|
| 6,630,853 B1 | 10/2003 | Hamada | |
| 7,231,569 B2 | 6/2007 | Chae | |
| 7,420,391 B2* | 9/2008 | Pesci ............... | H03K 3/356156 |
| | | | 326/46 |
| 8,570,086 B2 | 10/2013 | Hirairi | |
| 8,797,077 B2 | 8/2014 | Sasagawa | |
| 9,306,545 B2 | 4/2016 | Baratam | |
| 9,647,644 B2 | 5/2017 | Kim et al. | |
| 9,755,618 B1 | 9/2017 | Rasouli et al. | |
| 10,396,769 B2 | 8/2019 | Prasad et al. | |
| 10,715,119 B2* | 7/2020 | Mao .................. | H03K 3/35625 |

(Continued)

FOREIGN PATENT DOCUMENTS

| | | |
|---|---|---|
| KR | 1998-048100 A | 9/1998 |
| KR | 10-0609048 B1 | 8/2006 |

(Continued)

*Primary Examiner* — Quan Tra
(74) *Attorney, Agent, or Firm* — Sughrue Mion, PLLC

(57) ABSTRACT

A flip-flop circuit includes a first master latch circuit transmitting an inverted signal of an input signal received from an external device to a first node and transmitting an inverted signal of a signal of the first node to a second node, according to a first control signal having a first logic level or a second control signal having a second logic level, a first slave latch circuit transmitting an inverted signal of a signal of the second node to a third node according to the first control signal having the second logic level or the second control signal having the first logic level, a first output inverter generating a first output signal by inverting a signal of the third node, and a first control signal generation circuit generating the first control signal and the second control signal based on a clock signal and the signal of the first node.

18 Claims, 40 Drawing Sheets

(56) References Cited

U.S. PATENT DOCUMENTS

| | | | |
|---|---|---|---|
| 2011/0084748 A1* | 4/2011 | Firmin | H03K 3/356156 |
| | | | 327/202 |
| 2015/0200651 A1* | 7/2015 | Baratam | H03K 3/012 |
| | | | 327/202 |
| 2017/0077910 A1* | 3/2017 | Kim | G01R 31/318541 |
| 2017/0222630 A1* | 8/2017 | Kim | H03K 3/35625 |
| 2021/0099161 A1* | 4/2021 | Rasouli | H03K 3/356121 |

FOREIGN PATENT DOCUMENTS

| | | | |
|---|---|---|---|
| KR | 10-1076809 B1 | 10/2011 | |
| KR | 10-1699241 B1 | 1/2017 | |

\* cited by examiner

FLIP-FLOP CIRCUIT INCLUDING CONTROL SIGNAL GENERATION CIRCUIT

CROSS-REFERENCE TO RELATED APPLICATION

This application is based on and claims priority under 35 U.S.C. § 119 to Korean Patent Application No. 10-2021-0080359, filed on Jun. 21, 2021, in the Korean Intellectual Property Office, the disclosure of which is incorporated by reference herein in its entirety.

BACKGROUND

The inventive concept relates to a flip-flop circuit, and more particularly, to a low-power flip-flop circuit including a control signal generation circuit.

As a semiconductor integrated circuit has higher performance and integration, the number of flip-flop circuits included in the semiconductor integrated circuit increases. A flip-flop circuit is used as a data storage device to store a state. A flip-flop circuit is an electronic circuit capable of storing and retaining 1-bit information and is a basic component of a sequential logic circuit.

SUMMARY

The inventive concept provides a flip-flop circuit including a control signal generation circuit. The flip-flop circuit of the inventive concept may perform a low-power operation.

According to an embodiment, there is provided a flip-flop circuit including: a first master latch circuit configured to transmit a first inverted signal of a first input signal received from an external device to a first node and transmit a second inverted signal of the first inverted signal at the first node to a second node, based on a first control signal having a first logic level or a second control signal having a second logic level; a first slave latch circuit configured to transmit a third inverted signal of the second inverted signal at the second node to a third node according to the first control signal having the second logic level or the second control signal having the first logic level; a first output inverter configured to generate a first output signal by inverting the third inverted signal at the third node; and a first control signal generation circuit configured to generate the first control signal and the second control signal based on a clock signal and the first inverted signal at the first node.

According to an embodiment, there is provided a flip-flop circuit including: an input circuit configured to invert an input signal received from an external device and transmit a first inverted signal of the input signal to a first node; a master latch circuit configured to transmit a second inverted signal of the first inverted signal at the first node to a second node and transmit a third inverted signal of the second inverted signal at the second node to a third node, based on a first control signal having a first logic level or a second control signal having a second logic level; a slave latch circuit configured to transmit a fourth inverted signal of the third inverted signal at the third node to a fourth node and transmit a fifth inverted signal of the fourth inverted signal at the fourth node to a fifth node, based on the first control signal having the second logic level or the second control signal having the first logic level; an output inverter configured to generate an output signal by inverting the fifth inverted signal of the fifth node; and a control signal generation circuit configured to generate the first control signal and the second control signal based on a clock signal, the first inverted signal of the first node, the second inverted signal of the second node, and the fifth inverted signal of the fifth node.

According to an embodiment, there is provided a flip-flop circuit including: an input circuit configured to invert an input signal received from an external device and transmit a first inverted signal of the input signal to a first node; a master latch circuit configured to transmit a second inverted signal of the first inverted signal at the first node to a second node and transmit a third inverted signal of the second inverted signal at the second node to a third node, based on a first control signal having a first logic level or a second control signal having a second logic level; a slave latch circuit configured to transmit a fourth inverted signal of the third inverted signal at the third node to a fourth node and transmit a fifth inverted signal of the fourth inverted signal at the fourth node to a fifth node, based on the first control signal having the second logic level or the second control signal having the first logic level; an output inverter configured to generate an output signal by inverting the fifth inverted signal of the fifth node; and a control signal generation circuit configured to generate the first control signal and the second control signal based on a clock signal, the first inverted signal of the first node, the second inverted signal of the second node, and the fourth inverted signal of the fourth node.

According to an embodiment, there is provided a flip-flop circuit including: a master latch circuit configured to transmit a first inverted signal of an input signal received from an external device to a first node and transmit a second inverted signal of the first inverted signal at the first node to a second node, based on a first control signal having a first logic level or a second control signal having a second logic level; a slave latch circuit configured to transmit a third inverted signal of the second inverted signal at the second node to a third node based on the first control signal having the second logic level or the second control signal having the first logic level; an output inverter configured to generate a first output signal by inverting the third inverted signal of the third node; and a control signal generation circuit configured to generate the first control signal and the second control signal based on a clock signal and the first inverted signal of the first node. The control signal generation circuit includes: an inverter configured to generate the first control signal by inverting the clock signal received from the external device; and a NOR circuit configured to generate the second control signal by performing a NOR operation on the first inverted signal of the first node and the first control signal. The slave latch circuit includes: a first tri-state inverter configured to transmit the signal of the second node to the third node based on the first control signal and the second control signal; a P-type transistor having a gate terminal configured to receive the second control signal, a source terminal connected to a positive power node, and a drain terminal connected to a fourth node; and an N-type transistor having a gate terminal configured to receive the first control signal, a source terminal connected to a negative power node, and a drain terminal connected to a fifth node. The master latch circuit includes a selection circuit configured to receive a data signal and scan input signal as the input signal, receive a scan enable signal and an inverted scan enable signal from the external device, and transmit an inverted signal of one of the data signal and the scan input signal to the first node according to the scan enable signal and the inverted scan enable signal, and wherein the selection circuit is connected to the negative power node through the fifth node when the first control signal has the first logic level and is connected to the positive power node through the fifth node when the second control signal has the second logic level.

BRIEF DESCRIPTION OF THE DRAWINGS

Embodiments of the inventive concept will be more apparent from the following description taken in conjunction with the accompanying drawings, in which.

DETAILED DESCRIPTION

Hereinafter, various embodiments of the inventive concept are described with reference to the accompanying drawings.

Figure 1:
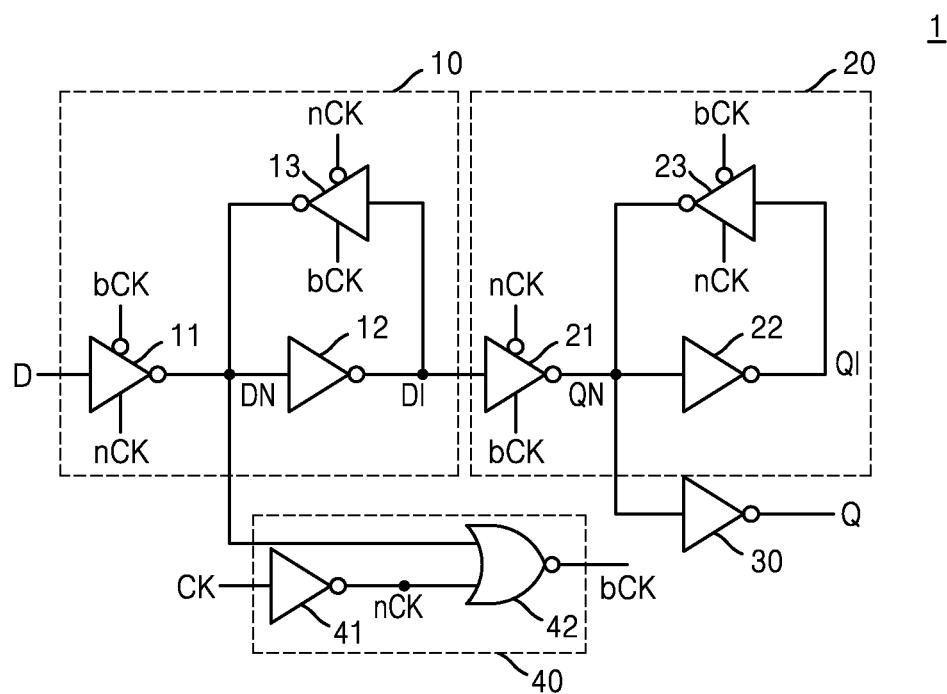
FIG. 1 is a circuit diagram for describing a flip-flop circuit according to an example embodiment.

FIG. 1 is a circuit diagram for describing a flip-flop circuit 1 according to an example embodiment.

Referring to FIG. 1, the flip-flop circuit 1 may receive a data signal D and a clock signal CK, and may output an output signal Q.

The flip-flop circuit 1 may include a master latch circuit 10, a slave latch circuit 20, an output inverter 30, and a control signal generation circuit 40.

The master latch circuit 10 may transmit the data signal D to a second node DI based on a first control signal nCK and a second control signal bCK.

The master latch circuit 10 may include a first tri-state inverter 11, a first inverter 12, and a second tri-state inverter 13.

The first tri-state inverter 11 may invert the data signal D and transmit an inverted signal with respect to the data signal D to a first node DN based on the first control signal nCK and the second control signal bCK.

For example, when the first control signal nCK has a first logic level (e.g., a logic high level), the first tri-state inverter 11 may be in an active state in which the first tri-state inverter 11 operates as an inverter with respect to a data signal D having the first logic level. That is, the first tri-state inverter 11 may invert the data signal D having the first logic level and transmit the inverted signal to the first node DN. Thus, a signal of the first node DN may have a second logic level (e.g., a logic low level). In the disclosure, a first logic level may refer to a logic high level, and a second logic level may refer to a logic low level.

When the first control signal nCK has the second logic level, the first tri-state inverter 11 may be in an inactive state or a floating state in which the first tri-state inverter 11 does not operate as an inverter with respect to the data signal D having the first logic level. That is, when the first control signal nCK has the second logic level, the first tri-state inverter 11 may not transmit the data signal D having the first logic level to the first node DN.

When the second control signal bCK has the second logic level, the first tri-state inverter 11 may be in an active state in which the first tri-state inverter 11 operates as an inverter with respect to a data signal D having the second logic level. That is, the first tri-state inverter 11 may invert the data signal D having the second logic level and transmit the inverted signal to the first node DN. Thus, a signal of the first node DN may have the first logic level.

When the second control signal bCK has the first logic level, the first tri-state inverter 11 may be in an inactive state or a floating state in which the first tri-state inverter 11 does not operate as an inverter with respect to the data signal D having the second logic level. That is, when the second control signal bCK has the first logic level, the first tri-state inverter 11 may not transmit the data signal D having the second logic level to the first node DN.

The first inverter 12 may invert the signal of the first node DN and transmit the inverted signal to the second node DI. A signal of the second node DI may have the same logic level as the data signal D.

The second tri-state inverter 13 may invert the signal of the second node DI based on the first control signal nCK and the second control signal bCK and transmit the inverted signal to the first node DN.

For example, when the second control signal bCK has the first logic level, the second tri-state inverter 13 may be in an active state in which the second tri-state inverter 13 operates as an inverter with respect to a signal of the second node DI having the first logic level. That is, the second tri-state inverter 13 may invert the signal of the second node DI having the first logic level and transmit the inverted signal to the first node DN. Thus, a signal of the first node DN may have the second logic level.

When the second control signal bCK has the second logic level, the second tri-state inverter 13 may be in an inactive state or a floating state in which the second tri-state inverter 13 does not operate as an inverter with respect to the signal of the second node DI having the first logic level That is, when the second control signal bCK has the second logic level, the second tri-state inverter 13 may not transmit the signal of the second node DI having the first logic level to the first node DN.

When the first control signal nCK has the second logic level, the second tri-state inverter 13 may be in an active state in which the second tri-state inverter 13 operates as an inverter with respect to a signal of the second node DI having the second logic level. That is, the second tri-state inverter 13 may invert the signal of the second node DI having the second logic level and transmit the inverted signal to the first node DN. Thus, a signal of the first node DN may have the first logic level.

When the first control signal nCK has the first logic level, the second tri-state inverter 13 may be in an inactive state or a floating state in which the second tri-state inverter 13 does not operate as an inverter with respect to the signal of the second node DI having the second logic level. That is, when the first control signal nCK has the first logic level, the second tri-state inverter 13 may not transmit the signal of the second node DI having the second logic level to the first node DN.

When the second tri-state inverter 13 is in the active state, the first inverter 12 and the second tri-state inverter 13 may operate as a latch circuit for maintaining a signal level of the first node DN and the second node DI.

The slave latch circuit 20 may include a third tri-state inverter 21, a second inverter 22, and a fourth tri-state inverter 23.

The third tri-state inverter 21 may invert the signal of the second node DI based on the first control signal nCK and the second control signal bCK and transmit the inverted signal to a third node QN. The operation of the third tri-state inverter 21 may be the same as the operation of the second tri-state inverter 13 described above.

The second inverter 22 may invert a signal of the third node QN and transmit the inverted signal to a fourth node QI. The operation of the second inverter 22 may be the same as the operation of the first inverter 12 described above.

The fourth tri-state inverter 23 may invert a signal of a fourth node QI based on the first control signal nCK and the second control signal bCK and transmit the inverted signal to the third node QN. The operation of the fourth tri-state inverter 23 may be the same as the operation of the first tri-state inverter 11 described above.

The output inverter 30 may invert a signal of the third node QN to generate an output signal Q.

The control signal generation circuit 40 may receive a clock signal CK and the signal of the first node DN and generate the first control signal nCK and the second control signal bCK.

The control signal generation circuit 40 may include a third inverter 41 and a NOR circuit 42. The third inverter 41 may generate the first control signal nCK by inverting the clock signal CK. The NOR circuit 42 may generate the second control signal bCK by performing a NOR operation on the signal of the first node DN and the first control signal nCK. Thus, the second control signal bCK may have the first logic level, only when the signal of the first node DN has the second logic level, and the first control signal nCK has the second logic level. That is, while the clock signal CK is toggled, a section in which the second control signal bCK has the first logic level may be decreased, and thus, currents consumed by the first through fourth tri-state inverters 11, 13, 21, and 23 according to the second control signal nCK may be reduced.

The flip-flop circuit 1 according to an example embodiment may generate the first control signal nCK and the second control signal bCK based on the first node DN and the clock signal CK, and thus, may perform a flip-flop circuit operation consuming low power.

Figure 2A:
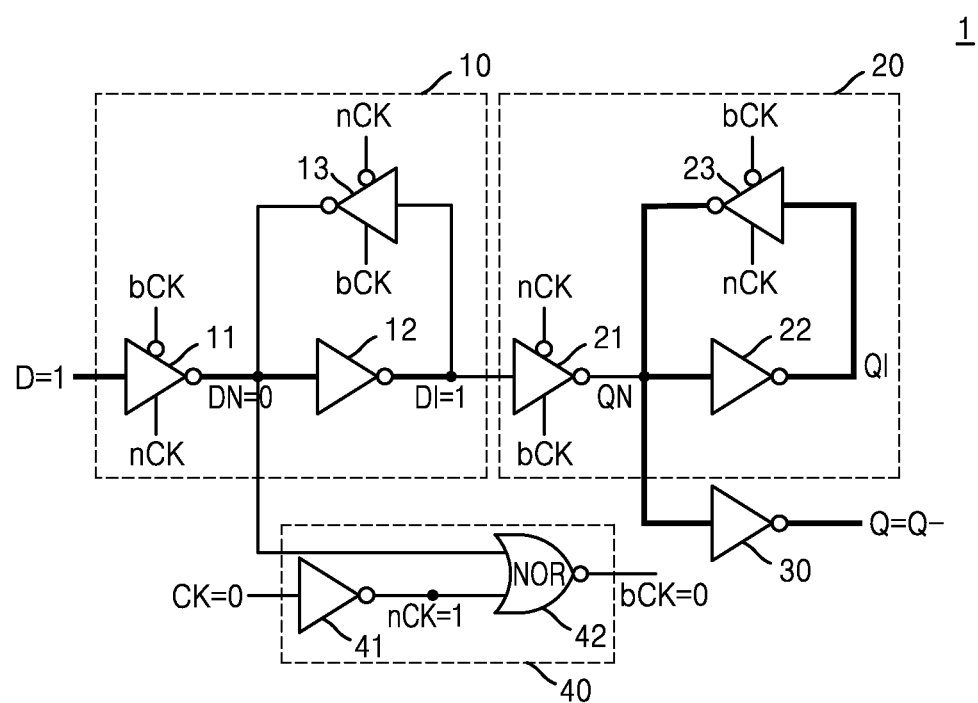
FIGS. 2A through 2D are circuit diagrams for describing an operation of a flip-flop circuit according to an example embodiment.

FIGS. 2A through 2D are circuit diagrams for describing operations of the flip-flop circuit 1 according to an example embodiment. FIG. 2A describes the operation of the flip-flop circuit 1 when a data signal D has a first logic level, and a clock signal CK has a second logic level, FIG. 2B describes the operation of the flip-flop circuit 1 when the data signal D has the first logic level, and the clock signal CK is transited to the first logic level, FIG. 2C describes the operation of the flip-flop circuit 1 when the data signal D has the second logic level, and the clock signal CK has the second logic level, and FIG. 2D describes the operation of the flip-flop circuit 1 when the data signal D has the second logic level, and the clock signal CK is transited to the first logic level. In FIGS. 2A through 2D, the first logic level may be indicated as "1," and the second logic level may be indicated as "0."

Referring to FIG. 2A, when the clock signal CK has the second logic level, a logic level of a first control signal nCK may be the first logic level via the third inverter 41, and a logic level of a second control signal bCK may be the second logic level via the NOR circuit 42.

When the logic level of the first control signal nCK is the first logic level, and the logic level of the second control signal bCK is the second logic level, the first tri-state inverter 11 and the fourth tri-state inverter 23 may be in an active state in which the first tri-state inverter 11 and the fourth tri-state inverter 23 operate as inverters regardless of a logic level of the data signal D. The second tri-state inverter 13 and the third tri-state inverter 21 may be in an inactive state or a floating state in which the second tri-state inverter 13 and the third tri-state inverter 21 do not operate as inverters regardless of the logic level of the data signal D.

The first tri-state inverter 11 may transmit an inverted signal of the data signal D to the first node DN, and thus, a logic level of a signal of the first node DN may be the second logic level. The first inverter 12 may transmit an inverted signal of the signal of the first node DN to the second node DI, and thus, a logic level of a signal of the second node DI may be the first logic level.

The fourth tri-state inverter 23 may provide an inverted signal of a signal of the fourth node QI to the third node QN. Thus, the second inverter 22 and the fourth tri-state inverter 23 may perform a latch operation for maintaining logic levels of signals of the third node QN and the fourth node QI. The output inverter 30 may perform a hold operation for maintaining a logic level of an output signal Q as a logic level of a prior output signal Q− by inverting the signal of the third node QN.

Figure 2B:
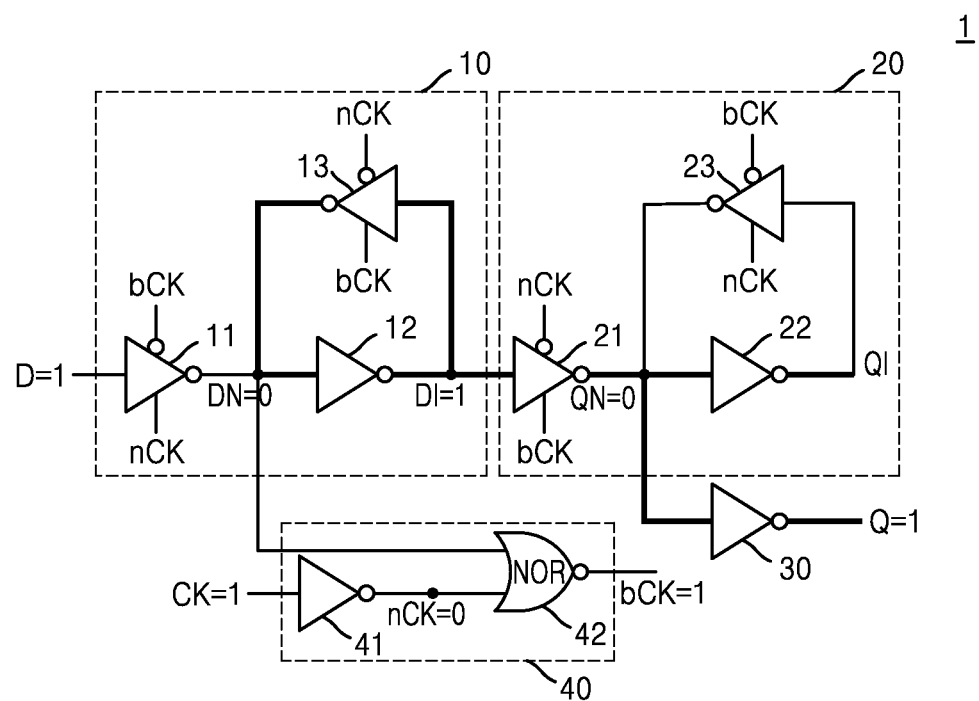

Referring to FIG. 2B, when the clock signal CK transitions to the first logic level, the first control signal nCK may have the second logic level via the third inverter 41. When the first control signal nCK has the second logic level, the first tri-state inverter 11 may be in an inactive state with respect to a data signal D having the first logic level, and thus, the logic level of the signal of the first node DN may be maintained as the second logic level.

The first control signal nCK may have the second logic level, and the signal of the first node DN may have the second logic level, and thus, the second control signal bCK may have the first logic level via the NOR circuit 42.

When the logic level of the first control signal nCK is the second logic level, and the logic level of the second control signal bCK is the first logic level, the first tri-state inverter 11 and the fourth tri-state inverter 23 may be in an in active state or a floating state in which the first tri-state inverter 11 and the fourth tri-state inverter 23 do not operate as inverters regardless of the logic level of the data signal D. The second tri-state inverter 13 and the third tri-state inverter 21 may be in an active state in which the second tri-state inverter 13 and the third tri-state inverter 21 operate as inverters regardless of the logic level of the data signal D.

The first inverter 12 and the second tri-state inverter 13 may perform a latch operation for maintaining the logic levels of the signals of the first node DN and the second node DI.

The third tri-state inverter 21 may invert the signal of the second node DI and transmit the inverted signal to the third node QN, and thus, a logic level of a signal of the third node QN may be the second logic level. The output inverter 30 may generate the output signal Q by inverting the signal of the third node QN, and thus, a logic level of the output signal Q may be the first logic level.

Referring to FIGS. 2A and 2B, when the data signal D has the first logic level, the output signal Q may have the first logic level by being synchronized to the clock signal CK at a timing at which the clock signal CK transitions from the first logic level to the second logic level.

Figure 2C:
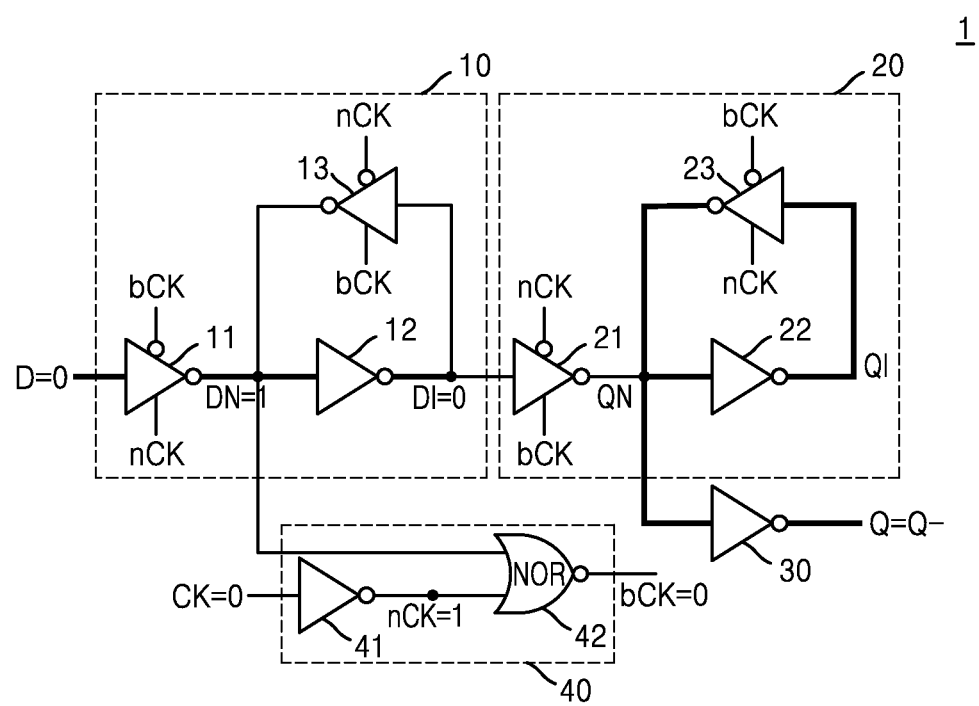

Referring to FIG. 2C, when the clock signal CK has the second logic level, a logic level of the first control signal nCK may be the first logic level, and a logic level of the second control signal bCK may be the second logic level, and thus, the same operation as FIG. 2A may be performed. For example, the first tri-state inverter 11 may be in an active state with respect to a data signal D having the second logic level. Thus, a logic level of a signal of the first node DN may be the first logic level. The first inverter 12 may invert the signal of the first node DN and transmit the inverted signal to the second node DI, and thus, a logic level of the second node DI may be the second logic level. The logic level of the output signal Q may be maintained as a logic level of the prior output signal Q− via the second inverter 22, the fourth tri-state inverter 23, and the output inverter 30. That is, when the clock signal CK has the second logic level, the flip-flop circuit 1 may perform a hold operation for maintaining the logic level of the output signal Q as the logic level of the prior output signal Q−. The prior output signal Q− may indicate a logic level of the output signal Q determined by a prior active edge of the clock signal CK.

Figure 2D:
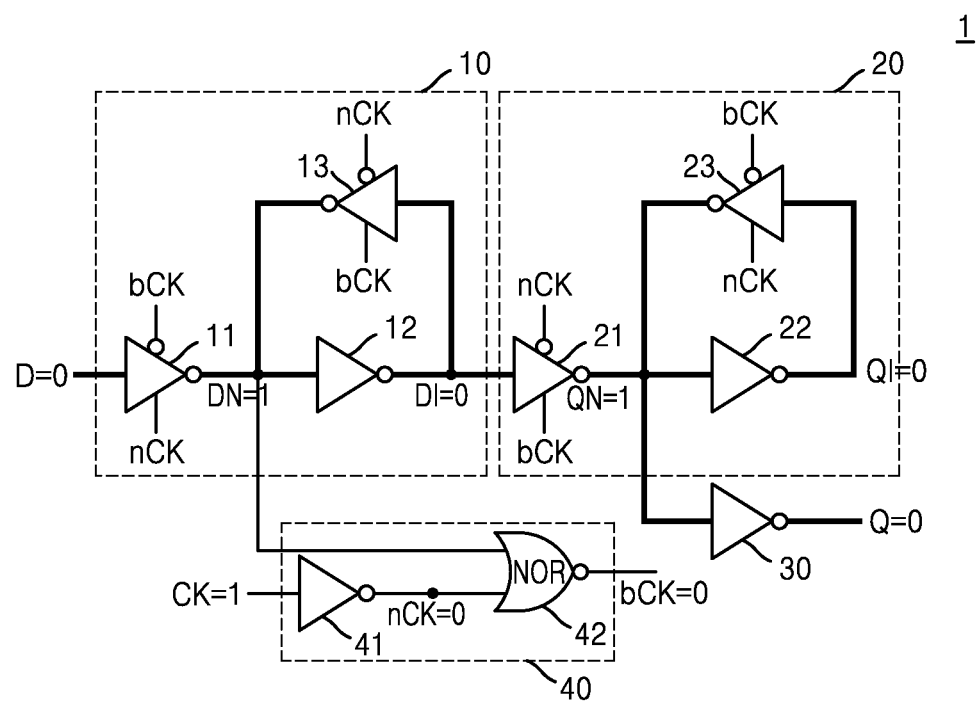

Referring to FIG. 2D, when the logic level of the clock signal CK transitions to the first logic level, the logic level of the first control signal nCK may transition to the second logic level via the third inverter 41.

When the logic level of the first control signal nCK is the second logic level, the second tri-state inverter 13 may be in an active state with respect to a signal of the second node DI having the second logic level. Thus, via a latch structure formed by the second tri-state inverter 13 and the first inverter 12, the logic level of the signal of the first node DN may be maintained as the first logic level, and the logic level of the signal of the second node DI may be maintained as the second logic level.

Because the logic level of the signal of the first node DN is the first logic level, and the logic level of the first control signal nCK is the first logic level, the logic level of the second control signal bCK may be maintained as the second logic level via the NOR circuit 42.

Because the logic level of the first control signal nCK is the second logic level, the second tri-state inverter 13 and the third tri-state inverter 21 may operate as inverters with respect to a signal having the second logic level. Because the third tri-state inverter 21 may invert the signal of the second node DI having the second logic level and transmit the inverted signal to the third node QN, a signal of the third node QN may have the first logic level.

Because the logic level of the second control signal bCK is the second logic level, the first tri-state inverter 11 and the fourth tri-state inverter 23 may operate as inverters with respect to a signal having the second logic level. Thus, via a latch structure formed by the second inverter 22 and the fourth tri-state inverter 23, a logic level of the signal of the third node QN may be maintained as the first logic level, and a logic level of a signal of the fourth node QI may be maintained as the second logic level.

Because the output inverter 30 may generate the output signal Q by inverting the signal of the third node QN, the logic level of the output signal Q may be the second logic level.

Referring to FIGS. 2C and 2D, when the data signal D has the second logic level, the output signal Q may have the second logic level by being synchronized to the clock signal CK at a timing at which the clock signal CK transitions from the second logic level to the first logic level.

Also, referring to FIGS. 2A through 2D, the second control signal bCK may have the first logic level, only when the logic level of the clock signal CK is the first logic level, and the logic level of the data signal D is the first logic level. Thus, the power consumed by the first through fourth tri-state inverters 11, 13, 21, and 23 according to the second control signal bCK may be reduced.

Figure 3A:
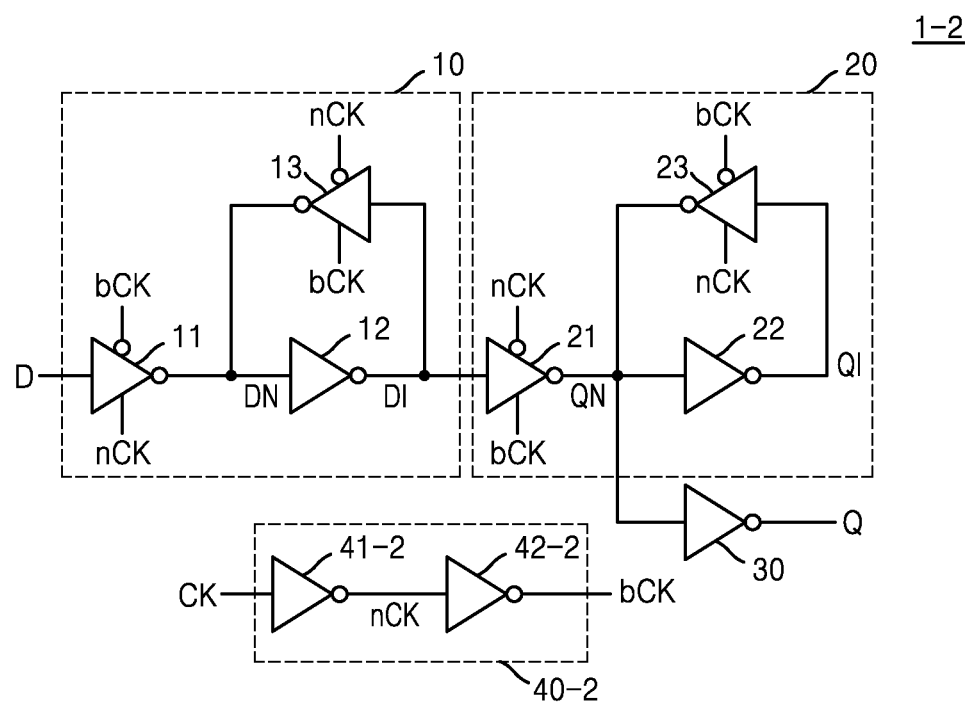
FIGS. 3A through 3C are diagrams for describing an operation of a normal flip-flop circuit.
Figure 3B:
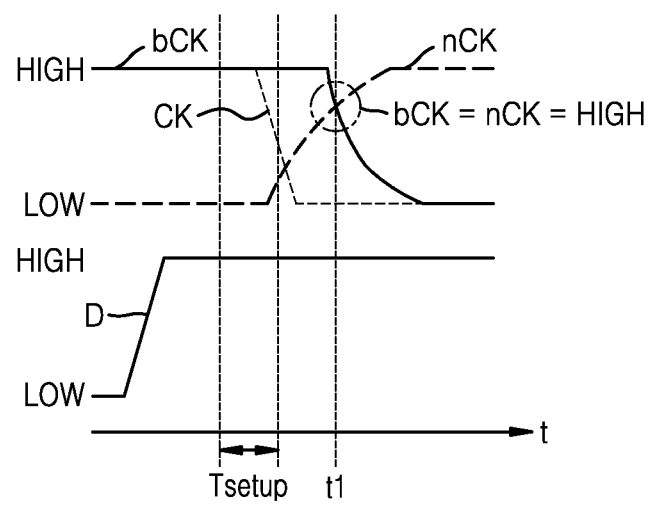
Figure 3C:
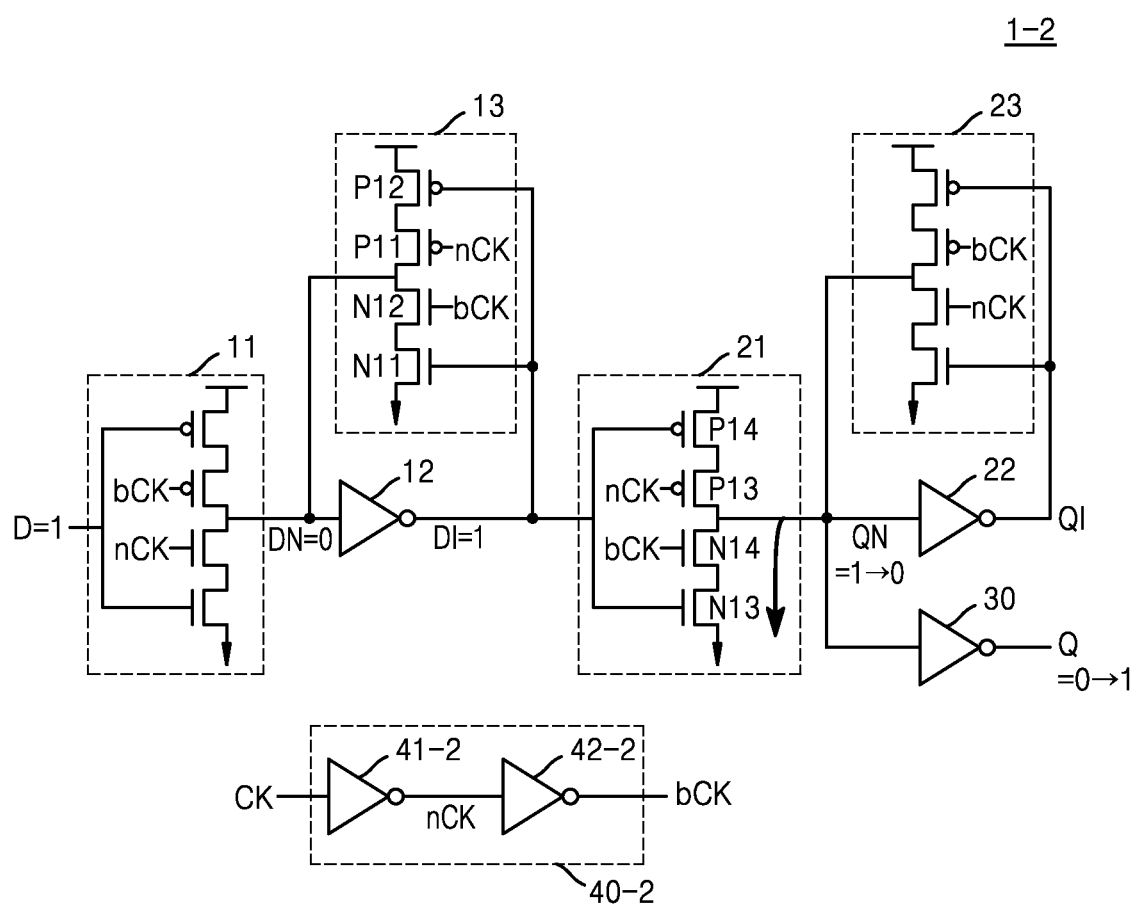

FIGS. 3A through 3C are views for describing an operation of a normal flip-flop circuit 1-2. FIG. 3A is a circuit diagram of the normal flip-flop circuit 1-2, FIG. 3B is a diagram for describing control signals generated by a clock buffer 40-2 included in the normal flip-flop circuit 1-2, and FIG. 3C is a detailed circuit diagram of the normal flip-flop circuit 1-2.

Referring to FIG. 3A, the normal flip-flop circuit 1-2 may include the clock buffer 40-2. The clock buffer 40-2 may receive a clock signal CK and generate a first control signal nCK and a second control signal bCK.

The clock buffer 40-2 may include a first clock inverter 41-2 and a second clock inverter 42-2. The first clock inverter 41-2 may generate the first control signal nCK by inverting the clock signal CK, and the second clock inverter 42-2 may generate the second control signal bCK by inverting the first control signal nCK.

Referring to FIG. 3B, when the clock signal CK transitions from a first logic level (e.g., a logic high level) to a second logic level (e.g., a logic low level), a logic level of each of the first control signal nCK and the second control signal bCK may also transition from one state to another. For example, when the clock signal CK transitions from high to low, the logic level of the first control signal nCK may transition from low to high, and the logic level of the second control signal bCK may transition from high to low. A data signal D may be maintained as a logic high level from a time prior to a set up time Tsetup based on a descending edge of the clock signal CK.

A timing at which the logic level of the first control signal nCK transitions may be delayed compared to a timing at which the logic level of the clock signal CK transitions. Also, a timing at which the logic level of the second control signal bCK transitions may be delayed similarly to the timing at which the logic level of the first control signal nCK transitions.

The timings at which the logic levels transition may be different from each other, and thus, there may be a section at which both of the first control signal nCK and the second control signal bCK are recognized as the first logic level. For example, in FIG. 3B, at a first point time t1, both of the first control signal nCK and the second control signal bCK may be recognized as the first logic level.

FIG. 3C is the circuit diagram of the normal flip-flop circuit 1-2 before and after a first time point t1 illustrated in FIG. 3B.

Referring to FIG. 3C, the second tri-state inverter 13 may include first and second N-type transistors N11 and N12 and first and second p-type transistors P11 and P12. The third tri-state inverter 21 may include third and fourth N-type transistors N13 and N14 and third and fourth P-type transistors P13 and P14.

The clock signal CK has the second logic level at the first time point t1, and thus, the normal flip-flop circuit 1-2 may have to perform a hold operation for maintaining an output signal Q as a prior output signal Q−, that is, the second logic level.

However, the logic level of the second control signal bCK at the first time point t1 is the first logic level, and thus, the fourth N-type transistor T14 included in the third tri-state inverter 21 may be turned on, and the third node QN may be discharged. Thus, a signal of the third node QN may transition to the second logic level, and the output signal Q may transition to the first logic level. That is, at the first time point t1, the normal flip-flop circuit 1-2 may fail to hold the prior output signal Q− as the output signal Q.

Figure 4:
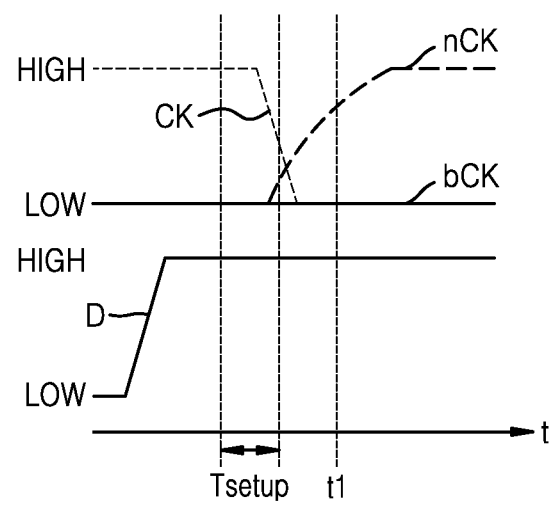
FIG. 4 is a timing diagram for describing a flip-flop circuit according to an example embodiment.

FIG. 4 is a timing diagram for describing a flip-flop circuit according to an example embodiment.

Referring to FIG. 4, a data signal D may be maintained as a first logic level for a predetermined time period from a time prior to a set up time Tsetup based on a time point at which a clock signal CK transitions from the first logic level to a second logic level. The data signal D may have the second logic level before being maintained as the first logic level. That is, the timing diagram of FIG. 4 illustrates a sequential process of the operation of the flip-flop circuit 1 illustrated in FIG. 2D and the operation of the flip-flop circuit 1 illustrated in FIG. 2A.

Referring to FIG. 4, even when the clock signal CK transitions from the first logic level to the second logic level, the second control signal bCK may not transition and may be maintained as the second logic level. Thus, as illustrated in FIG. 3B, a situation in which both of the first control signal nCK and the second control signal bCK may be recognized as the first logic level may not occur.

Figure 5:
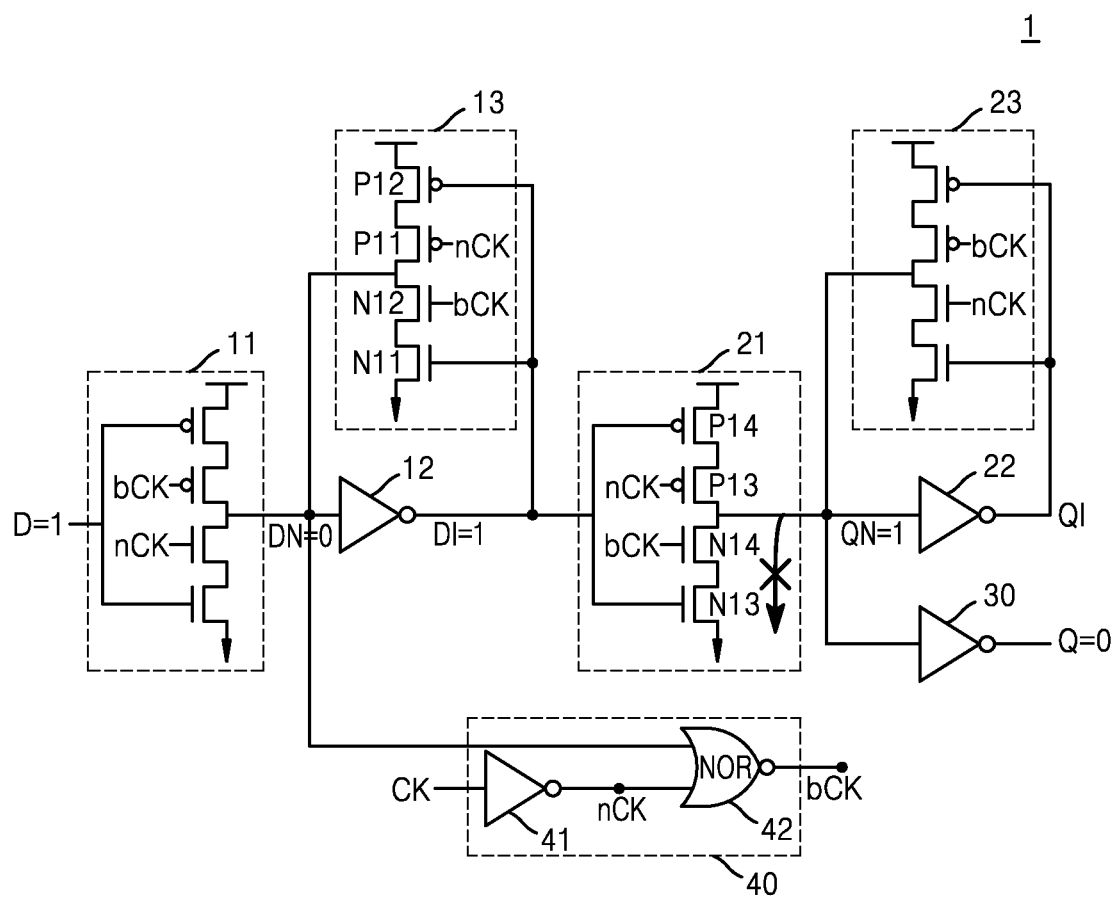
FIG. 5 is a circuit diagram for describing a flip-flop circuit performing a hold operation, according to an example embodiment.

FIG. 5 is a circuit diagram for describing the flip-flop circuit 1 performing a hold operation, according to an example embodiment.

Referring to FIGS. 2D and 4, when the clock signal CK has the first logic level, and the data signal D has the second logic level, the logic level of the third node QN may be the first logic level, and a logic level of the output signal Q may be the second logic level.

Referring to FIGS. 2A, 4, and 5, when the clock signal CK transitions from the first logic level to the second logic level, the output signal Q may be maintained as the logic level of the prior output signal Q−. That is, the logic level of the output signal Q may be maintained as the second logic level. Also, the logic level of the second control signal bCK may be maintained as the second logic level, and thus, the second N-type transistor N12 may not be turned on, unlike the normal flip-flop circuit 1-2 of FIG. 3C. Here, because the third node QN may not be discharged, the flip-flop circuit 1 according to an embodiment may hold the prior output signal Q− as the output signal Q at the first time point t1.

Figure 6:
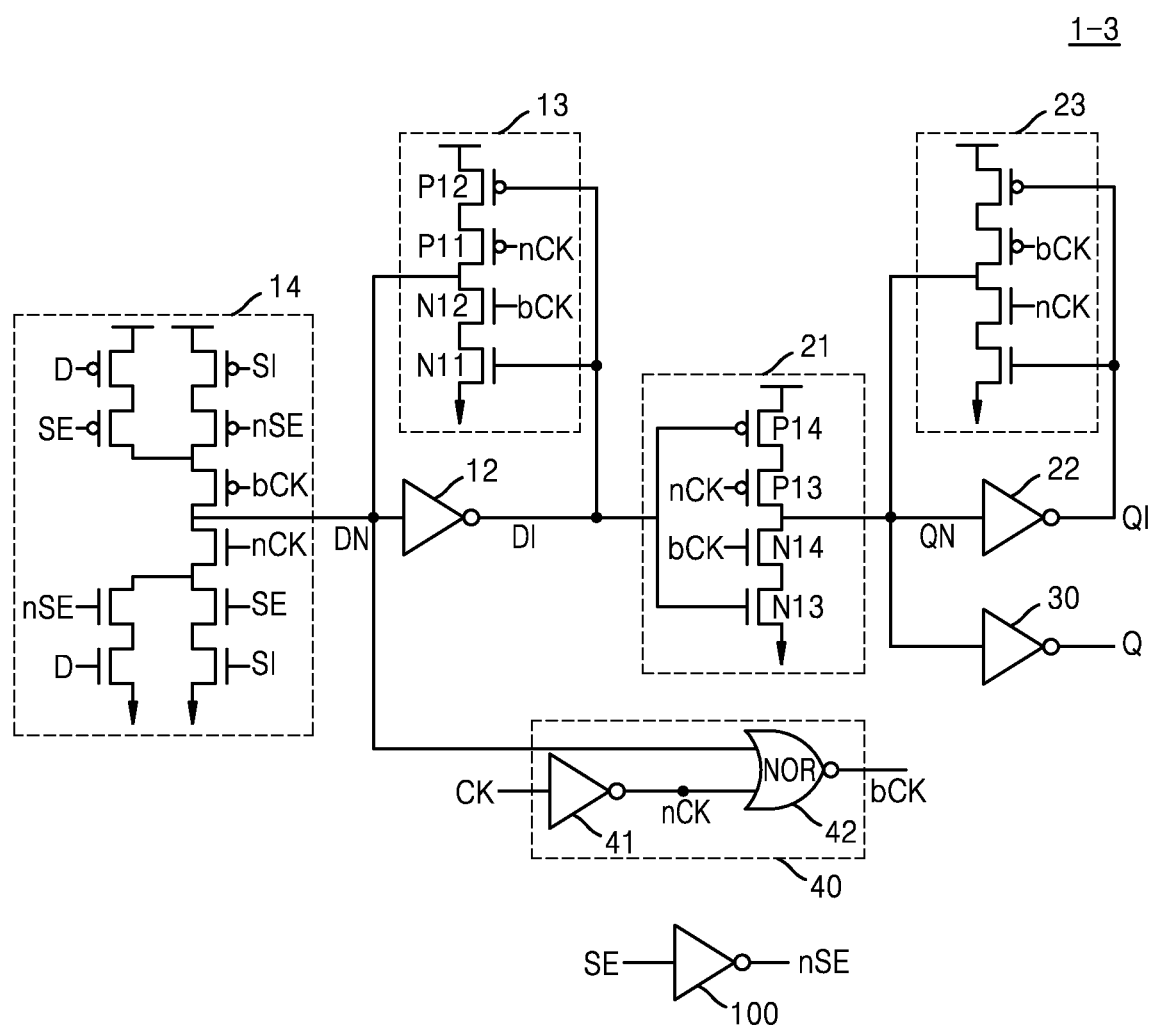
FIG. 6 is a circuit diagram for describing a flip-flop circuit according to an example embodiment.

FIG. 6 is a circuit diagram for describing a flip-flop circuit 1-3 according to an example embodiment.

Referring to FIG. 6, the flip-flop circuit 1-3 may be a scan flip-flop circuit configured to receive a data signal D, a scan input signal SI, and a scan enable signal SE and output an output signal Q according to a first control signal nCK and a second control signal bCK. The flip-flop circuit 1-3 may include a scan inverter 100. The scan inverter 100 may receive the scan enable signal SE and invert the scan enable signal SE to generate an inverted scan enable signal nSE.

The scan enable signal SE may indicate a first operation mode or a second operation mode according to a logic level. For example, when the scan enable signal SE has a second logic level, the scan enable signal SE may indicate the first operation mode, and when the scan enable signal SE has a first logic level, the scan enable signal SE may indicate the second operation mode. For example, the first operation mode may be a normal operation mode in which data transmission is performed, and the second operation mode may be a scan test mode in which a test operation is performed. However, the one or more embodiments are not limited thereto, and the first operation mode and the second operation mode may be variously configured. In some embodiments, the first operation mode may be a scan test mode, and the second operation mode may be a normal operation mode.

When the scan enable signal SE indicates the normal operation mode, the flip-flop circuit 1-3 may perform a normal operation of latching the data signal D and providing the output signal Q. When the scan enable signal SE indicates the scan test mode, the flip-flop circuit 1-3 may perform a scan test operation of latching the scan input signal SI and providing the output signal Q.

The flip-flop circuit 1-3 may additionally include an input selection circuit 14. The input selection circuit 14 may select one of the data signal D and the scan input signal SI as an input signal according to the scan enable signal SE and the inverted scan enable signal nSE. The input selection circuit 14 may invert the selected input signal based on the first control signal nCK or the second control signal bCK and transmit the inverted signal to the first node DN.

When the scan enable signal SE has the second logic level, the input selection circuit 14 may operate as a tri-state inverter (for example, the first tri-state inverter 11 of FIG. 5)

inverting the data signal D based on the first control signal nCK and the second control signal bCK.

Figure 7:
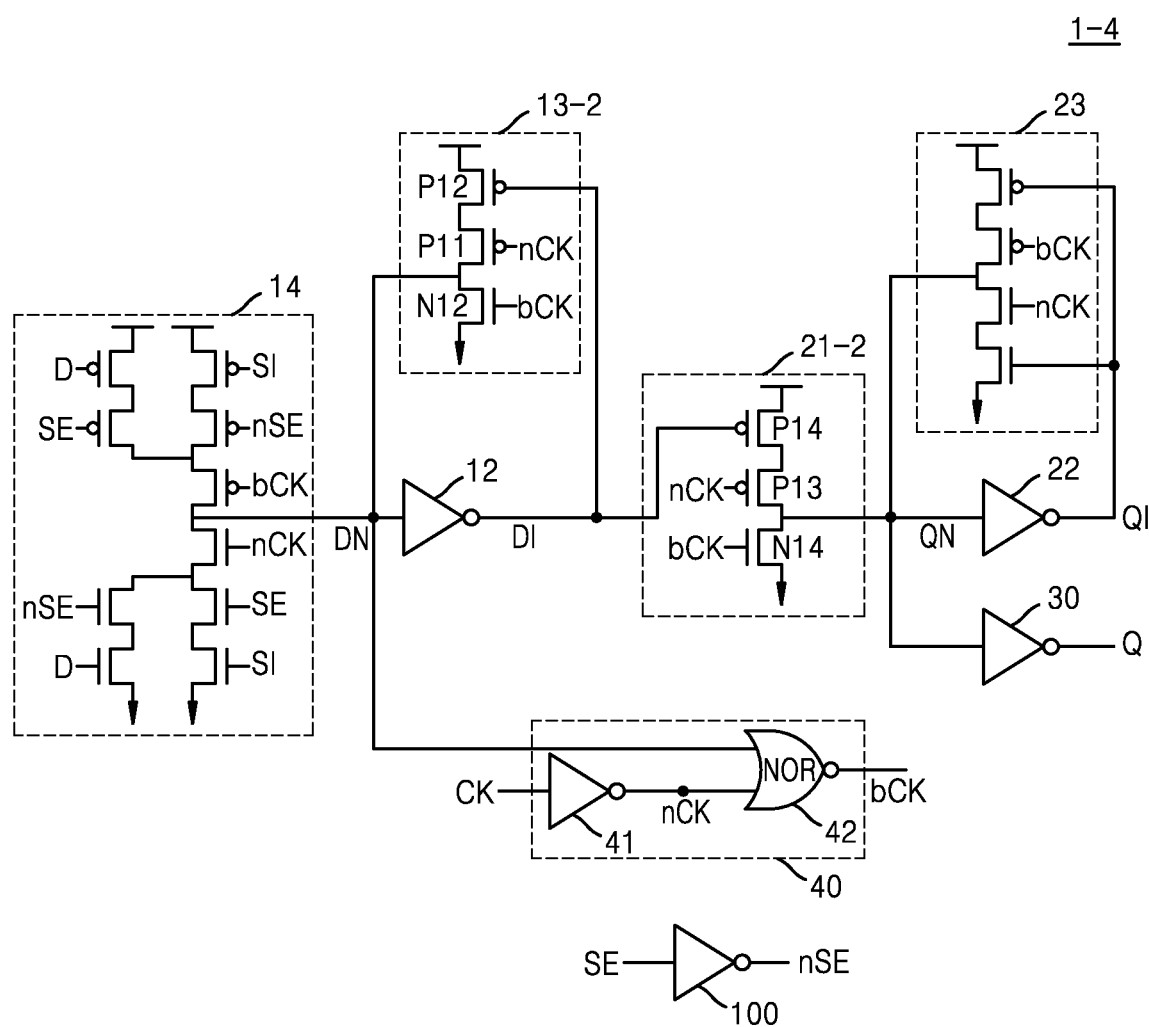
FIG. 7 is a circuit diagram for describing a flip-flop circuit according to an example embodiment.

FIG. 7 is a circuit diagram for describing a flip-flop circuit 1-4 according to an example embodiment.

Referring to FIG. 7, the flip-flop circuit 1-4 may include a second tri-state inverter 13-2 and a third tri-state inverter 21-2.

Unlike the second tri-state inverter 13 of FIG. 6, the second tri-state inverter 13-2 may be realized as three transistors.

For example, the second tri-state inverter 13-2 may include the second N-type transistor N12, and the first and second P-type transistors P11 and P12 from among the transistors included in the second tri-state inverter 13 of FIG. 6. That is, the first N-type transistor N11 from among the transistors included in the second tri-state inverter 13 of FIG. 6 may be omitted according to this embodiment. In FIG. 6, a gate terminal of the first N-type transistor N11 may be connected to the second node DI. In FIG. 7, a gate terminal of the second P-type transistor P12 may be connected to the second node DI.

Referring back to FIG. 2B, when the logic level of the clock signal CK is the first logic level, and the logic level of the data signal D is the first logic level, the logic level of the second node DI may be the second logic level, and the logic level of the first node DN may be the first logic level. That is, the second tri-state inverter 13 may operate as an inverter.

Also, when the logic level of the clock signal CK is the first logic level, and the logic level of the data signal D is the first logic level, the logic level of the second control signal bCK may be the first logic level.

Referring to FIG. 7, the second N-type transistor N12 may be turned on according to the second control signal bCK having the first logic level, and thus, a logic level of the first node DN may be maintained as the second logic level. That is, even when the first N-type transistor N11 is omitted, the second tri-state inverter 13-2 of FIG. 7 may operate as an inverter.

Unlike the third tri-state inverter 21 of FIG. 6, the third tri-state inverter 21-2 may be realized with only three transistors.

Furthermore, the third tri-state inverter 21-2 may include the fourth N-type transistor N14, and the third and fourth P-type transistors P13 and P14 from among the transistors included in the third tri-state inverter 21 of FIG. 6. That is, the third N-type transistor N13 from among the transistors included in the third tri-state inverter 21 of FIG. 6 may be omitted according to this embodiment. In FIG. 6, the third N-type transistor N13 may have a gate terminal connected to the second node DI. In FIG. 7, a gate terminal of the fourth P-type transistor P14 may be connected to the second node DI.

Referring back to FIG. 2B, when the logic level of the clock signal CK is the first logic level, and the logic level of the data signal D is the first logic level, the logic level of the second node DI may be the second logic level, and the logic level of the first node DN may be the first logic level. That is, the second tri-state inverter 13 may operate as an inverter.

Also, when the logic level of the clock signal CK is the first logic level, and the logic level of the data signal D is the first logic level, the logic level of the second control signal bCK may be the first logic level.

Referring to FIG. 7, the fourth N-type transistor N14 may be turned on according to the second control signal bCK having the first logic level, and thus, a logic level of the third node QN may be maintained as the second logic level. That is, even when the third N-type transistor N13 is omitted, the third tri-state inverter 21-2 of FIG. 7 may operate as an inverter.

The flip-flop circuit 1-4 according to an example embodiment may realize the second and third tri-state inverters 13-2 and 21-2 by using fewer transistors, and therefore, may realize high integration.

In some embodiments, the second or third tri-state inverter 13-2 or 21-2 included in the flip-flop circuit 1-4 of FIG. 7 may be substituted by one or more components of the flip-flop circuit 1 of FIG. 5.

Figure 8:
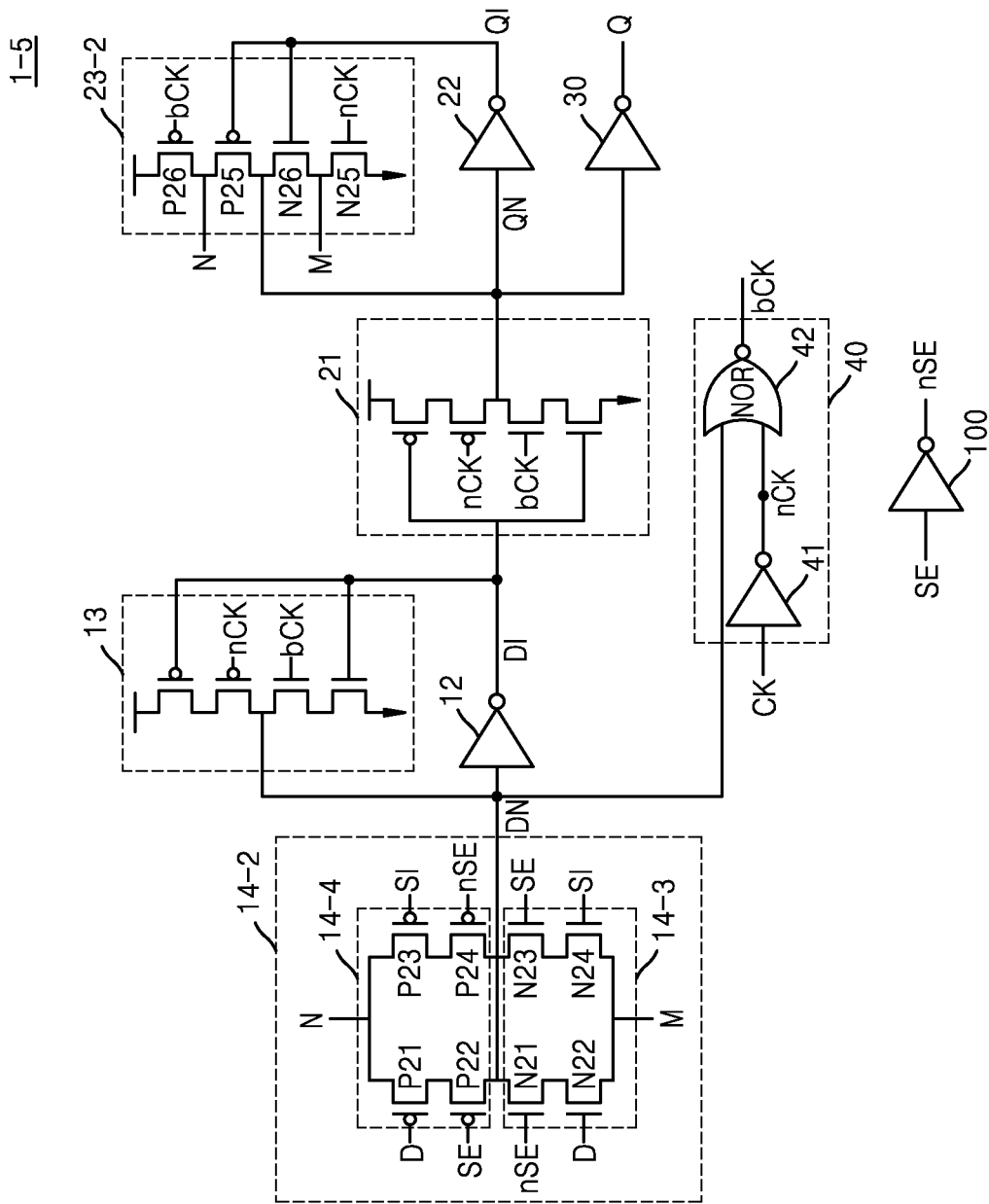
FIG. 8 is a circuit diagram for describing a flip-flop circuit according to an example embodiment.

FIG. 8 is a circuit diagram for describing a flip-flop circuit 1-5 according to an example embodiment.

Referring to FIG. 8, unlike the flip-flop circuit 1-3 of FIG. 6, the flip-flop circuit 1-5 may include a selection circuit 14-2 and a fourth tri-state inverter 23-2.

The selection circuit 14-2 may include first through fourth N-type transistors N21 through N24 and first through fourth P-type transistors P21 through P24.

An inverted scan enable signal nSE may be input to a gate terminal of the first N-type transistor N21, a data signal D may be input to a gate terminal of the second N-type transistor N22, a scan enable signal SE may be input to a gate terminal of the third N-type transistor N23, and a scan input signal SI may be input to a gate terminal of the fourth N-type transistor N24.

The first through fourth N-type transistors N21 through N24 may form a pull-down portion 14-3, and an end of the pull-down portion 14-3 may be connected to the first node DN, and the other end of the pull-down portion 14-3 may be connected to a first internal node M.

A data signal D may be input to a gate terminal of the first P-type transistor P21, a scan enable signal SE may be input to a gate terminal of the second P-type transistor P22, a scan input signal SI may be input to a gate terminal of the third P-type transistor P23, and an inverted scan enable signal nSE may be input to a gate terminal of the fourth P-type transistor P24.

The first through fourth P-type transistors P21 through P24 may form a pull-up portion 14-4, and an end of the pull-up portion 14-4 may be connected to the first node DN, and the other end of the pull-up portion 14-4 may be connected to a second internal node N.

The fourth tri-state inverter 23-2 may include fifth and sixth N-type transistors N25 and N26 and fifth and sixth P-type transistors P25 and P26.

A gate terminal of the fifth N-type transistor N25 may receive a first control signal nCK, a source terminal of the fifth N-type transistor N25 may be connected to a negative power node, and a drain terminal of the fifth N-type transistor N25 may be connected to the first internal node M. A gate terminal of the sixth N-type transistor N26 may be connected to the fourth node QI, a source terminal of the sixth N-type transistor N26 may be connected to the first internal node M, and a drain terminal of the sixth N-type transistor N26 may be connected to the third node QN. A gate terminal of the fifth P-type transistor P25 may be connected to the fourth node QI, a source terminal of the fifth P-type transistor P25 may be connected to the second internal node N, and a drain terminal of the fifth P-type transistor P25 may be connected to the third node QN. A gate terminal of the sixth P-type transistor P26 may receive a second control signal bCK, a source terminal of the sixth P-type transistor P26 may be connected to the positive power node, and a drain terminal of the sixth P-type transistor P26 may be connected to the second internal node N.

When a logic level of the second control signal bCK is a second logic level, the pull-up portion 14-4 may be connected to the positive power node, may invert one of the data signal D and the scan input signal SI, and transmit the inverted signal to the first node DN.

When a logic level of the first control signal nCK is a first logic level, the pull-down portion 14-3 may be connected to the negative power node, may invert one of the data signal D and the scan input signal SI, and transmit the inverted signal to the first node DN.

That is, the selection circuit 14-2 and the fourth tri-state inverter 23-2 may share the same positive power node and negative power node, and thus, the structure of a power delivery network for providing power to the flip-flop circuit 1-5 may be simplified.

In some embodiments, the selection circuit 14-2 and the fourth tri-state inverter 23-2 included in the flip-flop circuit 1-5 of FIG. 8 may be substituted by one or more components of the flip-flop circuit 1-3 of FIG. 6 and/or the flip-flop circuit 1-4 of FIG. 7.

Figure 9:
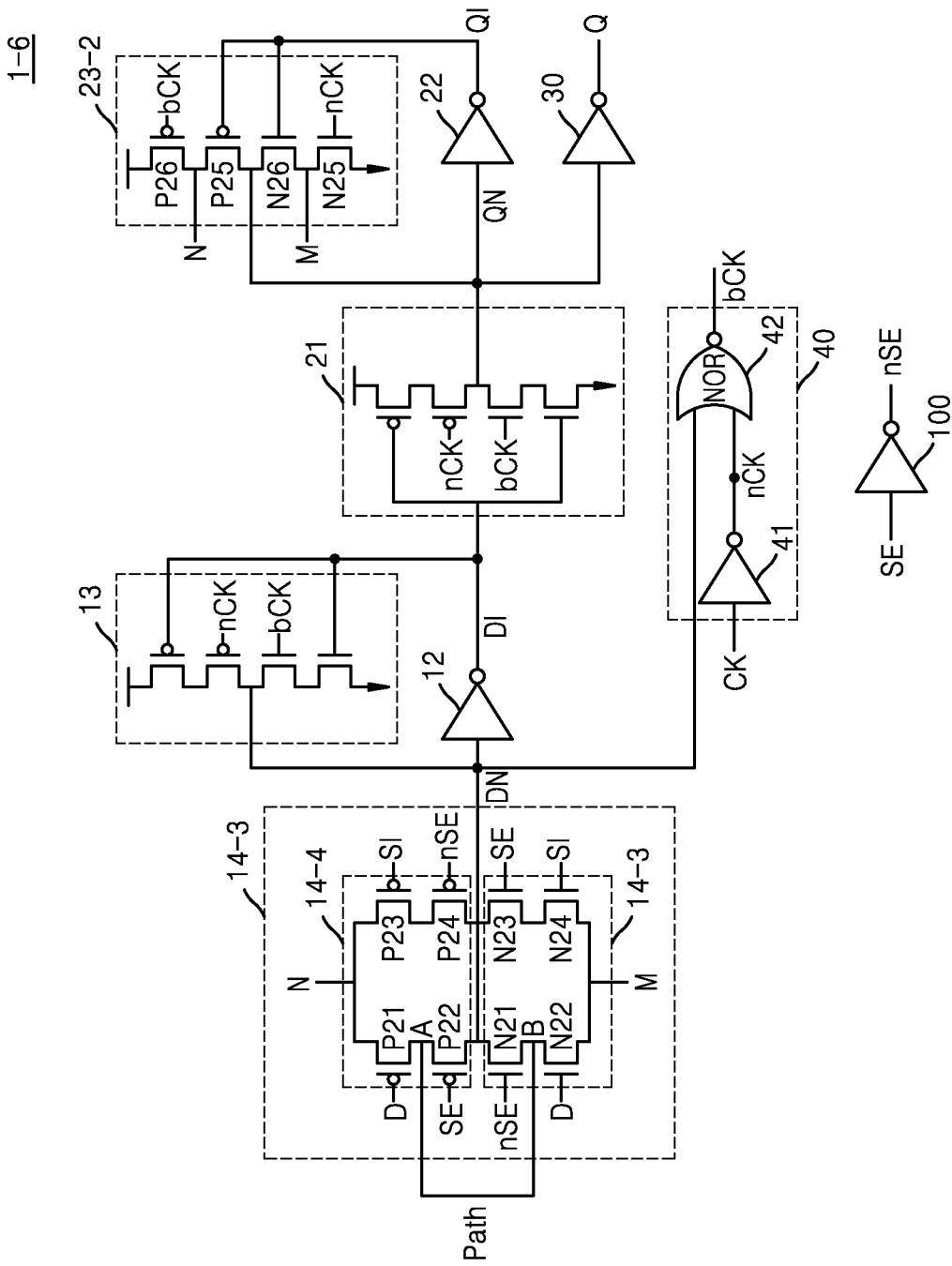
FIG. 9 is a circuit diagram for describing a flip-flop circuit according to an example embodiment.

FIG. 9 is a circuit diagram for describing a flip-flop circuit 1-6 according to an example embodiment.

Referring to FIG. 9, the flip-flop circuit 1-6 may further include a conductive line path Path.

The conductive line path Path may connect a third internal node A with a fourth internal node B. The third internal node A may be formed between the first P-type transistor P21 and the second P-type transistor P22 serially connected with each other. The fourth internal node B may be formed between the first N-type transistor N21 and the second N-type transistor N22 serially connected with each other.

In a normal operation mode, a scan enable signal SE may have a second logic level, and an inverted scan enable signal nSE may have a first logic level. Thus, both of the first N-type transistor N21 and the second P-type transistor P22 may be turned on. Due to on-resistance of the first N-type transistor N21 and the second P-type transistor P22, a speed at which the data signal D is transmitted to the first node DN in the normal operation mode may be reduced.

According to an example embodiment of the inventive concept, the conductive line path Path may have a resistance lower than the on-resistance of the first N-type transistor N21 and the second P-type transistor P22. Thus, effects of the on-resistance of the first N-type transistor N21 and the second P-type transistor P22 on the data transmission path may be reduced via the conductive line path Path, and thus, the performance of the flip-flop circuit 1-6 may be improved. That is, the speed at which the data signal D is transmitted to the first node DN in the normal operation mode may be improved.

In some embodiments, a selection circuit 14-3 included in the flip-flop circuit 1-6 of FIG. 9 may be substituted by one or more components of the flip-flop circuit 1-3 of FIG. 6 or the flip-flop circuit 1-4 of FIG. 7.

Figure 10:
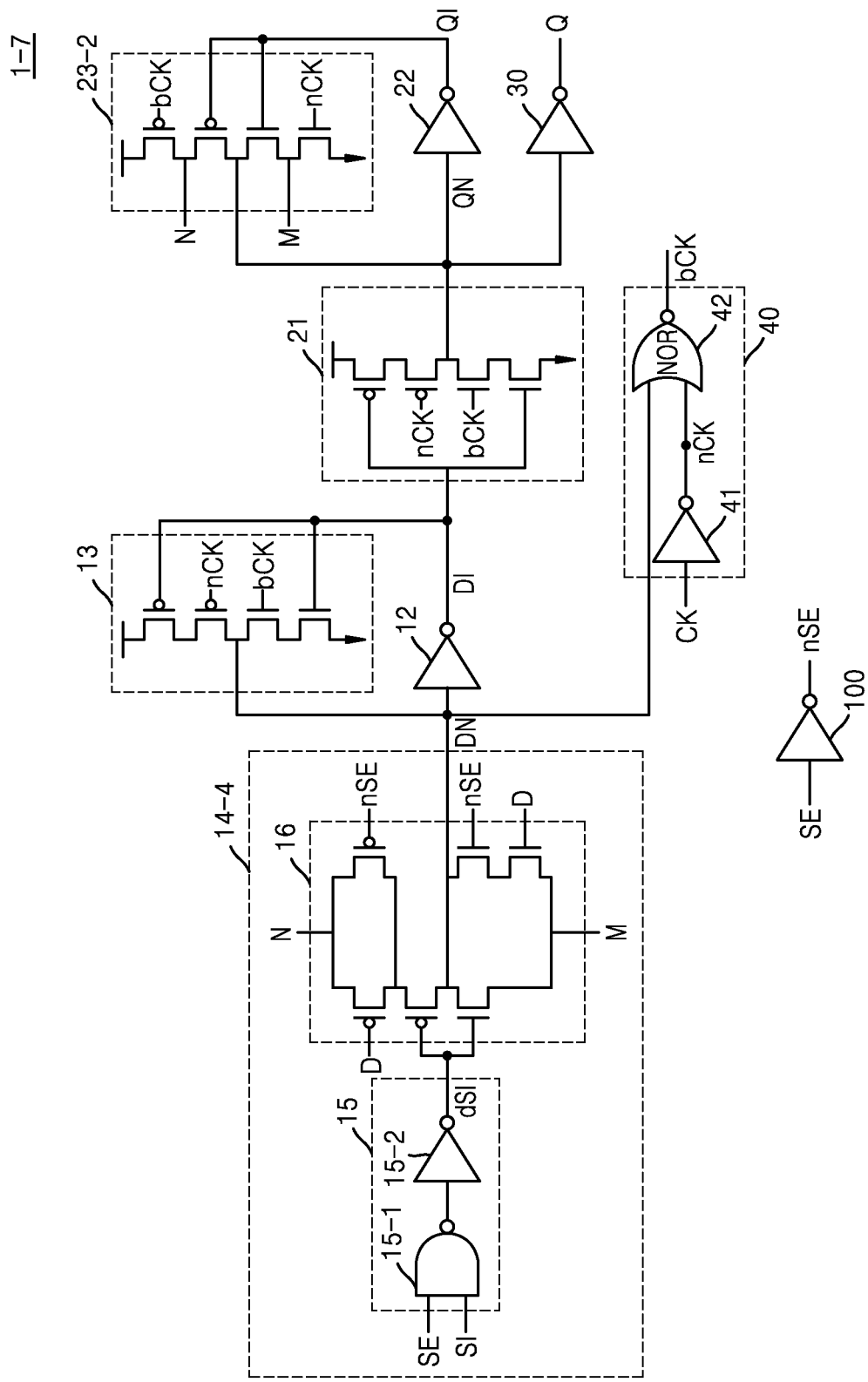
FIG. 10 is a circuit diagram for describing a flip-flop circuit according to an example embodiment.

FIG. 10 is a circuit diagram for describing a flip-flop circuit 1-7 according to an example embodiment.

Referring to FIG. 10, the flip-flop circuit 1-7 may include a selection circuit 14-4, unlike the flip-flop circuit 1-6 of FIG. 9.

The selection circuit 14-4 may include a delay circuit 15 and an inversion circuit 16.

The delay circuit 15 may receive a scan enable signal SE and a scan input signal SI. The delay circuit 15 may include a NAND circuit 15-1 and a fourth inverter 15-2.

When the scan enable signal SE has a logic low level, that is, the flip-flop circuit 1-7 is in a normal operation mode, the delay circuit 15 may output a signal having the logic low level. When the scan enable signal SE has a logic high level, that is, the flip-flop circuit is in a scan test mode, the delay circuit 15 may receive a scan input signal SI and output a delayed scan input signal dSI.

The delayed scan input signal dSI may be input to the inversion circuit 16. The inversion circuit 16 may transmit one of the delayed scan input signal dSI and a data signal D to the first node DN according to an inverted scan enable signal nSE.

A timing at which the delayed scan input signal dSI is provided to the inversion circuit 16 may be delayed compared to a timing at which a positive power node or a negative power node is provided to the inversion circuit 16 through the second internal node N or the first internal node M.

Thus, via the delay circuit 15, a hold time period during which the scan input signal SI has to be maintained after a clock signal CK transitions may be secured, and thus, the performance of a scan test operation using the flip-flop circuit 1-7 may be improved.

In some embodiments, the selection circuit 14-4 included in the flip-flop circuit 1-7 of FIG. 10 may be selectively included in the flip-flop circuit 1-5 of FIG. 8 or the flip-flop circuit 1-6 of FIG. 9.

Figure 11:
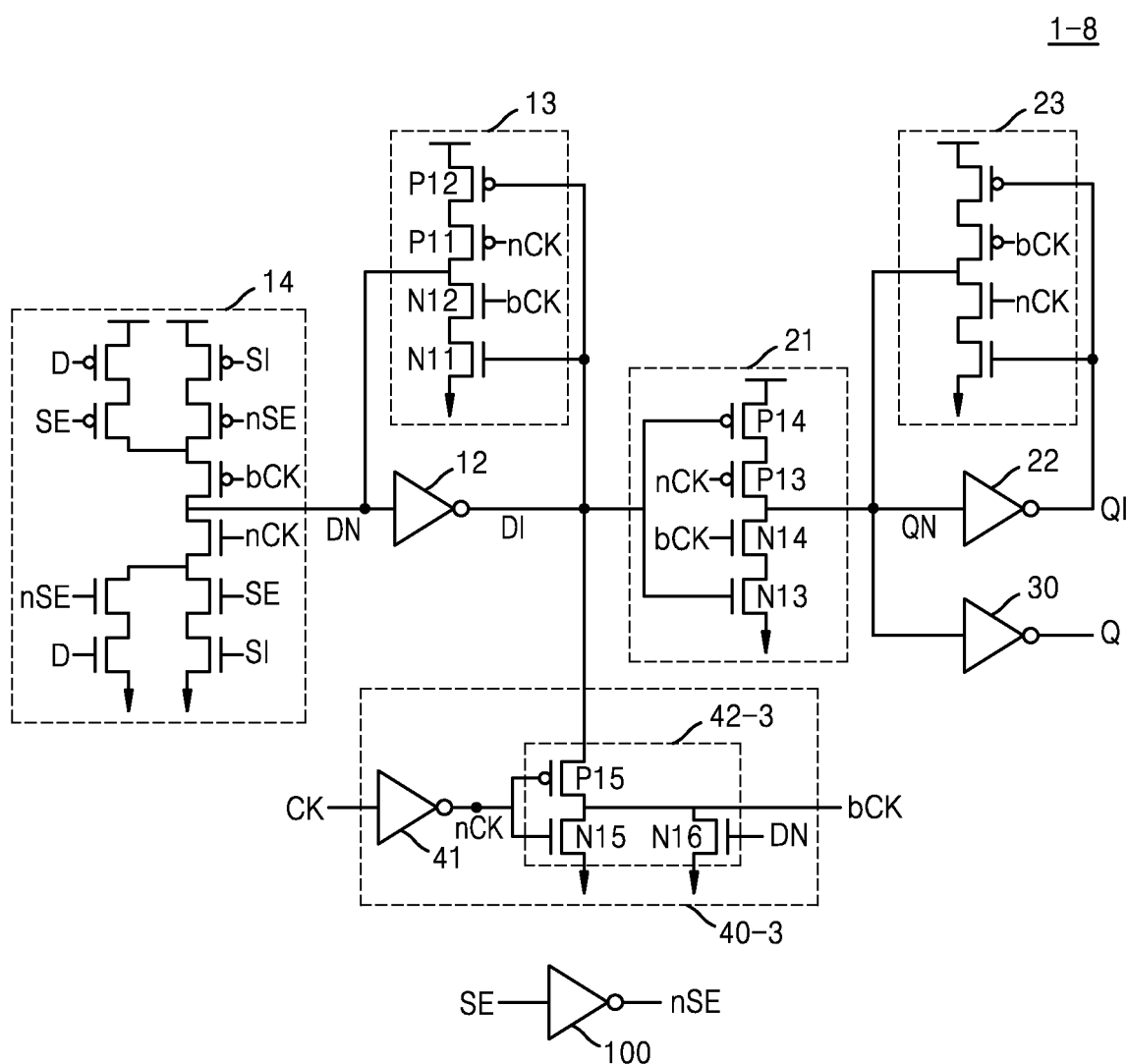
FIG. 11 is a circuit diagram for describing a flip-flop circuit according to an example embodiment.

FIG. 11 is a circuit diagram for describing a flip-flop circuit 1-8 according to an example embodiment.

Referring to FIG. 11, the flip-flop circuit 1-8 may include a NOR circuit 42-3.

The NOR circuit 42-3 may be an embodiment of the NOR circuit 42 included in the flip-flop circuit 1-4 of FIG. 7.

The NOR circuit 42-3 may include fifth and sixth N-type transistors N15 and N16, and a fifth P-type transistor P15.

A first control signal nCK may be input to a gate terminal of the fifth N-type transistor N15, a negative power node may be connected to a source terminal of the fifth N-type transistor N15, and a node generating a second control signal bCK may be connected to a drain terminal of the fifth N-type transistor N15. A gate terminal of the sixth N-type transistor N16 may be connected to the first node DN, a source terminal of the sixth N-type transistor N16 may be connected to the negative power node, and a drain terminal of the sixth N-type transistor N16 may be connected to the node generating the second control signal bCK. The first control signal nCK may be input to a gate terminal of the fifth P-type transistor P15, the second node DI may be connected to a source terminal of the fifth P-type transistor P15, and the node generating the second control signal bCK may be connected to a drain terminal of the fifth P-type transistor P15.

A general bistable input NOR circuit may be realized as four transistors. However, the NOR circuit 42-3 according to an example embodiment may be realized as three transistors. The NOR circuit 42 included in the flip-flop circuit 1 of FIG. 1 may generate the second control signal bCK having the first logic level, when a signal of the first node DN has the second logic level, and the first control signal nCK has the second logic level.

Referring to FIGS. 2B, 2D, and 11, when the first control signal nCK has the second logic level, and the signal of the first node DN has the second logic level, the second control signal bCK may have the first logic level. That is, the NOR circuit 42-3 of FIG. 11 may operate in the same way as the NOR circuit 42 of FIG. 1.

The flip-flop circuit 1-8 according to an example embodiment may realize the NOR circuit 42-3 by using fewer transistors, and thus, may realize high integration.

In some embodiments, the NOR circuit 42-3 included in the flip-flop circuit 1-8 of FIG. 11 may be substituted by one or more components of the flip-flop circuits 1, and 1-3 through 1-7 of FIGS. 1, 2A through 2D, and 5 through 10.

Figure 12:
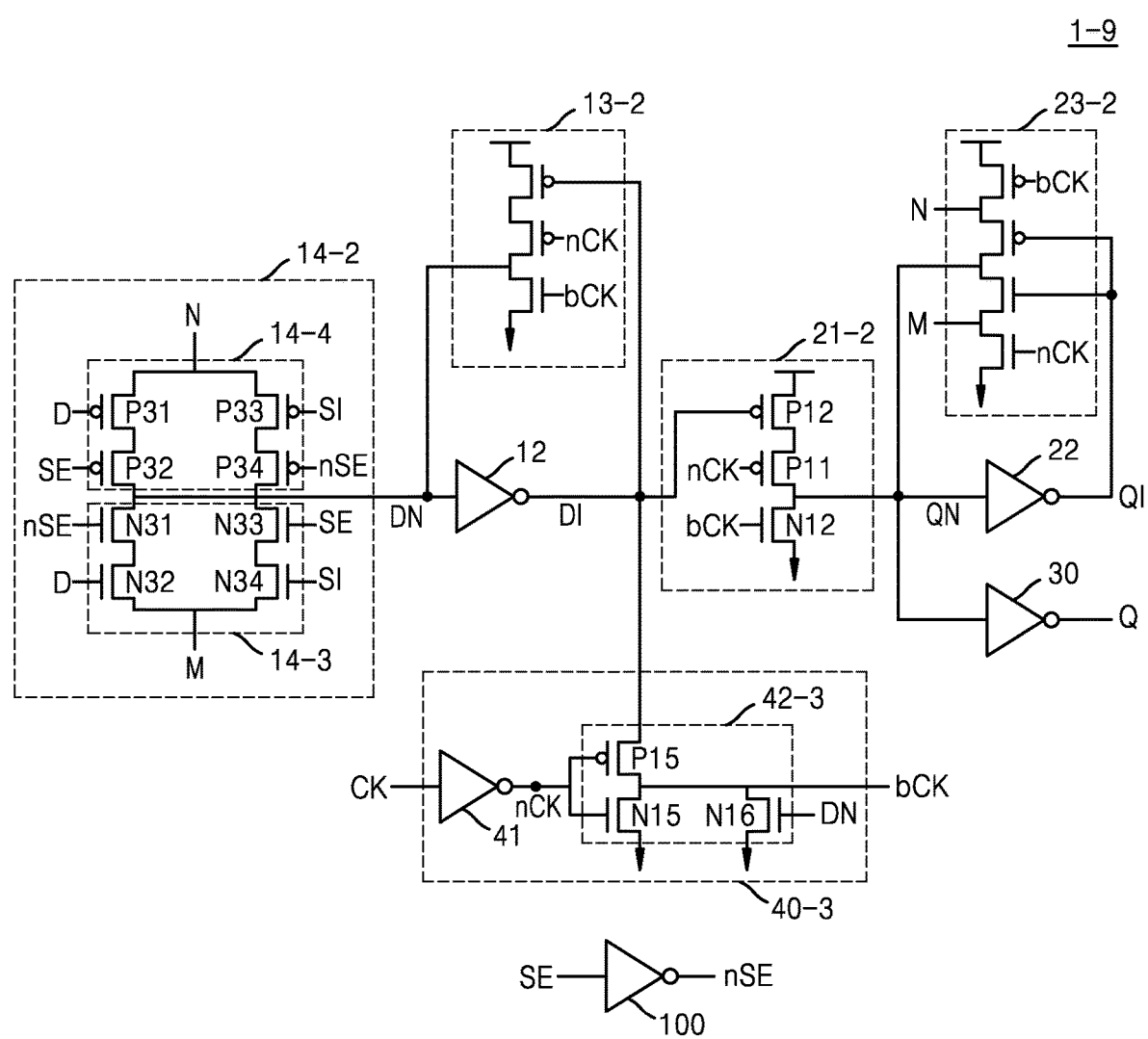
FIG. 12 is a circuit diagram for describing a flip-flop circuit according to an example embodiment.

FIG. 12 is a circuit diagram for describing a flip-flop circuit 1-9 according to an example embodiment.

Referring to FIG. 12, the flip-flop circuit 1-9 may include the second and third tri-state inverters 13-2 and 21-2 included in the flip-flop circuit 1-4 of FIG. 7, the selection circuit 14-2 and the fourth tri-state inverter 23-2 included in the flip-flop circuit 1-5 of FIG. 8, and the NOR circuit 42-3 included in the flip-flop circuit 1-8 of FIG. 11.

The flip-flop circuit 1-9 according to an example embodiment may realize the second and third tri-state inverters 13-2 and 21-2 and the NOR circuit 42-3 by using fewer transistors, and thus, may realize high integration. Also, the flip-flop circuit 1-9 may include the selection circuit 14-2 and the fourth tri-state inverter 23-2 sharing the same positive power node and the same negative power node, and thus, the structure of a power delivery network for providing power to the flip-flop circuit 1-9 may be simplified.

Figure 13:
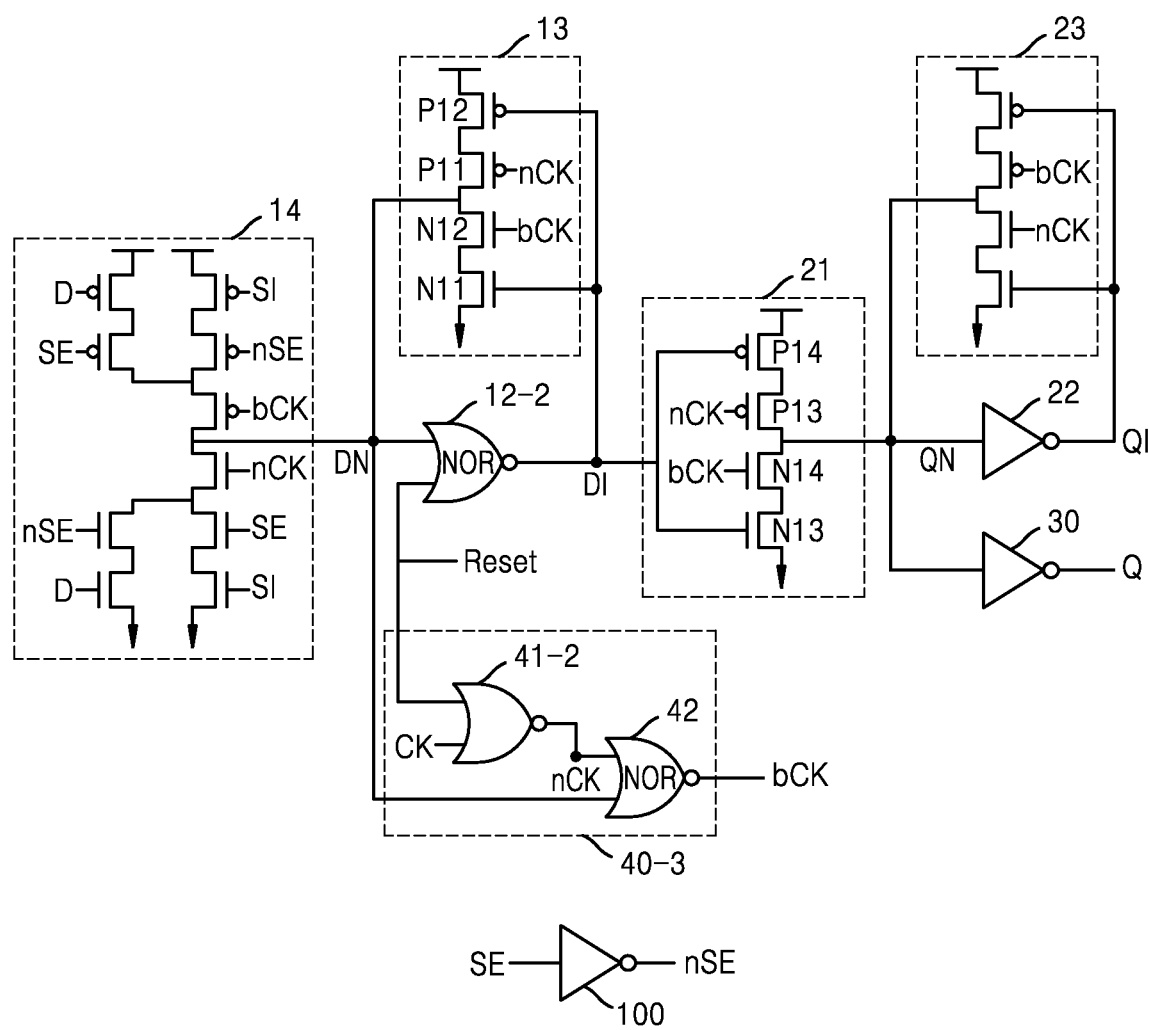
FIG. 13 is a circuit diagram for describing a flip-flop circuit according to an example embodiment.

FIG. 13 is a circuit diagram for describing a flip-flop circuit 1-10 according to an example embodiment.

Referring to FIG. 13, the flip-flop circuit 1-10 may include a NOR circuit 12-2 and a control signal generation circuit 40-3.

According to an embodiment, the NOR circuit 12-2 may replace the first inverter 12 of FIG. 6. For example, the NOR circuit 12-2 may receive a signal of the first node DN and a reset signal Reset and transmit a result of a NOR operation on the signal of the first node DN and the reset signal Reset to the second node DI. That is, when the reset signal Reset has a first logic level, a signal of the second node DI may have a second logic level regardless of a data signal D.

The control signal generation circuit 40-3 may include a NOR circuit 41-2. The NOR circuit 41-2 may be arranged at the location of the third inverter 41 of FIG. 6. For example, the NOR circuit 41-2 may receive a clock signal CK and a reset signal Reset and generate a result of a NOR operation on the clock signal CK and the reset signal Reset as a first control signal nCK. That is, when the reset signal Reset has the first logic level, a logic level of the first control signal nCK may be maintained as the second logic level.

When the reset signal Reset has the first logic level, both of the signal of the second node DI and the first control signal nCK have the second logic level, and thus, the third node QN may have the first logic level via the third tri-state inverter 21, and an output signal Q may be reset as the second logic level via the output inverter 30.

In some embodiments, the NOR circuits 12-2 and 41-2 included in the flip-flop circuit 1-10 of FIG. 13 may be substituted by one or more components of the flip-flop circuits 1 and 1-3 through 1-9 of FIGS. 1, 2A through 2D, and 5 through 12.

Figure 14:
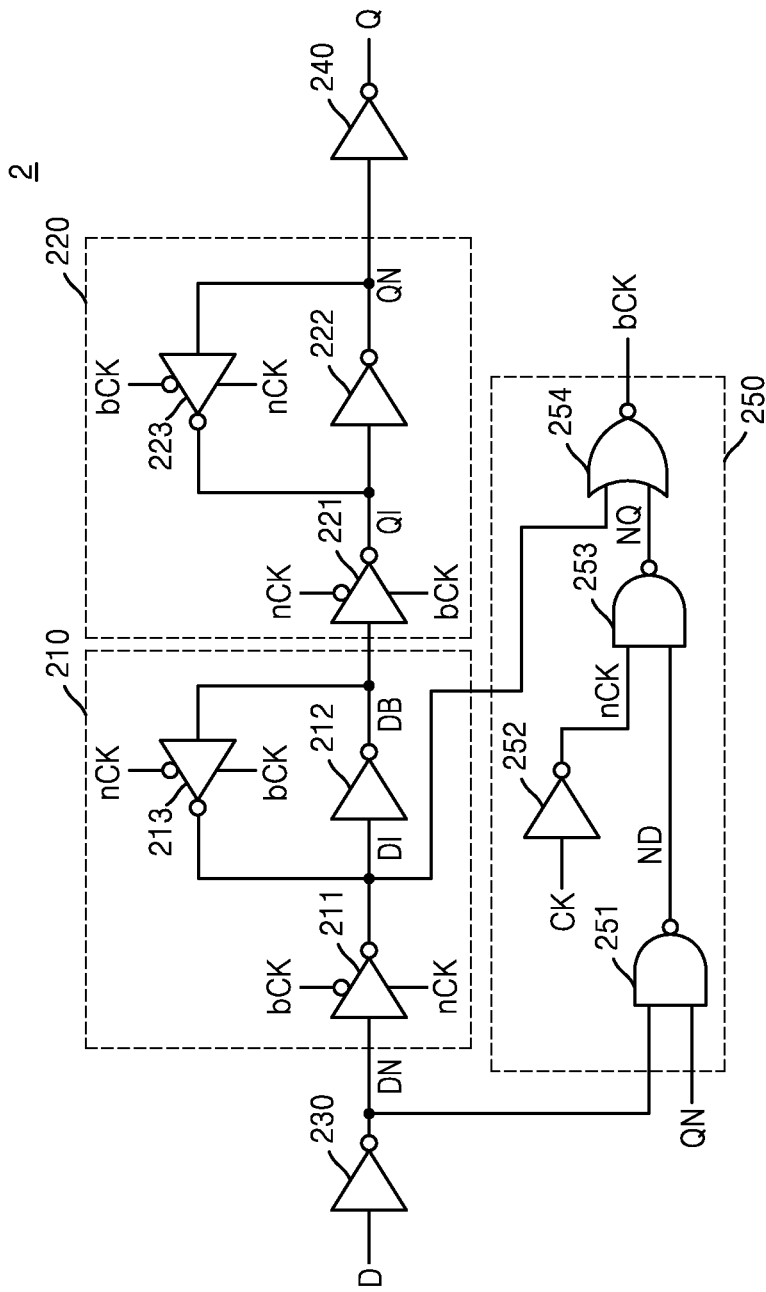
FIG. 14 is a circuit diagram for describing a flip-flop circuit according to an example embodiment.

FIG. 14 is a circuit diagram for describing a flip-flop circuit 2 according to an example embodiment.

Referring to FIG. 14, the flip-flop circuit 2 according to an example embodiment may include a master latch circuit 210, a slave latch circuit 220, and input inverter 230, an output inverter 240, and a control signal generation circuit 250.

The input inverter 230 may invert a data signal D and transmit the inverted signal to the first node DN.

The master latch circuit 210 may include a first tri-state inverter 211, a first inverter 212, and a second tri-state inverter 213.

The first tri-state inverter 211 may invert a signal of the first node DN based on a first control signal nCK and a second control signal bCK and transmit the inverted signal to the second node DI. The operation of the first tri-state inverter 211 may be the same as the operation of the first tri-state inverter 11 of FIG. 1. The first inverter 212 may invert a signal of the second node DI and transmit the inverted signal to the third node DB. The second tri-state inverter 213 may invert a signal of the third node DB based on the first control signal nCK and the second control signal bCK and transmit the inverted signal to the second node DI. The operation of the second tri-state inverter 213 may be the same as the operation of the second tri-state inverter 13 of FIG. 1.

The slave latch circuit 220 may include a third tri-state inverter 221, a second inverter 222, and a fourth tri-state inverter 223.

The third tri-state inverter 221 may invert the signal of the third node DB based on the first control signal nCK and the second control signal bCK and transmit the inverted signal to the fourth node QI. The operation of the third tri-state inverter 221 may be the same as the operation of the third tri-state inverter 21 of FIG. 1. The second inverter 222 may invert a signal of the fourth node QI and transmit the inverted signal to a fifth node QN. The fourth tri-state inverter 223 may invert a signal of the fifth node QN based on the first control signal nCK and the second control signal bCK and transmit the inverted signal to the fourth node QI.

The output inverter 240 may generate an output signal Q by inverting the signal of the fifth node QN.

The control signal generation circuit 250 may generate the first control signal nCK and the second control signal bCK, based on the signal of the first node DN, the signal of the fifth node QN, the signal of the second node DI, and a clock signal CK.

The control signal generation circuit 250 may include a NAND circuit 251, a third inverter 252, an AND circuit 253, and a NOR circuit 254.

The NAND circuit 251 may perform a NAND operation on the signal of the first node DN and the signal of the fifth node QN to generate a signal of a sixth node ND. The third inverter 252 may receive the clock signal CK and invert the clock signal CK to generate the first control signal nCK The AND circuit 253 may perform an AND operation on the first control signal nCK and the signal of the sixth node ND to generate a signal of a seventh node NQ. The NOR circuit 254 may perform a NOR operation on the signal of the second node DI and the signal of the seventh node NQ to generate the second control signal bCK.

The flip-flop circuit 2 according to an example embodiment may generate the second control signal bCK in synchronization with the first node DN, the second node DI, and the fifth node QN, and thus, compared to when the second control signal bCK is generated by simply inverting the first control signal nCK, the number of times of toggling of the second control signal bCK may be reduced. Thus, the flip-flop circuit 2 may consume less power.

Figure 15A:
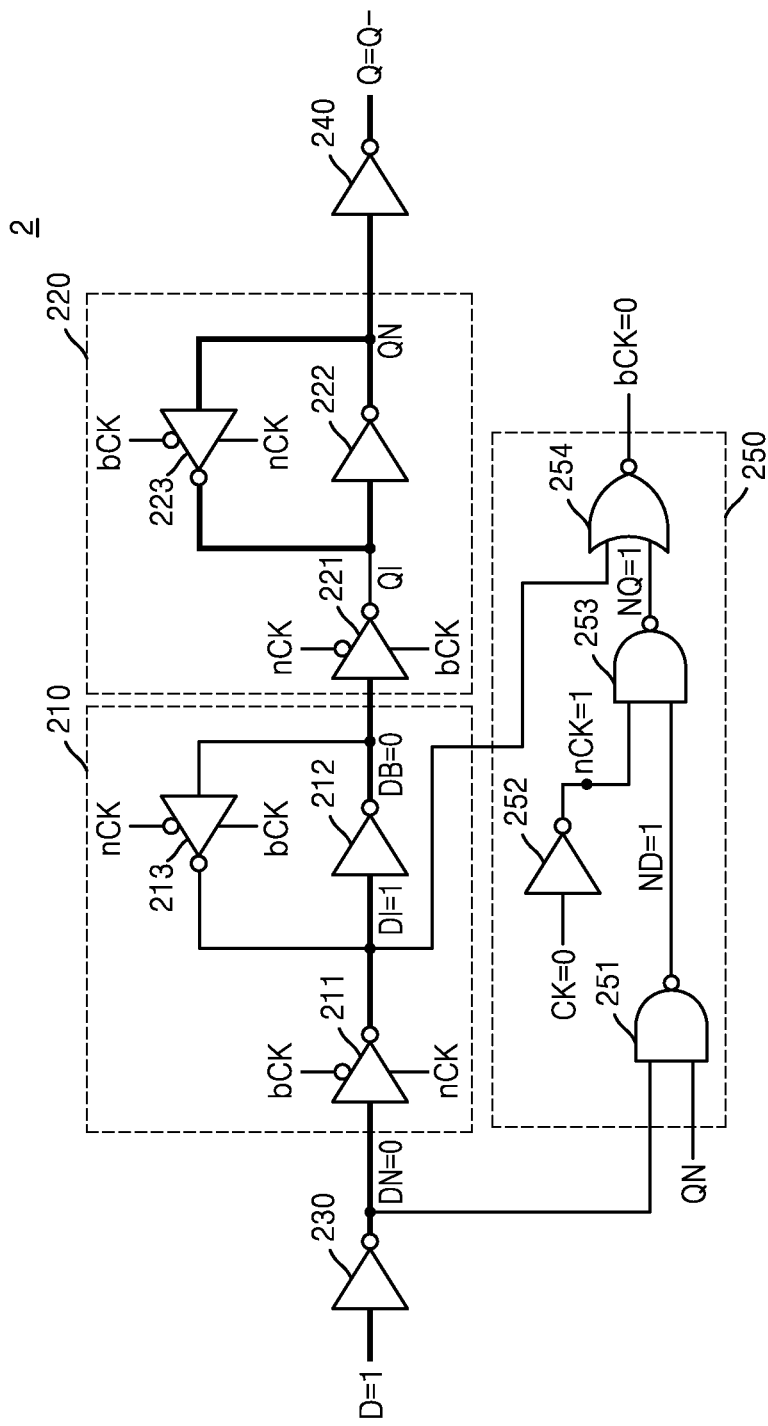
FIGS. 15A through 15D are circuit diagrams for describing an operation of a flip-flop circuit according to an example embodiment.

FIGS. 15A through 15D are circuit diagrams for describing operations of the flip-flop circuit 2 according to an example embodiment. FIG. 15A describes the operation of the flip-flop circuit 2 when a data signal D has a first logic level, and a clock signal CK has a second logic level, FIG. 15B describes the operation of the flip-flop circuit 2 when the data signal D has the first logic level, and the clock signal CK transitions to the first logic level, FIG. 15C describes the operation of the flip-flop circuit 2 when the data signal D has the second logic level, and the clock signal CK has the second logic level, and FIG. 15D describes the operation of the flip-flop circuit 2 when the data signal D has the second logic level, and the clock signal CK transitions to the first logic level. In FIGS. 15A through 15D, the first logic level may be indicated as "1," and the second logic level may be indicated as "0."

Referring to FIG. 15A, a logic level of the first node DN may be the second logic level via the input inverter 230. Thus, a logic level of the sixth node ND may be the first logic level via the NAND circuit 251. When the clock signal CK has the second logic level, a logic level of the first control signal nCK may be the first logic level via the third inverter 252. A logic level of the seventh node NQ may be the first logic level via the AND circuit 253. A logic level of the second control signal bCK may be the second logic level via the NOR circuit 254.

Because the logic level of the first control signal nCK is the first logic level, and the logic level of the second control signal bCK is the second logic level, the first tri-state inverter 211 and the fourth tri-state inverter 223 may be in an active state, and the second tri-state inverter 213 and the third tri-state inverter 221 may be in an inactive state.

A signal of the second node DI may have the first logic level via the first tri-state inverter 211. A signal of the third node DB may have the second logic level via the first inverter 212.

The second inverter 222 and the fourth tri-state inverter 223 may form a latch structure, and thus, the output signal Q may be maintained as the prior output signal Q−.

Figure 15B:
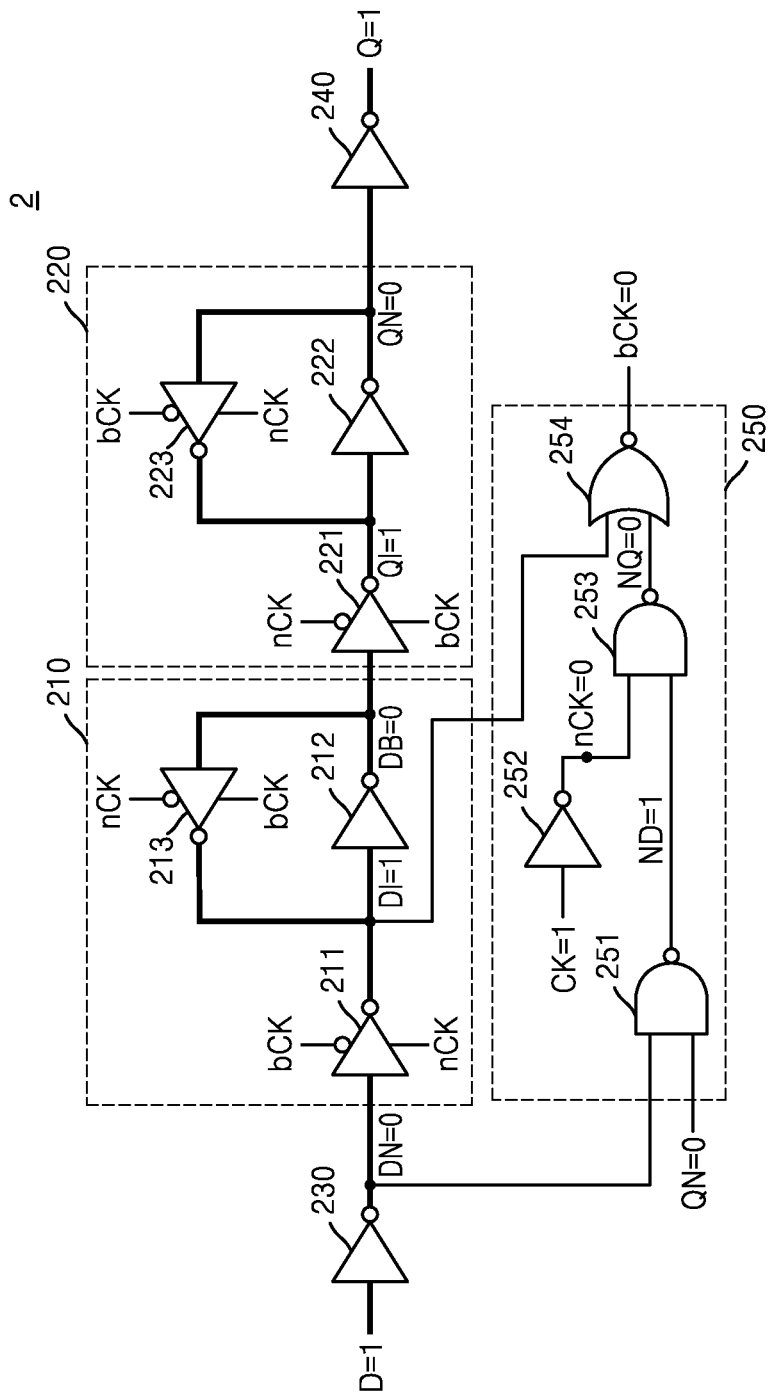

Referring to FIG. 15B, the first control signal nCK may have the second logic level via the third inverter 252. A logic level of the seventh node NQ may be the second logic level via the AND circuit 253. When the first control signal nCK has the second logic level, the second tri-state inverter 213 may operate as an inverter with respect to a signal of the third node DB having the second logic level, and thus, the logic levels of the second node DI and the third node DB may be maintained via a latch structure formed by the first inverter 212 and the second tri-state inverter 213. Thus, a logic level of the second control signal bCK may be the second logic level via the NOR circuit 254.

Because the first control signal nCK and the second control signal bCK may have the second logic level, the first through fourth tri-state inverters 211, 213, 221, and 223 may operate as inverters with respect to input signals having the second logic level. Thus, a signal of the fourth node QI may have the first logic level via the third tri-state inverter 221. A signal of the fifth node QN may have the second logic level via the second inverter 222. The second inverter 222 and the fourth tri-state inverter 223 may form a latch structure, and the logic levels of the fourth node QI and the fifth node QN may be maintained. The output signal Q may have the first logic level via the output inverter 240.

Referring to FIGS. 15A and 15B, in a case in which the data signal D has the first logic level, the output signal Q may have the first logic level by being synchronized to the clock signal CK at a timing at which the clock signal CK transitions from the first logic level to the second logic level.

Figure 15C:
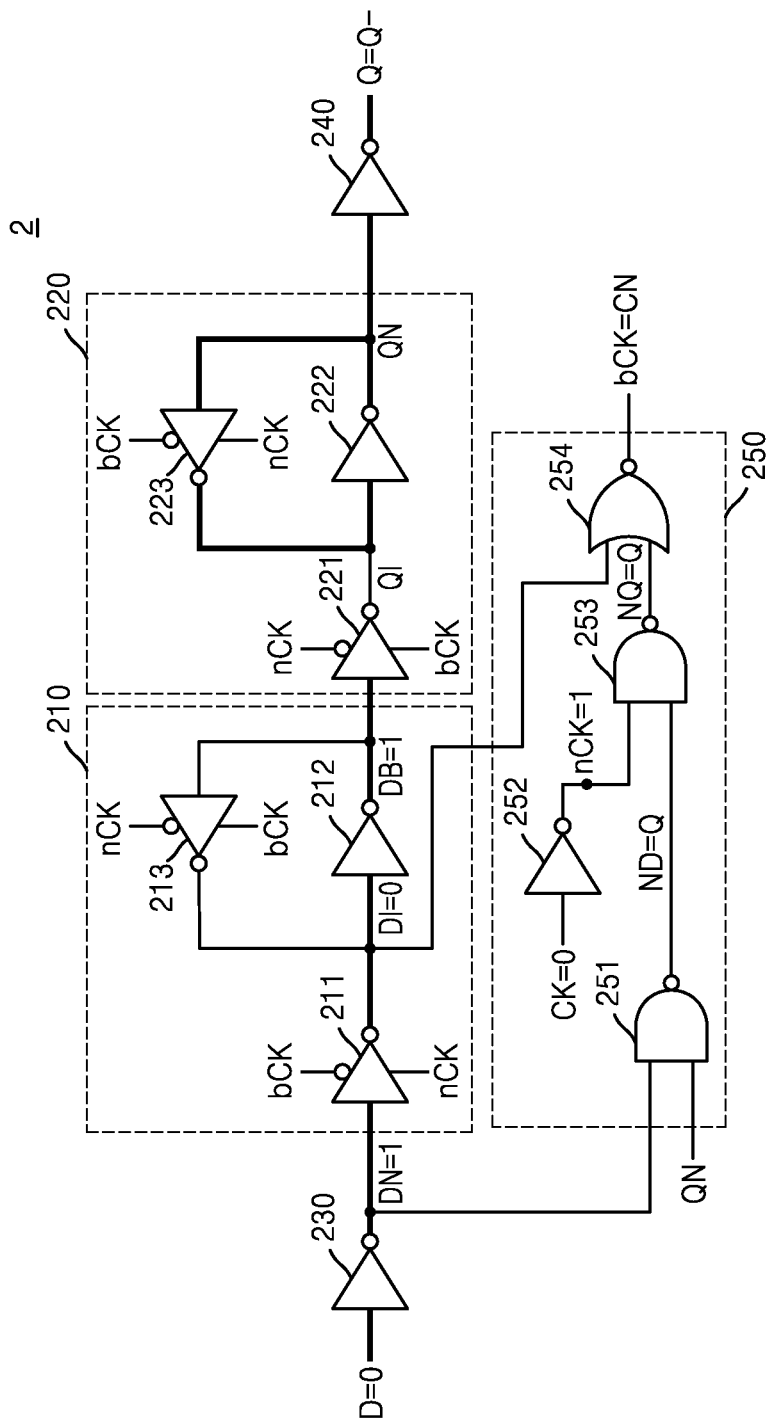

Referring to FIG. 15C, when the clock signal CK has the second logic level, the first control signal nCK may have the first logic level via the third inverter 252. Thus, the first tri-state inverter 211 may operate as an inverter with respect to a signal of the first node DN having the first logic level. A signal of the second node DI may have the second logic level via the first tri-state inverter 211, and a signal of the third node DB may have the logic level of the first node via the first tri-state inverter 211. Signals of the sixth node ND and the seventh node NQ may have the same logic level as the output signal Q via the NAND circuit 251 and the AND circuit 253. The second control signal bCK may have the same logic level as a signal of the fifth node QN via the NOR circuit 254.

When the signal of the fifth node QN, that is, the second control signal bCK, has the first logic level, the second tri-state inverter 213 and the first inverter 212 may perform a latch operation, and the logic levels of the second node DI and the third node DB may be maintained. Also, the third tri-state inverter 221 may operate as an inverter with respect to a signal of the third node DB having the first logic level. Thus, a logic level of the fourth node QI may be the second logic level via the third tri-state inverter 221. A logic level of the fifth node QN may be the first logic level via the second inverter 222. The output signal Q may be held as the second logic level via the output inverter 240.

When the signal of the fifth node QN, that is, the second control signal bCK, has the second logic level, the fourth tri-state inverter 223 may operate as an inverter with respect to the signal of the fifth node QN having the second logic level. Thus, the fourth tri-state inverter 223 and the second inverter 222 may perform a latch operation, and the logic levels of the fourth node QI and the fifth node QN may be maintained. The output signal Q may be held as the first logic level via the output inverter 240.

Figure 15D:
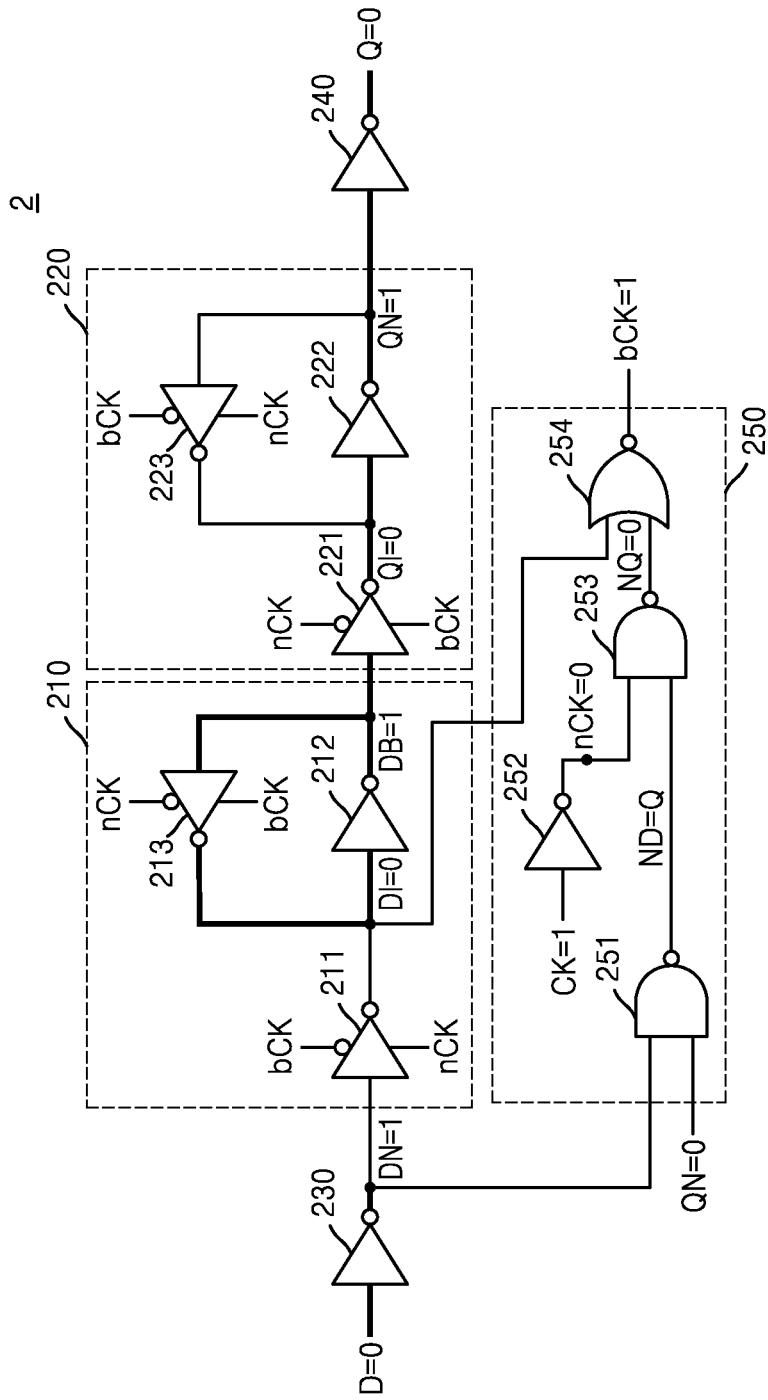

Referring to FIG. 15D, when the logic level of the clock signal CK transitions to the first logic level, the logic level of the first control signal nCK may transition to the second logic level. A signal of the seventh node NQ may have the second logic level via the AND circuit 253. Because the logic level of the signal of the second node DI is the second logic level, a logic level of the second control signal bCK may be the first logic level via the NOR circuit 254. Thus, the first tri-state inverter 211 and the fourth tri-state inverter 223 may be in an inactive state, and the second tri-state inverter 213 and the third tri-state inverter 221 may be in an active state.

A logic level of the fourth node QI may be the second logic level via the third tri-state inverter 221. A logic level of the fifth node QN may be the first logic level via the second inverter 222. A logic level of the output signal Q may be the second logic level via the output inverter 240.

Referring to FIGS. 15C and 15D, in a case in which the data signal D has the second logic level, the output signal Q may have the second logic level by being synchronized to the clock signal CK at a timing at which the clock signal CK transitions from the first logic level to the second logic level.

Referring to FIG. 15C, the second control signal bCK may be determined according to the logic level of the fifth node QN. That is, compared to when the second control signal bCK is generated as a delayed signal of the clock signal CK, the number of times of toggling of the second control signal bCK may be reduced, and thus, the flip-flop circuit 2 may perform a low-power-consumption operation.

Figure 16:
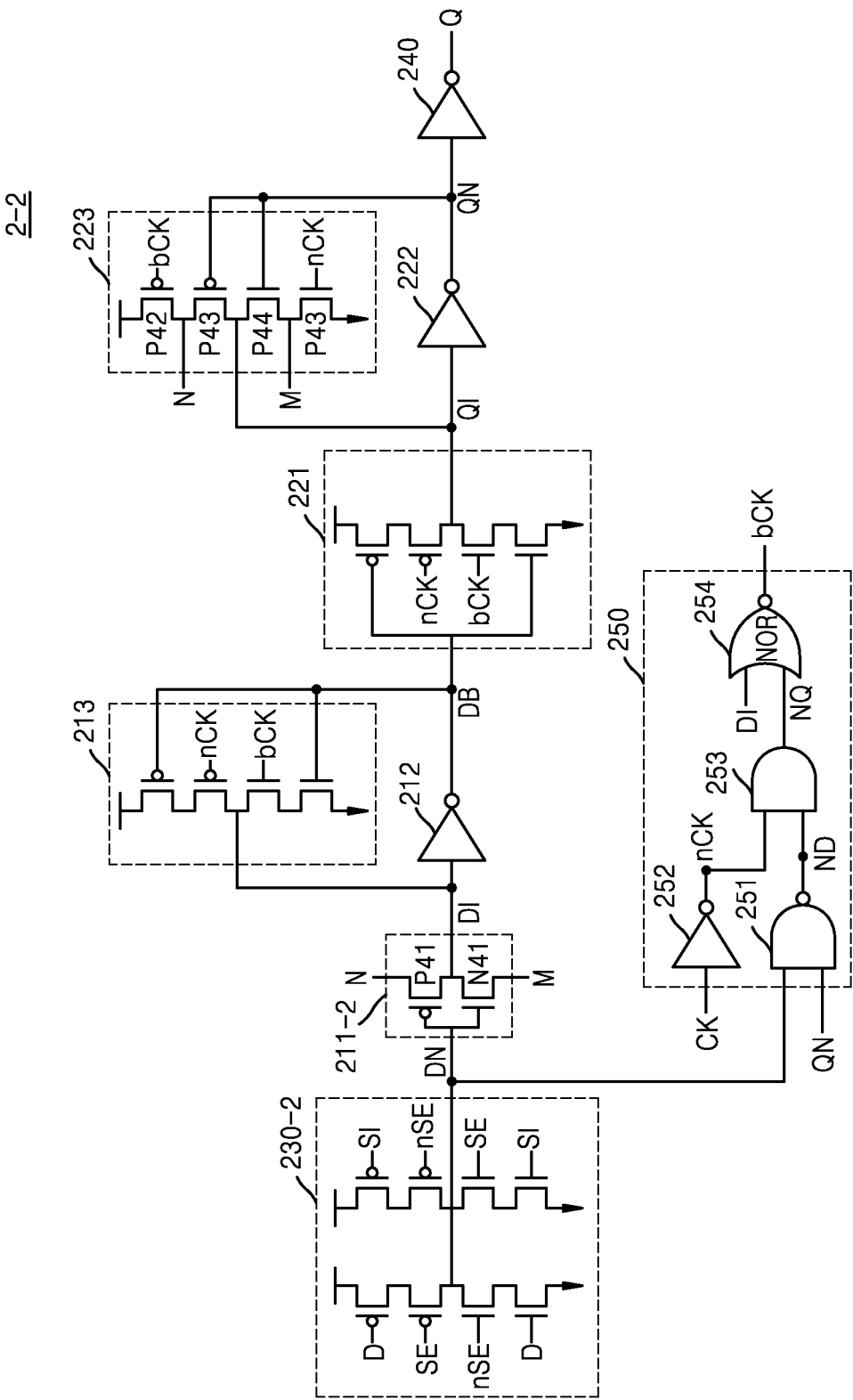
FIG. 16 is a circuit diagram for describing a flip-flop circuit according to an example embodiment.

FIG. 16 is a circuit diagram for describing a flip-flop circuit 2-2 according to an example embodiment.

Referring to FIG. 16, the flip-flop circuit 2-2 may include a selection circuit 230-2 and a first tri-state inverter 211-2.

The selection circuit 230-2 may select one of a data signal D and a scan input signal SI according to a scan enable signal SE and an inverted scan enable signal nSE, may invert the selected signal, and may provide the inverted signal to the first node DN.

The first tri-state inverter 211-2 may include a first N-type transistor N41 and a first P-type transistor P41. The first N-type transistor N41 may have a gate terminal connected to the first node DN, a source terminal connected to the first internal node M, and a drain terminal connected to the second node DI. The first P-type transistor P41 may have a gate terminal connected to the first node DN, a source terminal connected to the second internal node N, and a drain terminal connected to the second node DI.

A structure of the fourth tri-state inverter 223 may be the same as the structure of the fourth tri-state inverter 23-2 illustrated in FIG. 8.

The first tri-state inverter 211-2 may share a positive power node and a negative power node with the fourth tri-state inverter 223, and thus, the structure of a power delivery network for providing power to the flip-flop circuit 2-2 may be simplified.

In some embodiments, the selection circuit 230-2 and the first tri-state inverter 211-2 included in the flip-flop circuit 2-2 of FIG. 16 may be substituted by one or more components of the flip-flop circuit 2 of FIG. 15.

Figure 17:
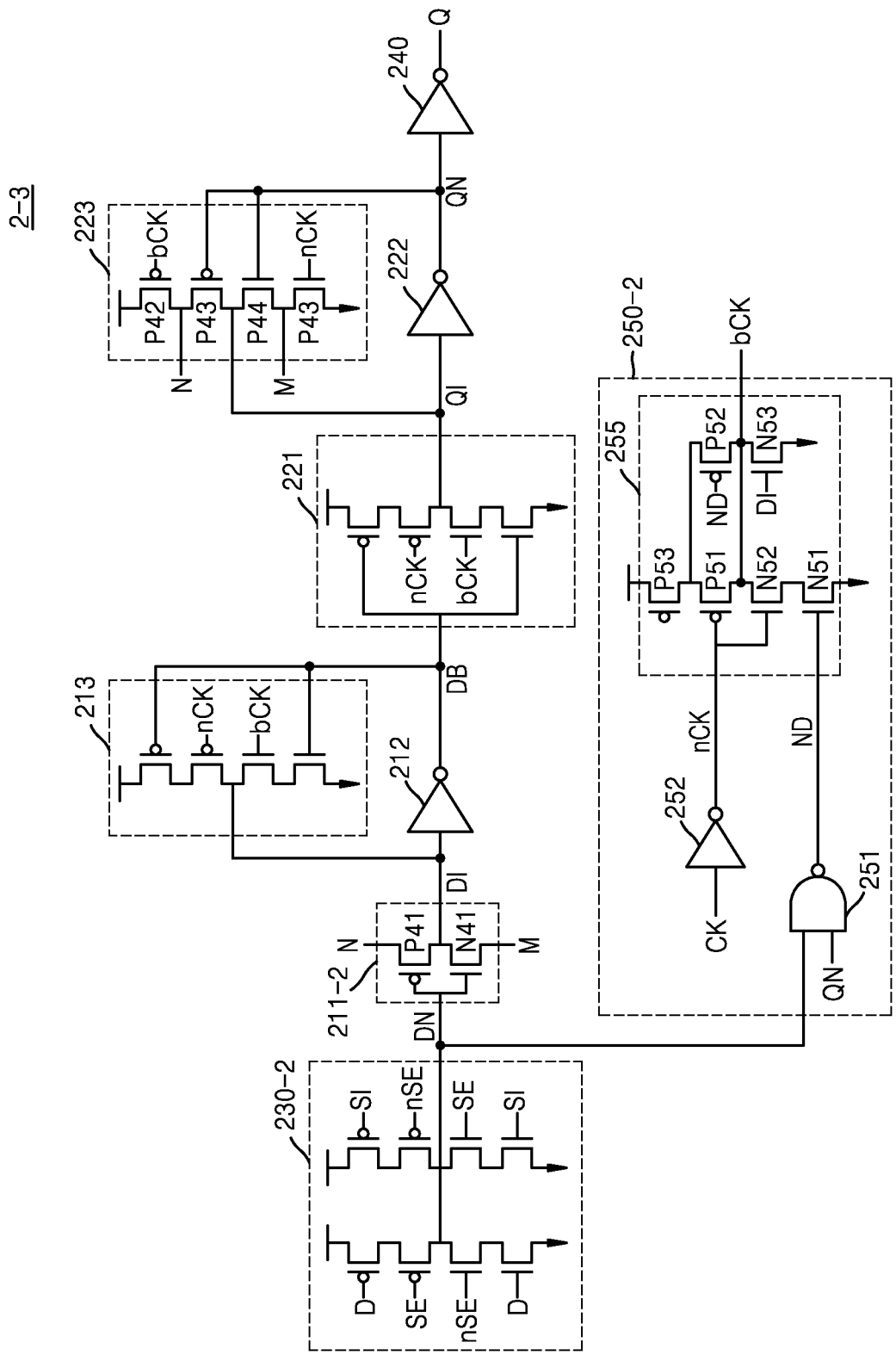
FIG. 17 is a circuit diagram for describing a flip-flop circuit according to an example embodiment.

FIG. 17 is a circuit diagram for describing a flip-flop circuit 2-3 according to an example embodiment.

Referring to FIG. 17, the flip-flop circuit 2-3 may include an and-or-inverter (AOI) 21 circuit 255. The AOI21 circuit 255 may perform the functions of the AND circuit 253 and the NOR circuit 254 of FIG. 14.

The AOI21 circuit 255 may include first through third N-type transistors N51 through N53 and first through third P-type transistors P51 through P53.

The first N-type transistor N51 may have a gate terminal connected to the sixth node ND, a source terminal connected to a negative power node, and a drain terminal connected to a source terminal of the second N-type transistor N52. The second N-type transistor N52 may have a gate terminal receiving a first control signal nCK, the source terminal connected to the first N-type transistor N51, and a drain terminal connected to a node generating the second control signal bCK. The third N-type transistor N53 may have a gate terminal connected to the second node DI, a source terminal connected to the negative power node, and a drain terminal connected to the node generating the second control signal bCK. The first P-type transistor P51 may have a gate terminal receiving a first control signal nCK, a source terminal connected to a drain terminal of the third P-type transistor P53, and a drain terminal connected to the node generating the second control signal bCK. The second P-type transistor P52 may have a gate terminal connected to the sixth node ND, a drain terminal connected to the node generating the second control signal bCK, and a source terminal connected to the drain terminal of the third P-type transistor P53. The third P-type transistor P53 may have a gate terminal connected to the second node DI, the drain terminal connected to the source terminals of the first P-type transistor P51 and the second P-type transistor P52, and a source terminal connected to a positive power node.

Referring to FIGS. 15C, 15D, and 17, when a logic level of the sixth node ND is the second logic level, a logic level of the second node DI may always be the second logic level. That is, when the second P-type transistor P52 is turned on, the third P-type transistor P53 may also be turned on, and thus, the second P-type transistor P52 and the third P-type transistor P53 may share the positive power node. A power node exclusively connected to the second P-type transistor P52 may be omitted, and thus, the structure of a power delivery network for providing power may be simplified.

Figure 18:
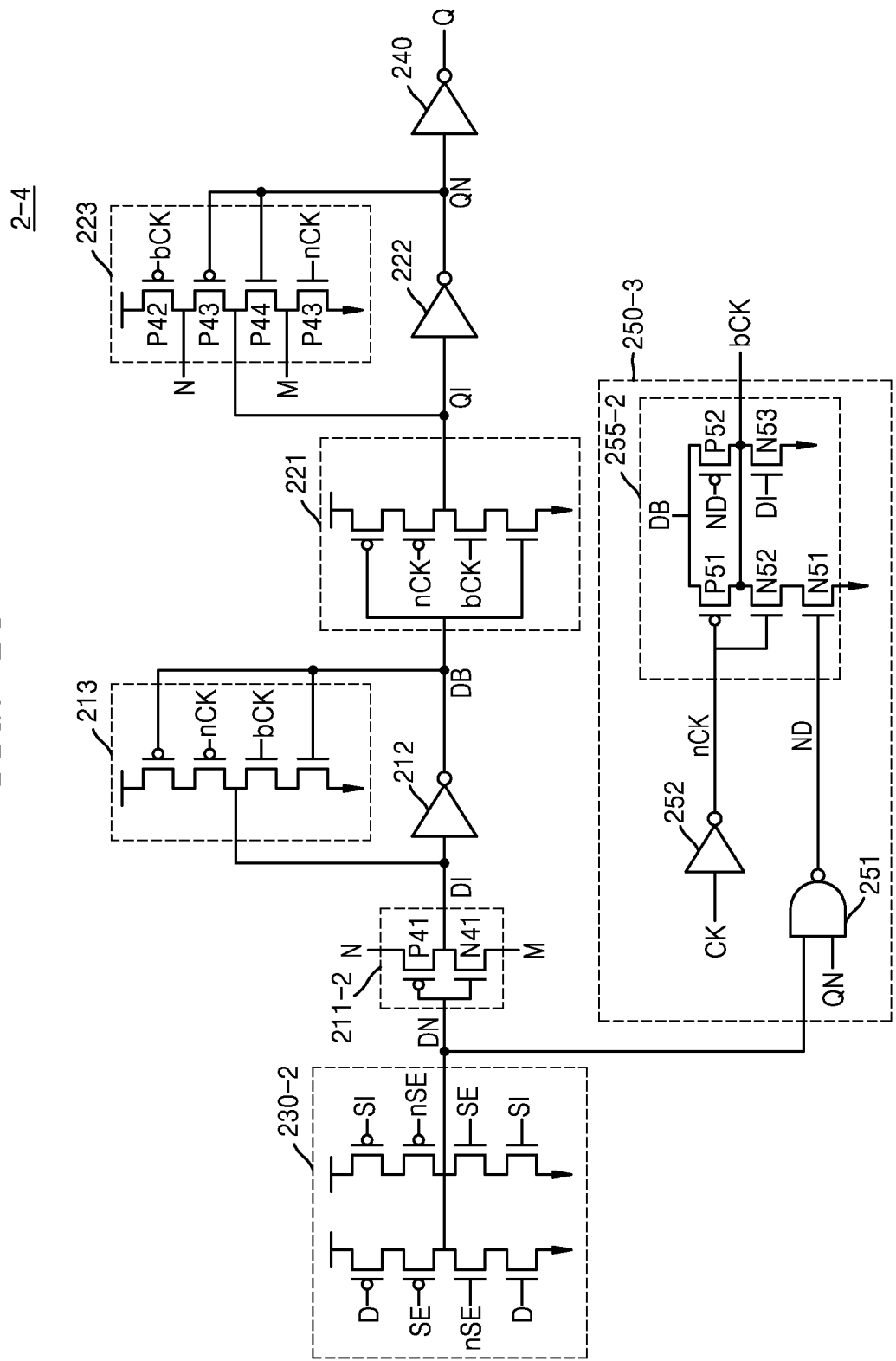
FIG. 18 is a circuit diagram for describing a flip-flop circuit according to an example embodiment.

FIG. 18 is a circuit diagram for describing a flip-flop circuit 2-4 according to an example embodiment.

Referring to FIG. 18, the flip-flop circuit 2-4 may include a control signal generation circuit 250-3.

The control signal generation circuit 250-3 may include an AOI21 circuit 255-2. The AOI21 circuit 255-2 may include the first through third N-type transistors N51 through N53 and the first and second P-type transistors P51 and P52. Compared with the AOI21 circuit 255 of FIG. 17, the third P-type transistor P53 may be omitted.

The first P-type transistor P51 may have a gate terminal receiving a first control signal nCK, a drain terminal connected to a node generating a second control signal bCK, and a source terminal connected to the third node DB. The second P-type transistor P52 may have a gate terminal connected to the sixth node ND, a drain terminal connected to the node generating the second control signal bCK, and a source terminal connected to the third node DB.

Referring to FIGS. 15C and 15D, when a logic level of the second node DI is the second logic level, a logic level of the third node DB may always be the first logic level. Thus, even when the third P-type transistor P53 of FIG. 17 is omitted, and the source terminals of the first and second P-type transistors P51 and P52 are connected to the third node DB, the AOI21 circuit 255-2 of FIG. 18 may perform the same function as the AOI21 circuit 255 of FIG. 17.

The AOI21 circuit 255-2 may be realized by using fewer transistors, and thus, the flip-flop circuit 2-4 may have improved integration.

Figure 19:
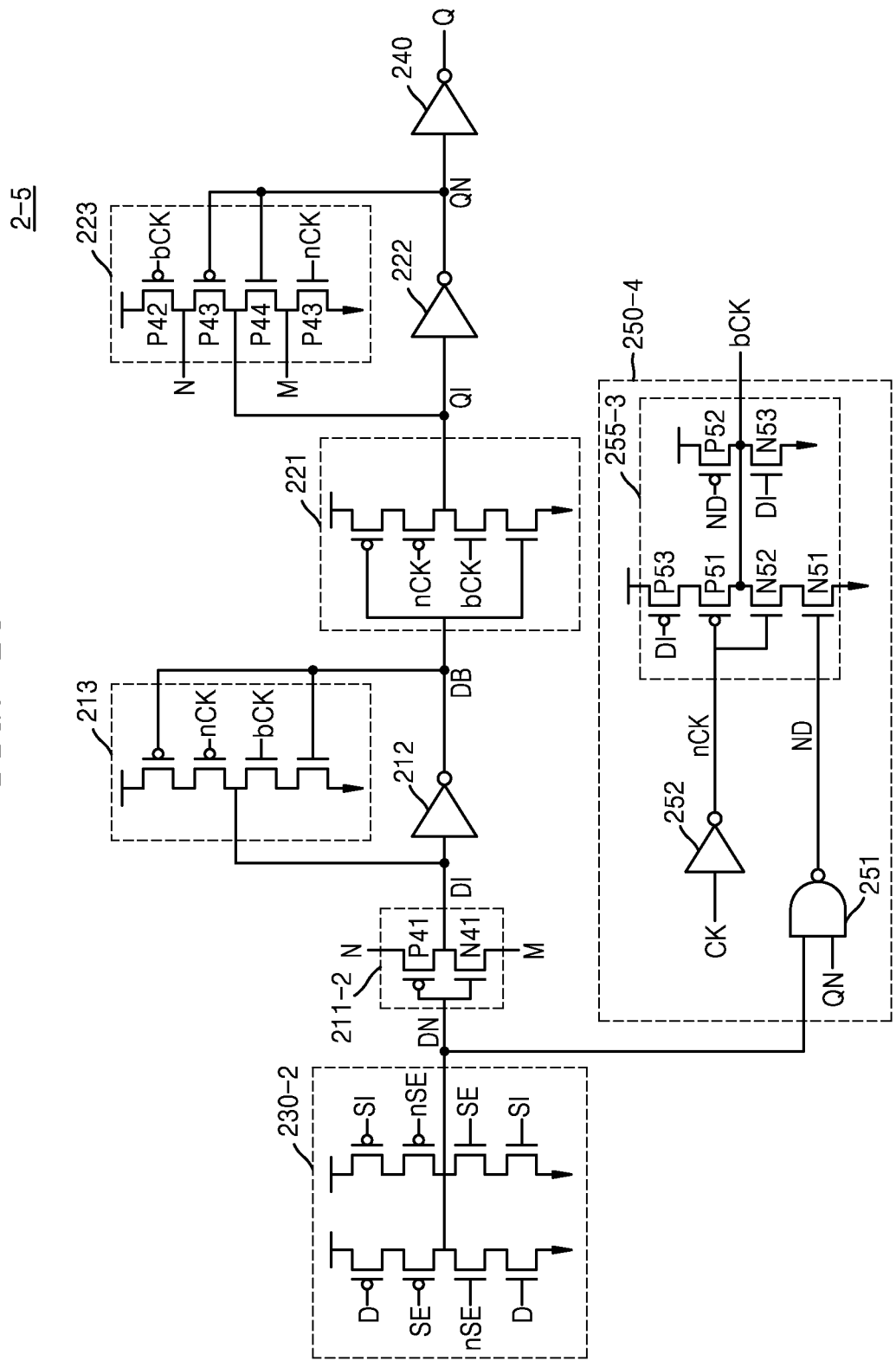
FIG. 19 is a circuit diagram for describing a flip-flop circuit according to an example embodiment.

FIG. 19 is a circuit diagram for describing a flip-flop circuit 2-5 according to an example embodiment.

Referring to FIG. 19, the flip-flop circuit 2-5 may include a control signal generation circuit 250-4.

The control signal generation circuit 250-4 may include an AOI21 circuit 255-3. Compared to the AOI circuit 255 of FIG. 17, the second P-type transistor P52 may be connected to a positive power node which is different from a positive power node connected to the third P-type transistor P53.

The positive power node may be connected to each of the second P-type transistor P52 and the third P-type transistor P53, and thus, the signal stability of a power delivery network may be improved.

Figure 20:
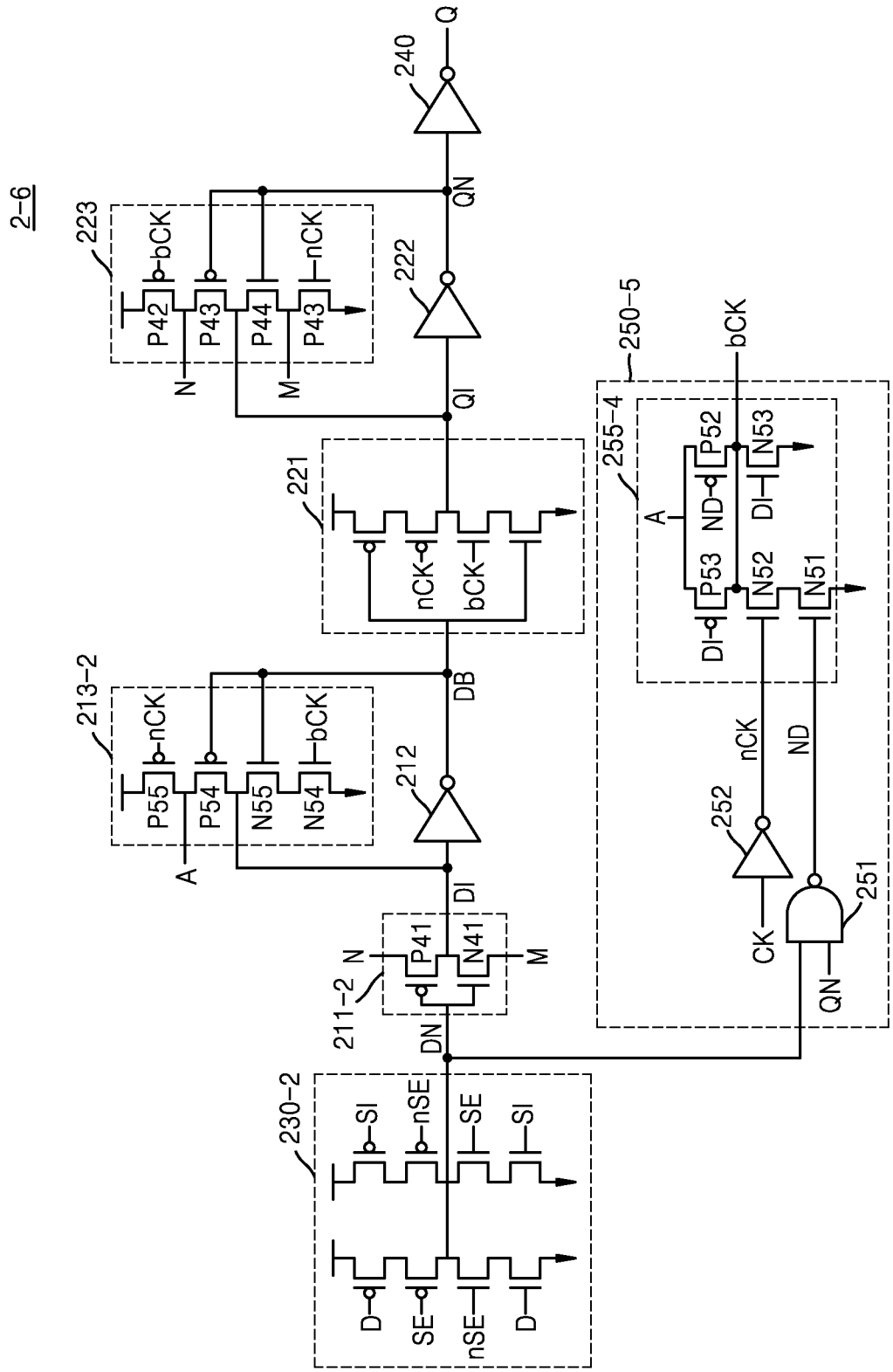
FIG. 20 is a circuit diagram for describing a flip-flop circuit according to an example embodiment.

FIG. 20 is a circuit diagram for describing a flip-flop circuit 2-6 according to an example embodiment.

Referring to FIG. 20, the flip-flop circuit 2-6 may include a second tri-state inverter 213-2 and a control signal generation circuit 250-5.

The second tri-state inverter 213-2 may include fourth and fifth N-type transistors N54 and N55 and fourth and fifth P-type transistors P54 and P55. The fourth N-type transistor N54 may have a gate terminal receiving a second control signal bCK, a source terminal connected to a negative power node, and a drain terminal connected to a source terminal of the fifth N-type transistor N55. The fifth N-type transistor N55 may have a gate terminal connected to the third node DB, the source terminal connected to the drain terminal of the fourth N-type transistor N54, and a drain terminal connected to the second node DI. The fourth P-type transistor P54 may have a gate terminal connected to the third node DB, a drain terminal connected to the second node DI, and a source terminal connected a fifth internal node A. The fifth P-type transistor P55 may have a gate terminal receiving a first control signal nCK, a drain terminal connected to the fifth internal node A, and a source terminal connected to a positive power node.

The control signal generation circuit 250-5 may include an AOI21 circuit 255-4.

The AOI21 circuit 255-4 may include the second and third P-type transistors P52 and P53. The second P-type transistor P52 may have a gate terminal connected to the sixth node ND, a drain terminal connected to a node generating the second control signal bCK, and a source terminal connected to the fifth internal node A. The third P-type transistor P53 may have a gate terminal connected to the second node DI, a drain terminal connected to the node generating the second control signal bCK, and a source terminal connected to the fifth internal node A.

Unlike the AOI21 circuit 255-3 of FIG. 19, in the AOI21 circuit 255-4, the second and third P-type transistors P52 and P53 may share the positive power node with the second tri-state inverter 213-2. That is, when a logic level of the first control signal nCK is a second logic level, a logic level of the fifth internal node A may be a first logic level, and thus, it may be understood that the positive power node may be connected to the second and third P-type transistors P52 and P53.

That is, because the second tri-state inverter 213-2 and the AOI21 circuit 255-4 may share the same positive power node, the structure of a power delivery network for providing power to the flip-flop circuit 2-6 may be simplified.

Figure 21:
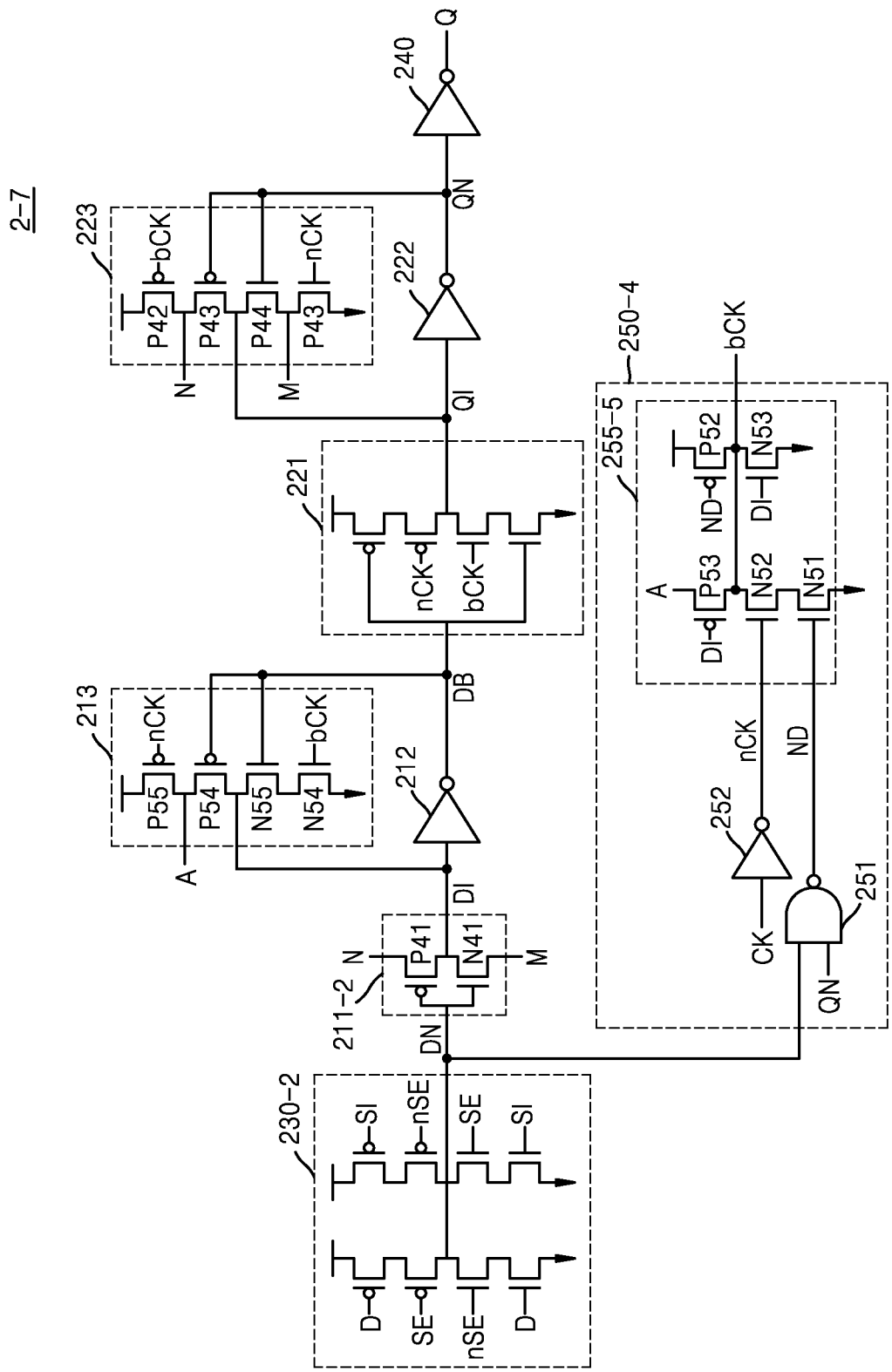
FIG. 21 is a circuit diagram for describing a flip-flop circuit according to an example embodiment.

FIG. 21 is a circuit diagram for describing a flip-flop circuit 2-7 according to an example embodiment.

Referring to FIG. 21, the flip-flop circuit 2-7 may include a control signal generation circuit 250-4, unlike the flip-flop circuit 2-6 of FIG. 20.

The control signal generation circuit 250-4 may include an AOI21 circuit 255-5. Unlike the AOI21 circuit 255-4 of FIG. 20, the second P-type transistor P52 included in the AOI21 circuit 255-5 may have a source terminal not connected to the fifth internal node A and connected to an additional positive power node.

When a logic level of a first control signal nCK is a second logic level, a logic level of the fifth internal node A may be the second logic level via the second tri-state inverter 213. That is, it may be understood that a negative power node may be connected to a source terminal of the third P-type transistor P53. Thus, the AOI21 circuit 255-5 may operate in the same way as the AOI21 circuit 255-3 of FIG. 19.

Because the second tri-state inverter 213-2 and the third P-type transistor P53 may share the same positive power node, and the second P-type transistor P52 may be connected to an additional positive power node, a power delivery network for providing power to the flip-flop circuit 2-7 may have various structures.

Figure 22:
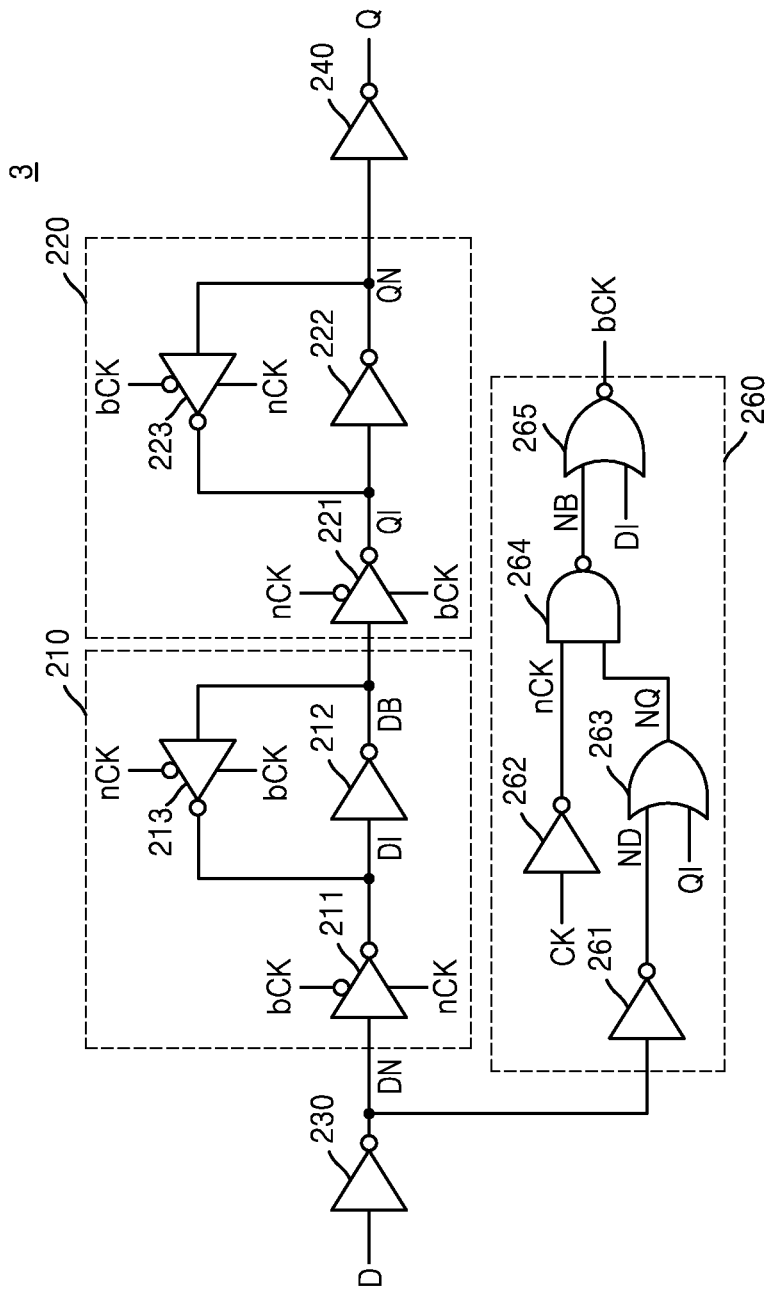
FIG. 22 is a circuit diagram for describing a flip-flop circuit according to an example embodiment.

FIG. 22 is a circuit diagram for describing a flip-flop circuit 3 according to an example embodiment.

Referring to FIG. 22, the flip-flop circuit 3 may include a control signal generation circuit 260, unlike the flip-flop circuit 2 of FIG. 14.

The control signal generation circuit 260 may receive a signal of the first node DN, a signal of the second node DI, a signal of the fourth node QI, and a clock signal CK and generate a first control signal nCK and a second control signal bCK.

The control signal generation circuit 260 may include a fifth inverter 261, a sixth inverter 262, an OR circuit 263, an AND circuit 264, and a NOR circuit 265.

The fifth inverter 261 may invert the signal of the first node DN and transmit the inverted signal to the sixth node ND. The sixth inverter 262 may invert the clock signal CK to generate the first control signal nCK. The OR circuit 263 may perform an OR operation on a signal of the sixth node ND and a signal of the fourth node QI and transmit a signal generated by the OR operation to the seventh node NQ. The AND circuit 264 may perform an AND operation on the first control signal nCK and a signal of the seventh node NQ and transmit a signal generated by the AND operation to an eighth node NB. The NOR circuit 265 may perform a NOR operation on a signal of the eighth node NB and a signal of the second node DI to generate the second control signal bCK.

The flip-flop circuit 3 according to an example embodiment may generate the second control signal bCK in synchronization with the first node DN, the second node DI, and the fourth node QI. Thus, compared to when the second control signal bCK is generated by simply inverting the first control signal nCK, the number of times of toggling of the second control signal bCK may be reduced. Thus, the flip-flop circuit 2 may consume less power.

Figure 23A:
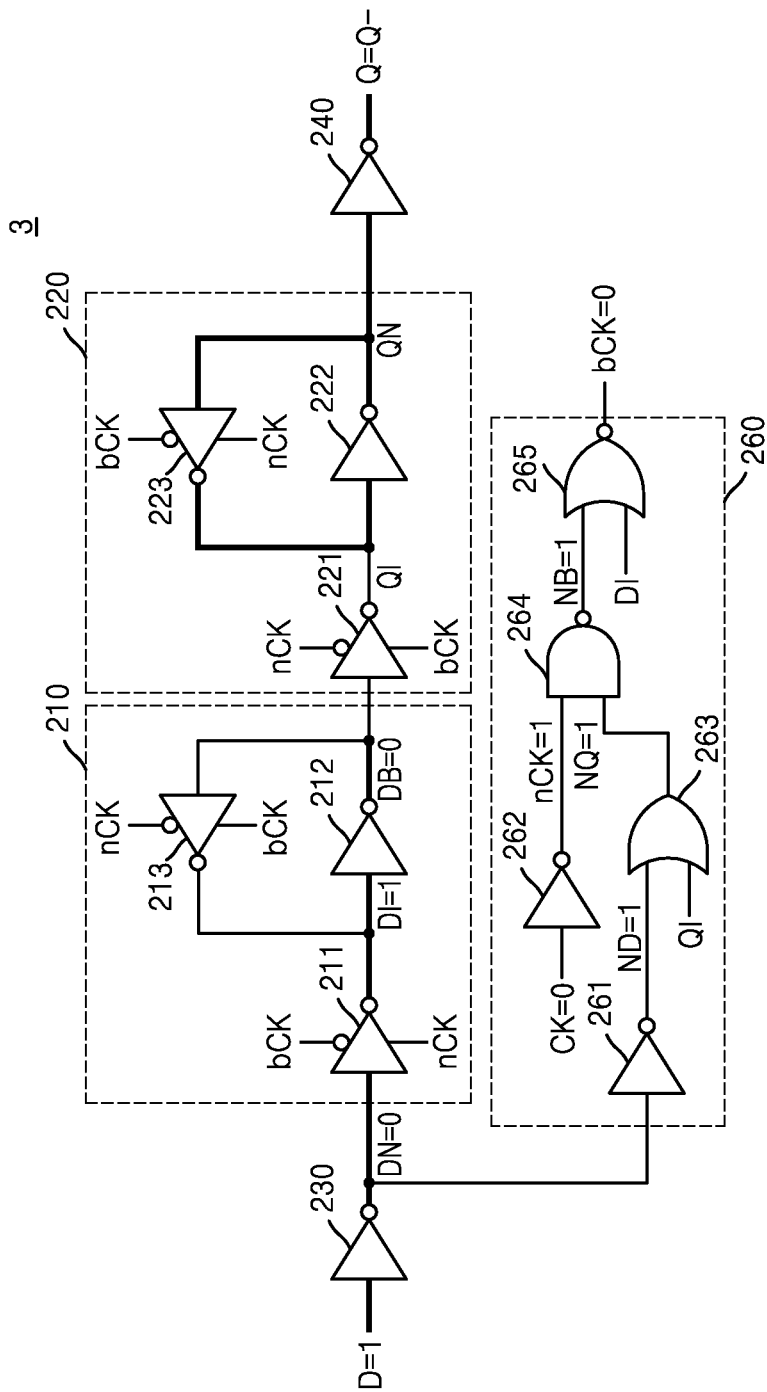
FIGS. 23A through 23D are circuit diagrams for describing an operation of a flip-flop circuit according to an example embodiment.

FIGS. 23A through 23D are circuit diagrams for describing operations of the flip-flop circuit 3 according to an example embodiment. FIG. 23A describes the operation of the flip-flop circuit 3 when a data signal D has a first logic level, and a clock signal CK has a second logic level, FIG. 23B describes the operation of the flip-flop circuit 3 when the data signal D has the first logic level, and the clock signal CK is transited to the first logic level, FIG. 23C describes the operation of the flip-flop circuit 3 when the data signal D has the second logic level, and the clock signal CK has the second logic level, and FIG. 23D describes the operation of the flip-flop circuit 3 when the data signal D has the second logic level, and the clock signal CK is transited to the first logic level. In FIGS. 23A through 23D, the first logic level may be indicated as "1," and the second logic level may be indicated as "0."

Referring to FIG. 23A, the clock signal CK may have the second logic level, and thus, the first control signal nCK may have the first logic level via the sixth inverter 262. A logic level of the first node DN may be the second logic level via the input inverter 230. A logic level of the sixth node ND may be the first logic level via the fifth inverter 261. A logic level of the seventh node NQ may be the first logic level via the OR circuit 263. A logic level of the eighth node NB may be the first logic level via the AND circuit 264. A logic level of the second control signal bCK may be the second logic level via the NOR circuit 265.

Because the logic level of the first control signal nCK may be the first logic level, and the logic level of the second control signal bCK may be the second logic level, the first and fourth tri-state inverters 211 and 223 may be in an active state, and the second and third tri-state inverters 213 and 221 may be in an inactive state. Thus, a logic level of the second node DI may be the first logic level via the first tri-state inverter 211, and a logic level of the third node DB may be the second logic level via the first inverter 212. The second inverter 222 and the fourth tri-state inverter 223 may perform a latch operation, and thus, logic levels of the fourth node QI and the fifth node QN may be maintained. An output signal Q may be maintained as a logic level of a prior output signal Q– via the output inverter 240.

Figure 23B:
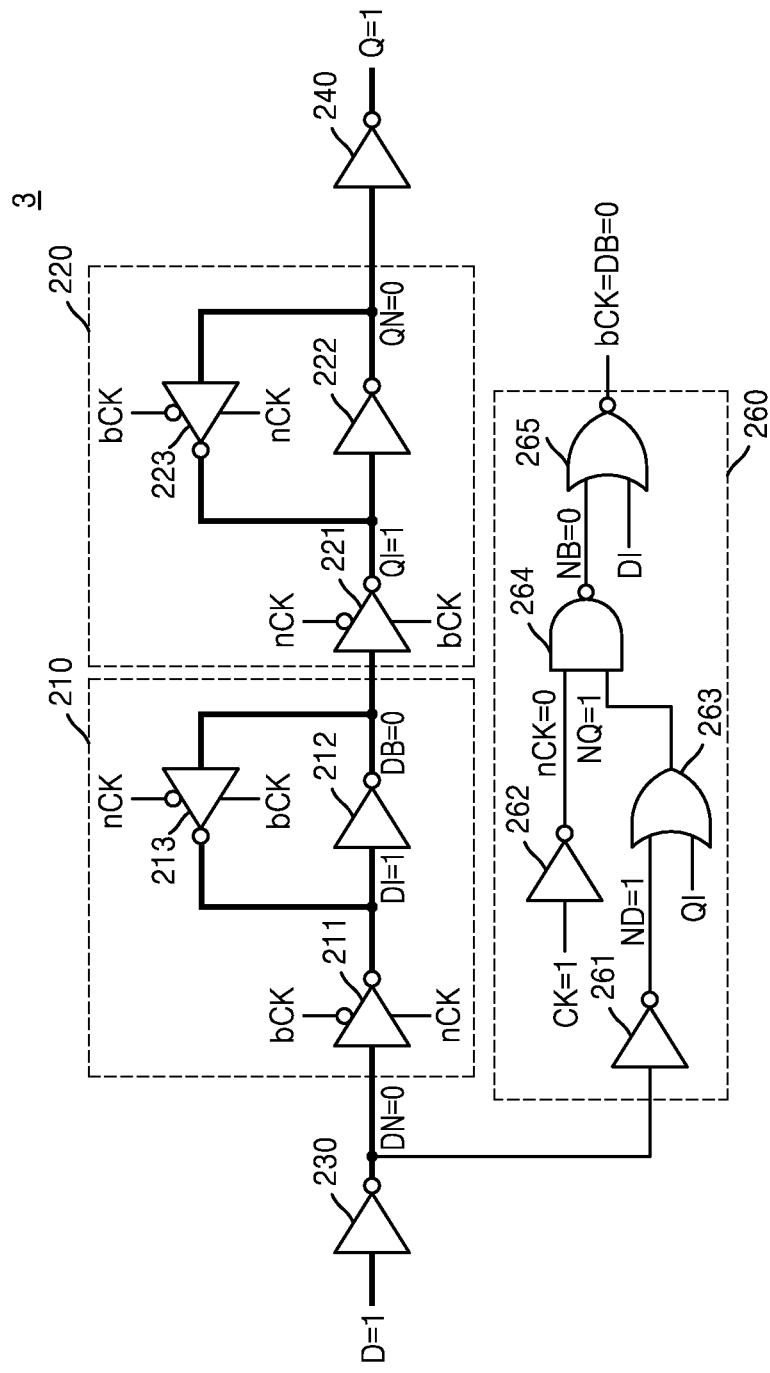

Referring to FIG. 23B, the clock signal CK may have the first logic level, and thus, the first control signal nCK may have the second logic level via the sixth inverter 262. The eighth node NB may have the second logic level via the AND circuit 264. A logic level of the second node DI may be the first logic level before the clock signal CK transitions, and thus, a logic level of the second control signal bCK may be the second logic level via the NOR circuit 265. A logic level of the first node DN may be the second logic level via the input inverter 230. When the logic level of the second control signal bCK is the second logic level, the first through fourth tri-state inverters 211, 213, 221, and 223 may operate as inverters with respect to an input signal having the second logic level.

Thus, the logic level of the second node DI may be the first logic level. A logic level of the third node DB may be the second logic level via the first inverter 212.

A logic level of the fourth node QI may be the first logic level via the third tri-state inverter 221. A logic level of the fifth node QN may be the second logic level via the second inverter 222. The output signal Q may have the first logic level via the output inverter 240.

Referring to FIGS. 23A and 23B, in a case in which the data signal D has the first logic level, the output signal Q may have the first logic level by being synchronized to the clock signal CK at a timing at which the clock signal CK transitions from the first logic level to the second logic level.

Figure 23C:
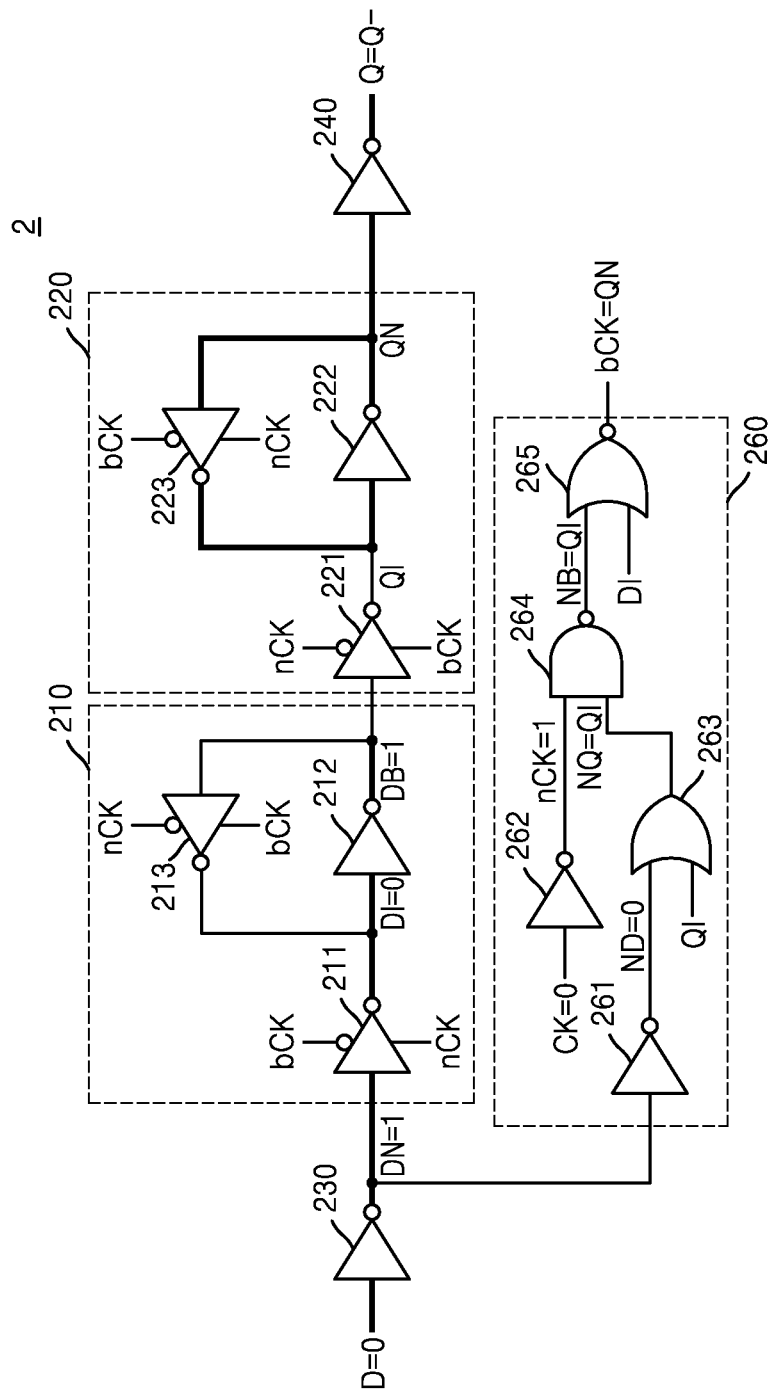

Referring to FIG. 23C, the clock signal CK may have the second logic level, and thus, the first control signal nCK may have the first logic level via the sixth inverter 262. The first tri-state inverter 211 may operate as an inverter with respect to a signal of the first node DN having the first logic level. Thus, a signal of the second node DI may have the second logic level. A signal of the third node DB may have the first logic level via the first inverter 212.

A signal of the first node DN may have the first logic level via the input inverter 230. A signal of the sixth node ND may have the second logic level via the fifth inverter 261. The seventh node NQ may have the same logic level as the fourth node QI via the OR circuit 263. The eighth node NB may have the same logic level as the fourth node QI via the AND circuit 264. A logic level of the second control signal bCK may be the same as a logic level of a signal of the fifth node QN via the NOR circuit 265.

When the second control signal bCK, that is, the signal of the fifth node QN, has the first logic level, the second and third tri-state inverters 213 and 221 may operate as inverters with respect to a signal of the third node DB. Thus, a signal of the fourth node QI may have the second logic level. The signal of the fifth node QN may have the first logic level via the second inverter 222. The second logic level may be maintained via the output inverter 240.

When the second control signal bCK, that is, the signal of the fifth node QN, has the second logic level, the fourth tri-state inverter 223 may operate as an inverter with respect to the fifth node QN. Thus, via a latch operation of the fourth tri-state inverter 233 and the second inverter 222, the logic levels of the fourth node QI and the fifth node QN may be maintained, and a logic level of the output signal Q may be maintained as a logic level of a prior output signal Q– via the output inverter 240.

Figure 23D:
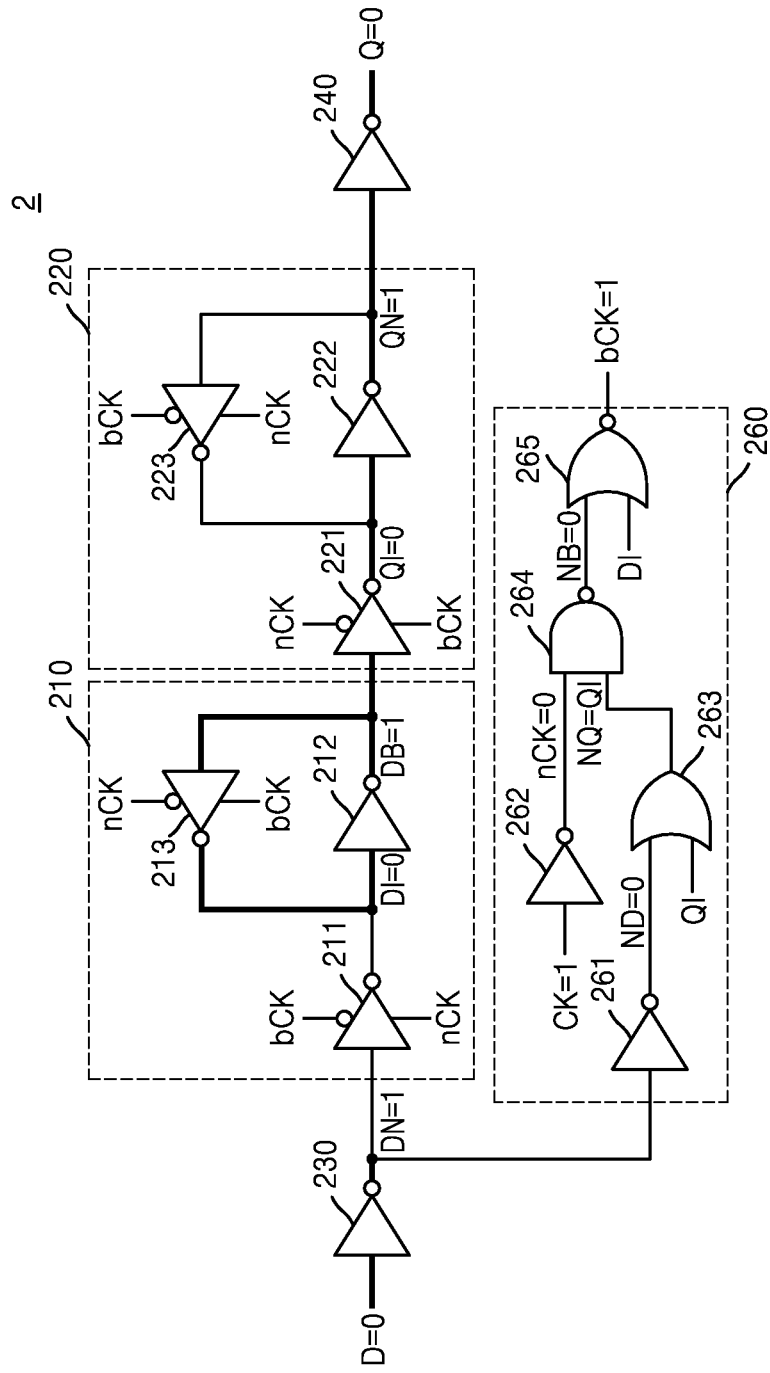

Referring to FIG. 23D, the clock signal CK may transition to the first logic level, and thus, the first control signal nCK may have the second logic level via the sixth inverter 262. A logic level of the eighth node NB may be the second logic level via the AND circuit 264. A signal of the second node DI may have the second logic level before the clock signal CK is transited, and thus, a logic level of the second control signal bCK may be the first logic level via the NOR circuit 265.

A logic level of the first control signal nCK may be the second logic level, and the logic level of the second control signal bCK may be the first logic level, and thus, the second and third tri-state inverters 213 and 221 may be in an active state. Thus, logic levels of the second node DI and the third node DB may be maintained via the second tri-state inverter 213 and the first inverter 212. A logic level of the fourth node QI may be the second logic level via the third tri-state inverter 221. A logic level of the fifth node QN may be the first logic level via the second inverter 222. A logic level of the output signal Q may be the second logic level via the output inverter 240.

Referring to FIGS. 23C and 23D, in a case in which the data signal D has the second logic level, the output signal Q may have the second logic level by being synchronized to the clock signal CK at a timing at which the clock signal CK transitions from the first logic level to the second logic level.

Figure 24:
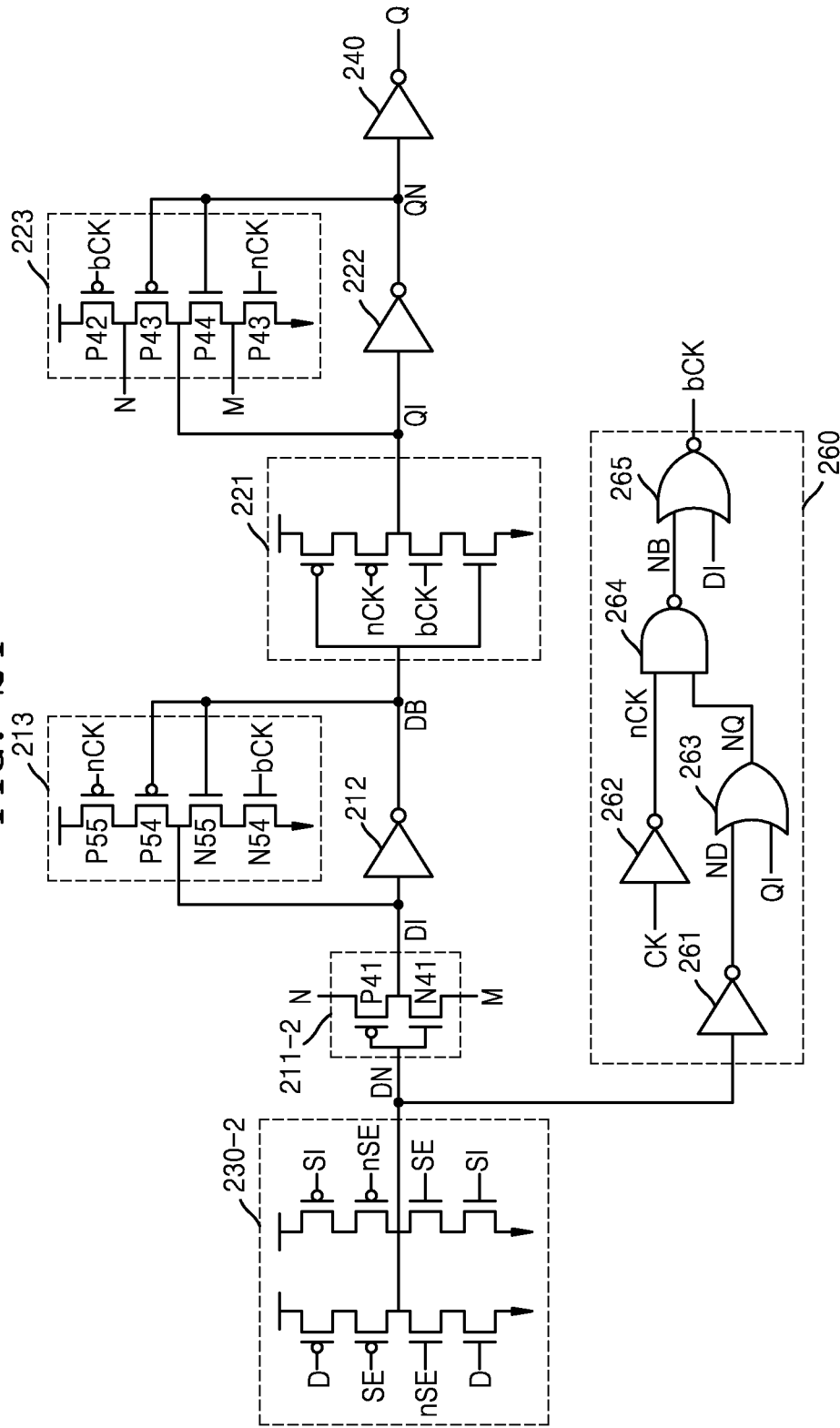
FIG. 24 is a circuit diagram for describing a flip-flop circuit according to an example embodiment.

FIG. 24 is a circuit diagram for describing a flip-flop circuit 3-2 according to an example embodiment.

Referring to FIG. 24, unlike the flip-flop circuit 3 of FIG. 22, the flip-flop circuit 3-2 may include the selection circuit 230-2 and the first tri-state inverter 211-2. The selection circuit 230-2 and the first tri-state inverter 211-2 are described above with reference to FIG. 16, and thus, may not be described again.

Figure 25:
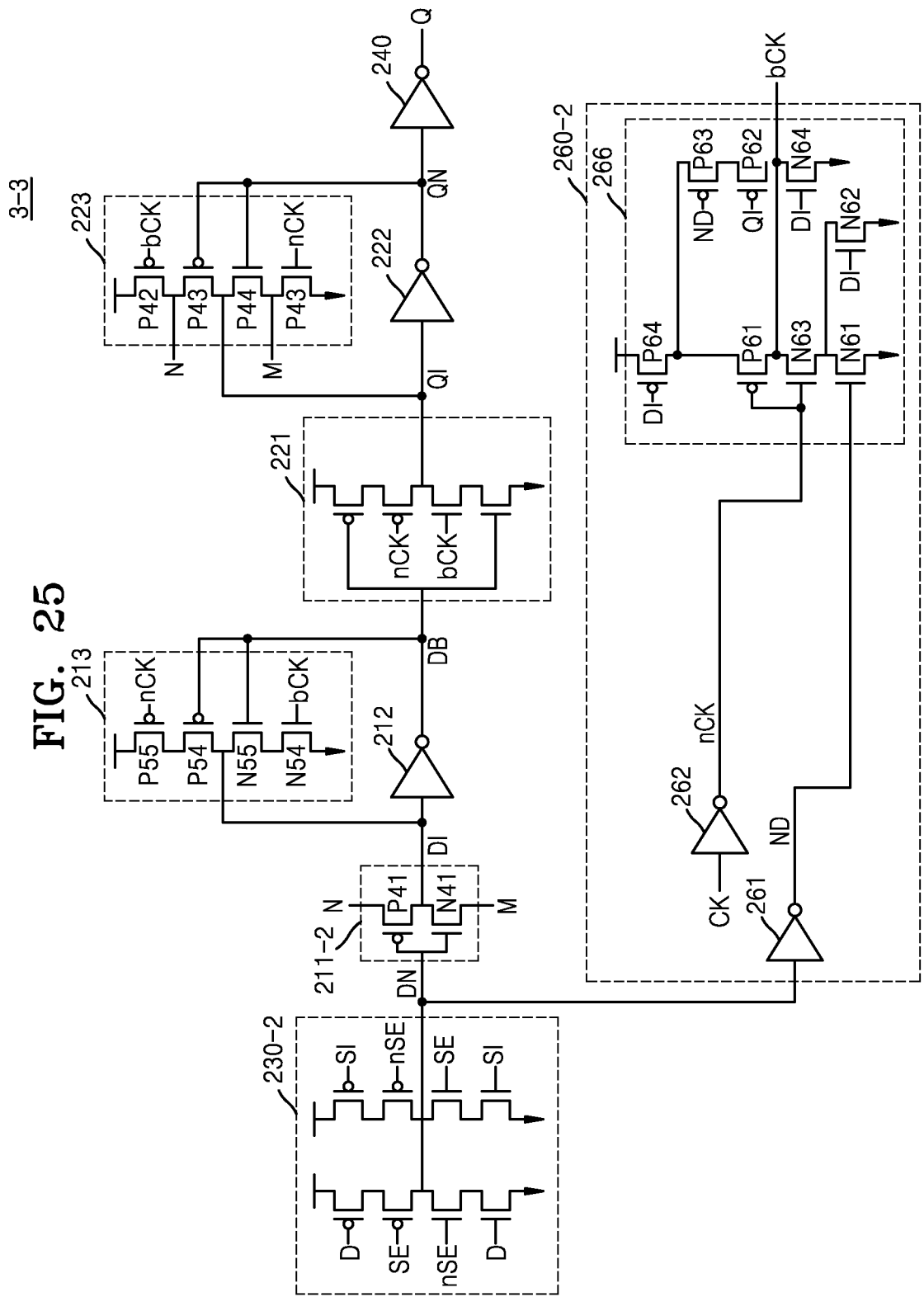
FIG. 25 is a circuit diagram for describing a flip-flop circuit according to an example embodiment.

FIG. 25 is a circuit diagram for describing a flip-flop circuit 3-3 according to an example embodiment.

Referring to FIG. 25, the flip-flop circuit 3-3 may include an or-and-or-inverter (OAOI) circuit 266, unlike the flip-flop circuit 3-2 of FIG. 24. The OAOI circuit 266 may perform the functions of the OR circuit 263, the AND circuit 264, and the NOR circuit 265 of FIG. 24.

The OAOI circuit 266 may include first through fourth N-type transistors N61 through N64 and first through fourth P-type transistors P61 through P64.

The first N-type transistor N61 may have a gate terminal connected to the sixth node ND, a source terminal connected to a negative power node, and a drain terminal connected to a source terminal of the third N-type transistor N63. The second N-type transistor N62 may have a gate terminal connected to the fourth node QI, a source terminal connected to the negative power node, and a drain terminal connected to the source terminal of the third N-type transistor N63. The third N-type transistor N63 may have a gate terminal receiving a first control signal nCK, the source terminal commonly connected to the drain terminals of the first and second N-type transistors P61 and P62, and a drain terminal connected to a node generating a second control signal bCK. The fourth N-type transistor N64 may have a gate terminal connected to the second node DI, a source terminal connected to the negative power node, and a drain terminal to the node generating the second control signal bCK.

The first P-type transistor P61 may have a gate terminal receiving the first control signal nCK, a source terminal connected to a drain terminal of the fourth P-type transistor P64, and a drain terminal connected to the node generating the second control signal bCK. The second P-type transistor P62 may have a gate terminal connected to the fourth node QI, a source terminal connected to a drain terminal of the third P-type transistor P63, and a drain terminal connected to the node generating the second control signal bCK. The third P-type transistor P63 may have a gate terminal connected to the sixth node ND, a source terminal connected to the drain terminal of the fourth P-type transistor P64, and the drain terminal connected to the source terminal of the second P-type transistor P62. The fourth P-type transistor P64 may have a gate terminal connected to the second node DI, a source terminal connected to a positive power node, and the drain terminal commonly connected to the source terminals of the first and third P-type transistors P61 and P63.

Figure 26:
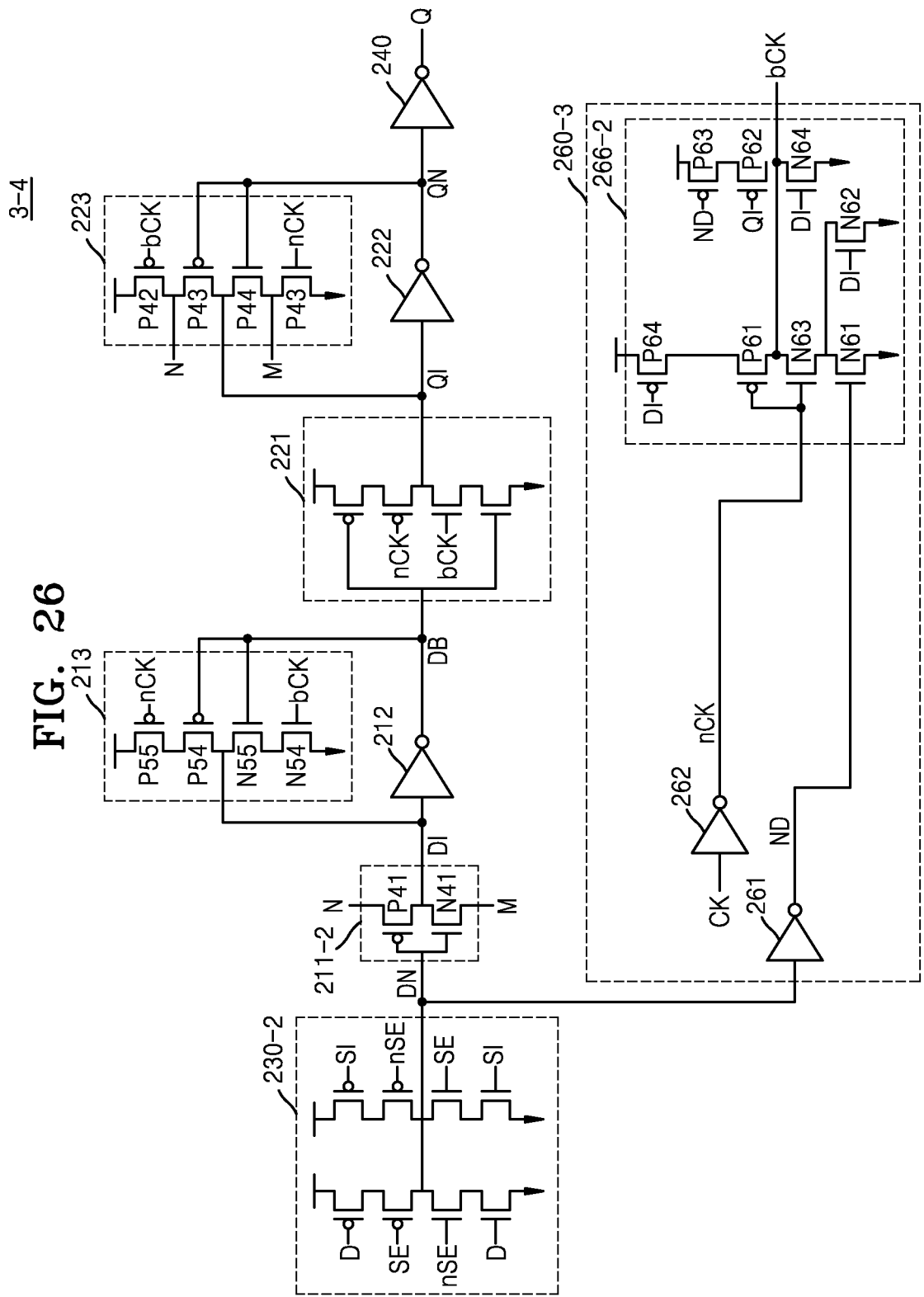
FIG. 26 is a circuit diagram for describing a flip-flop circuit according to an example embodiment.

FIG. 26 is a circuit diagram for describing a flip-flop circuit 3-4 according to an example embodiment.

Referring to FIG. 26, the flip-flop circuit 3-4 may include a control signal generation circuit 260-3, unlike the flip-flop circuit 3-3 of FIG. 25.

The control signal generation circuit 260-3 may include an OAOI circuit 266-2.

Unlike the OAOI circuit 266 of FIG. 25, in the OAOI circuit 266-2, the source terminal of the third P-type transistor P63 may be connected to an additional positive power node, rather than the drain terminal of the fourth P-type transistor P64.

The positive power node may be connected to each of the third P-type transistor P63 and the fourth P-type transistor P64, and thus, a signal security of a power delivery network may be improved.

Figure 27:
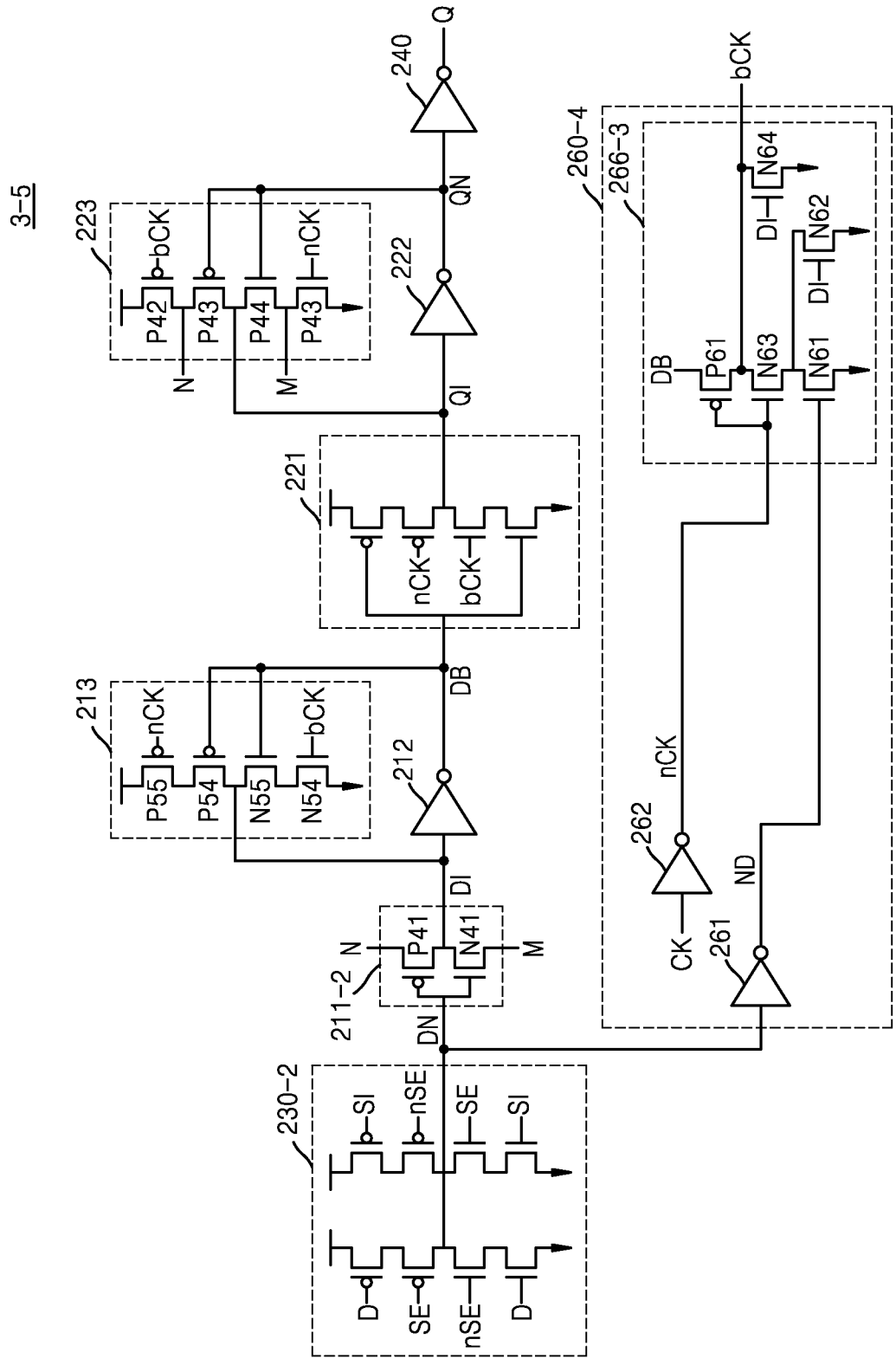
FIG. 27 is a circuit diagram for describing a flip-flop circuit according to an example embodiment.

FIG. 27 is a circuit diagram for describing a flip-flop circuit 3-5 according to an example embodiment.

Referring to FIG. 27, the flip-flop circuit 3-5 may include a control signal generation circuit 260-4, unlike the flip-flop circuit 3-3 of FIG. 25.

The control signal generation circuit 360-4 may include an OAOI circuit 266-3.

Unlike the OAOI circuit 266-2 of FIG. 26, the OAOI circuit 266-3 may only include the first P-type transistor P61, excluding the second through fourth P-type transistors P62 through P64 in FIG. 26.

Referring to FIGS. 23D and 26, when the first control signal nCK has a second logic level, and a logic level of the second node DI is the second logic level, logic levels of both of the fourth node QI and the sixth node ND may be the second logic level. Thus, in the OAOI circuit 266-2 of FIG. 26, the second and third P-type transistors P62 and P63 and the first and fourth P-type transistors P61 and P64 may simultaneously pre-charge the second control signal bCK.

Thus, in the OAOI circuit 266-3 of FIG. 27, the second and third P-type transistors P62 and P63 may be removed to improve integration.

Also, when the second node DI has the second logic level, the third node DB may always have the first logic level via the first inverter 212. Thus, in the OAOI circuit 266-3 according to an example embodiment, the fourth P-type transistor P64 having the gate terminal connected to the second node DI may be removed, and the first P-type transistor P61 having the source terminal connected to the third node DB may be provided, to provide high integration.

Figure 28:
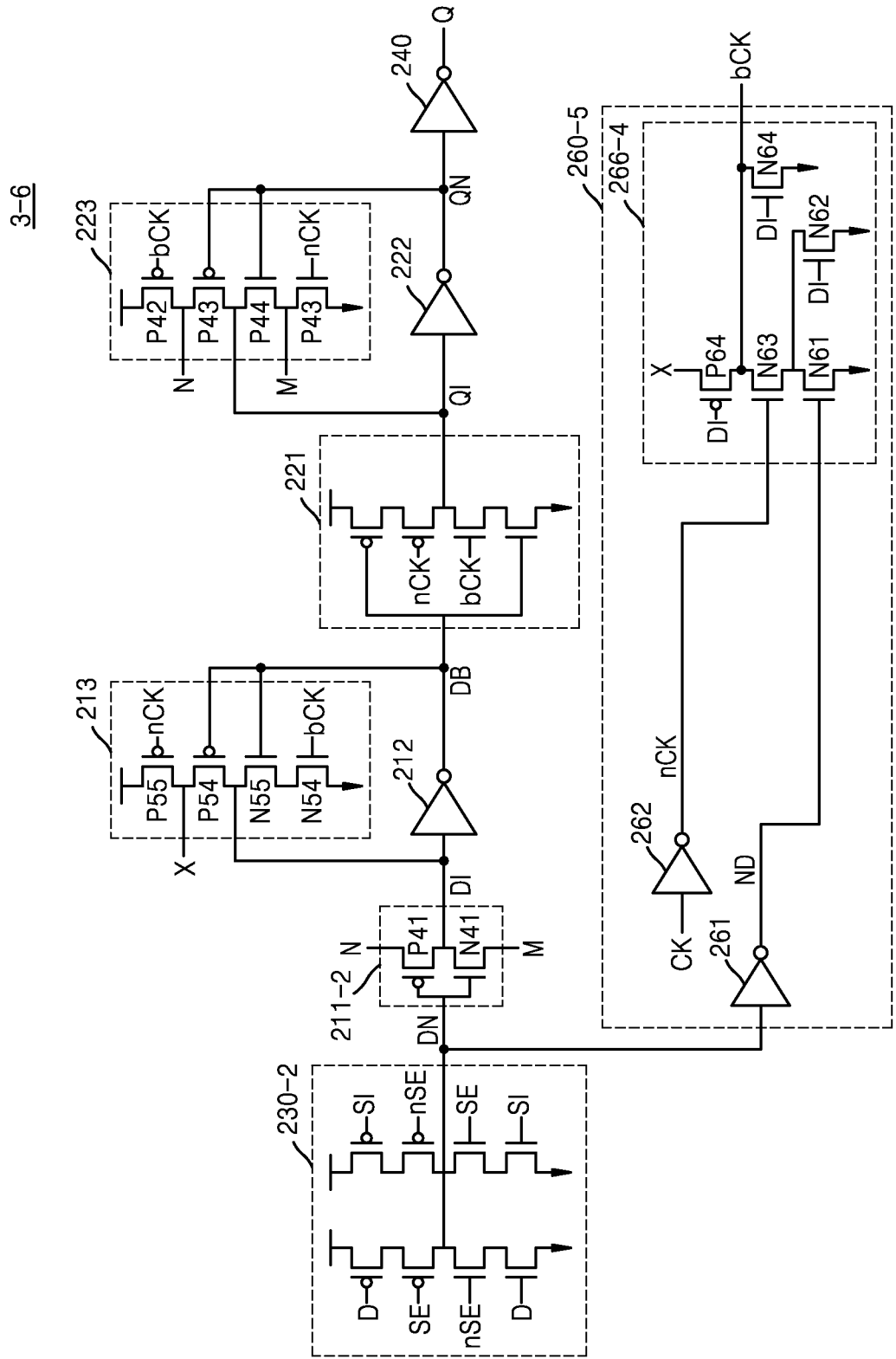
FIG. 28 is a circuit diagram for describing a flip-flop circuit according to an example embodiment.

FIG. 28 is a circuit diagram for describing a flip-flop circuit 3-6 according to an example embodiment.

Referring to FIG. 28, the flip-flop circuit 3-6 may include a control signal generation circuit 260-5, unlike the flip-flop circuit 3-3 of FIG. 25.

The control signal generation circuit 260-5 may include an OAOI circuit 266-4.

Compared with the OAOI circuit 266 of FIG. 25, the first P-type transistor P61 of the OAOI circuit 266-4 may have a gate terminal connected to the second node DI and a source terminal connected to a sixth internal node X.

The sixth internal node X may be an internal node of the second tri-state inverter 213. For example, the second tri-state inverter 213 may include the fifth P-type transistor P55 having the gate terminal receiving the first control signal nCK, the source terminal connected to the positive power node, and the drain terminal connected to the sixth internal node X.

Figure 29:
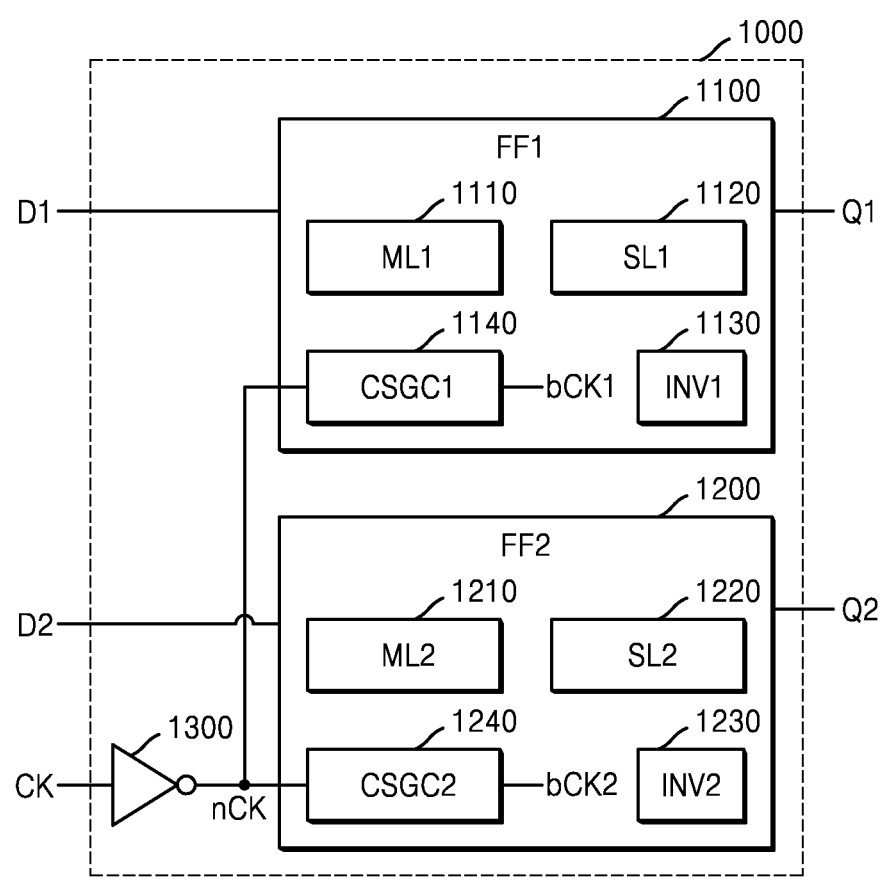
FIG. 29 is a diagram for describing a multi-bit flip-flop circuit according to an example embodiment.

FIG. 29 is a diagram for describing a multi-bit flip-flop circuit 1000 according to an example embodiment.

Referring to FIG. 29, the multi-bit flip-flop circuit 1000 may receive first and second data signals D1 and D2 and, according to a clock signal CK, may output first and second output signals Q1 and Q2. Embodiments are not limited thereto, and the multi-bit flip-flop circuit 1000 may receive a plurality of data signals and, according to the clock signal CK, may output a plurality of output signals.

The multi-bit flip-flop circuit 1000 may include a first flip-flop circuit (FF1) 1100 and a second flip-flop circuit (FF2) 1200.

The first flip-flop circuit 1100 may include a first master latch circuit (ML1) 1110, a first slave latch circuit (SL1) 1120, a first output inverter (INV1) 1130, and a first control signal generation circuit (CSGC1) 1140. The first flip-flop circuit 1100 may further include an input inverter inverting a first data signal D1. The first master latch circuit 1100 may include at least one component of the master latch circuits described above, and the first slave latch circuit 1120 may include at least one component of the slave latch circuits described above. The first control signal generation circuit 1140 may include at least one component of the control signal generation circuits described above.

The second flip-flop circuit 1200 may include a second master latch circuit (ML2) 1210, a second slave latch circuit (SL2) 1220, a second output inverter (INV2) 1230, and a second control signal generation circuit (CSGC2) 1240. The second flip-flop circuit 1200 may further include an input inverter inverting a second data signal D2. The second master latch circuit 1210 may include at least one component of the master latch circuits described above, and the second slave latch circuit 1220 may include at least one component of the slave latch circuits described above. The second control signal generation circuit 1240 may include at least one component of the control signal generation circuits described above.

The first control signal generation circuit 1140 may generate a control signal bCK1, based on a signal of an internal node (for example, the first node DN of FIG. 1) of the first master latch circuit 1110, an internal node (for example, the fifth node QN of FIG. 14) of the first slave latch circuit 1120, or a node (for example, the second node DB of FIG. 27) between the first master latch circuit 1110 and the first slave latch circuit 1120, and an inverted clock signal nCK.

The second control signal generation circuit 1240 may generate a control signal bCK2, based on a signal of an internal node (for example, the first node DN of FIG. 1) of the second master latch circuit 1210, an internal node (for example, the fifth node QN of FIG. 14) of the second slave latch circuit 1220, or a node (for example, the second node DB of FIG. 27) between the second master latch circuit 1210 and the second slave latch circuit 1220, and an inverted clock signal nCK.

While the inventive concept has been particularly shown and described with reference to embodiments thereof, it will be understood that various changes in form and details may be made therein without departing from the spirit and scope of the following claims.

What is claimed is:
1. A flip-flop circuit comprising:
a first master latch circuit configured to transmit a first inverted signal of a first input signal received from an external device to a first node and transmit a second inverted signal of the first inverted signal at the first node to a second node, based on a first control signal having a first logic level or a second control signal having a second logic level;
a first slave latch circuit configured to transmit a third inverted signal of the second inverted signal at the second node to a third node according to the first control signal having the second logic level or the second control signal having the first logic level;

a first output inverter configured to generate a first output signal by inverting the third inverted signal at the third node; and a first control signal generation circuit configured to generate the first control signal and the second control signal based on a clock signal and the first inverted signal at the first node, wherein the first slave latch circuit comprises a first tri-state inverter configured to transmit the second inverted signal of the second node to the third node based on the first control signal and the second control signal, and wherein the first tri-state inverter comprises:
 a first P-type transistor having a gate terminal configured to receive the second inverted signal of the second node;
 a second P-type transistor having a gate terminal configured to receive the first control signal; and
 a first N-type transistor having a gate terminal configured to receive the second control signal, a drain terminal connected to the third node, and a source terminal directly connected to a negative power node,
 wherein the first P-type transistor and the second P-type transistor are connected in series to form a first series structure, and
 wherein an end of the first series structure is connected to a positive power node, and the other end of the first series structure is connected to the third node.

2. The flip-flop circuit of claim 1, wherein the first control signal generation circuit comprises:
 an inverter configured to generate the first control signal by inverting the clock signal received from the external device; and
 a first NOR circuit configured to generate the second control signal by performing a NOR operation on the first inverted signal of the first node and the first control signal.

3. The flip-flop circuit of claim 2, wherein the first NOR circuit comprises:
 a third P-type transistor having a gate terminal configured to receive the first control signal, a source terminal connected to the second node, and a drain terminal connected to a node configured to generate the second control signal;
 a second N-type transistor having a gate terminal configured to receive the first control signal, a source terminal connected to a negative power node, and a drain terminal connected to the node configured to generate the second control signal; and
 a third N-type transistor having a gate terminal connected to the first node, a source terminal connected to the negative power node, and a drain terminal connected to the node configured to generate the second control signal.

4. The flip-flop circuit of claim 1, wherein the first master latch circuit comprises a selection circuit configured to receive a data signal and a scan input signal as the first input signal, receive a scan enable signal and an inverted scan enable signal from the external device, and transmit the first inverted signal based on one of the data signal and the scan input signal to the first node according to the scan enable signal and the inverted scan enable signal.

5. The flip-flop circuit of claim 4, wherein the selection circuit comprises:

a delay circuit configured to delay the scan input signal to generate a delayed scan input signal based on the scan enable signal having the first logic level; and an inversion circuit configured to receive the delayed scan input signal from the delay circuit and transmit the first inverted signal including the scan input signal to the first node.

6. The flip-flop circuit of claim 4, wherein the first slave latch circuit comprises:
 a fourth P-type transistor having a gate terminal configured to receive the second control signal, a source terminal connected to a positive power node, and a drain terminal connected to a fourth node; and
 a fourth N-type transistor having a gate terminal configured to receive the first control signal, a source terminal connected to a negative power node, and a drain terminal connected to a fifth node, and
 the selection circuit is connected to the negative power node through the fifth node when the first control signal has the first logic level and is connected to the positive power node through the fifth node when the second control signal has the second logic level.

7. The flip-flop circuit of claim 6, wherein the selection circuit comprises:
 a fifth P-type transistor having a gate terminal configured to receive the data signal, a source terminal connected to the fourth node, and a drain terminal connected to a sixth node;
 a sixth P-type transistor having a gate terminal configured to receive the scan enable signal, a source terminal connected to the sixth node, and a drain terminal connected to the first node;
 a fifth N-type transistor having a gate terminal configured to receive the inverted scan enable signal, a source terminal connected to a seventh node, and a drain terminal connected to the first node; and
 a sixth N-type transistor having a gate terminal configured to receive the data signal, a source terminal connected to the fifth node, and a drain terminal connected to the seventh node,
 wherein the sixth node and the seventh node are connected with each other via a conductive line.

8. The flip-flop circuit of claim 1, wherein the first master latch circuit comprises a second NOR circuit configured to receive a reset signal and the first inverted signal of the first node and transmit a result of a NOR operation on the reset signal and the first inverted signal of the first node to the second node, and
 wherein the first control signal generation circuit comprises a third NOR circuit configured to receive the reset signal and the clock signal, and perform a NOR operation on the reset signal and the clock signal to generate the first control signal.

9. The flip-flop circuit of claim 1, further comprising:
 a second master latch circuit configured to transmit an inverted signal of a second input signal received from the external device to an eighth node and transmit a fourth inverted signal of the inverted signal at the eighth node to a ninth node, according to the first control signal having the first logic level or the second control signal having the second logic level;
 a second slave latch circuit configured to transmit a fifth inverted signal of the fourth inverted signal to a tenth node according to the first control signal having the second logic level or the second control signal having the first logic level;

a second output inverter configured to generate a second output signal by inverting the fifth inverted signal of the tenth node; and a second control signal generation circuit configured to generate the second control signal based on the clock signal and the fourth inverted signal of the ninth node.

10. A flip-flop circuit comprising:

an input circuit configured to invert an input signal received from an external device and transmit a first inverted signal of the input signal to a first node;

a master latch circuit configured to transmit a second inverted signal of the first inverted signal at the first node to a second node and transmit a third inverted signal of the second inverted signal at the second node to a third node, based on a first control signal having a first logic level or a second control signal having a second logic level;

a slave latch circuit configured to transmit a fourth inverted signal of the third inverted signal at the third node to a fourth node and transmit a fifth inverted signal of the fourth inverted signal at the fourth node to a fifth node, based on the first control signal having the second logic level or the second control signal having the first logic level;

an output inverter configured to generate an output signal by inverting the fifth inverted signal of the fifth node; and a control signal generation circuit configured to generate the first control signal and the second control signal based on a clock signal, the first inverted signal of the first node, the second inverted signal of the second node, and the fifth inverted signal of the fifth node.

11. The flip-flop circuit of claim 10, wherein the input circuit is further configured to receive a data signal and a scan input signal as the input signal, invert one of the data signal and the scan input signal according to a scan enable signal and an inverted scan enable signal, and transmit the inverted signal to the first node.

12. The flip-flop circuit of claim 11, wherein the master latch circuit comprises:

a first P-type transistor having a gate terminal connected to the first node, a source terminal connected to a sixth node, and a drain terminal connected to the second node; and a first N-type transistor having a gate terminal connected to the first node, a source terminal connected to a seventh node, and a drain terminal connected to the second node, and the slave latch circuit comprises:

a second P-type transistor having a gate terminal configured to receive the second control signal, a source terminal connected to a positive power node, and a drain terminal connected to the sixth node; and a second N-type transistor having a gate terminal configured to receive the first control signal, a source terminal connected to a negative power node, and a drain terminal connected to the seventh node.

13. The flip-flop circuit of claim 10, wherein the control signal generation circuit comprises:

an inverter configured to generate the first control signal by inverting the clock signal; and a NAND circuit configured to generate a signal of an eighth node by performing a NAND operation on the first inverted signal of the first node and the fifth inverted signal of the fifth node; and an and-or-inverter (AOI) circuit configured to generate the second control signal based on the first control signal, the signal of the eighth node, and the second inverted signal of the second node.

14. The flip-flop circuit of claim 13, wherein the AOI circuit comprises at least two of:

a third P-type transistor comprising a gate terminal configured to receive the first control signal, a fourth P-type transistor comprising a gate terminal configured to receive the signal of the eighth node, and a fifth P-type transistor comprising a gate terminal configured to receive the second inverted signal of the second node.

15. The flip-flop circuit of claim 14, wherein the third P-type transistor comprises a drain terminal connected to a node configured to generate the second control signal and a source terminal connected to a drain terminal of the fifth P-type transistor, wherein the fourth P-type transistor comprises a drain terminal connected to the node configured to generate the second control signal and a source terminal connected to the drain terminal of the fifth P-type transistor, and wherein the fifth P-type transistor comprises the drain terminal connected to the source terminal of the third P-type transistor and a source terminal connected to a positive power node.

16. The flip-flop circuit of claim 14, wherein the third P-type transistor further comprises a drain terminal connected to a node configured to generate the second control signal and a source terminal connected to a drain terminal of the fifth P-type transistor, wherein the fourth P-type transistor further comprises a drain terminal connected to the node configured to generate the second control signal and a source terminal connected to a positive power node, and wherein the fifth P-type transistor further comprises the drain terminal connected to the source terminal of the third P-type transistor and a source terminal connected to a positive power node.

17. The flip-flop circuit of claim 14, wherein the third P-type transistor further comprises a drain terminal connected to a node configured to generate the second control signal and a source terminal connected to the third node, and wherein the fourth P-type transistor further comprises a drain terminal connected to the node configured to generate the second control signal and a source terminal connected to the third node.

18. A flip-flop circuit comprising:

an input circuit configured to invert an input signal received from an external device and transmit a first inverted signal of the input signal to a first node;

a master latch circuit configured to transmit a second inverted signal of the first inverted signal at the first node to a second node and transmit a third inverted signal of the second inverted signal at the second node to a third node, based on a first control signal having a first logic level or a second control signal having a second logic level;

a slave latch circuit configured to transmit a fourth inverted signal of the third inverted signal at the third node to a fourth node and transmit a fifth inverted signal of the fourth inverted signal at the fourth node to a fifth node, based on the first control signal having the second logic level or the second control signal having the first logic level;

an output inverter configured to generate an output signal by inverting the fifth inverted signal of the fifth node; and a control signal generation circuit configured to generate the first control signal and the second control signal based on a clock signal, the first inverted signal of the first node, the second inverted signal of the second node, and the fourth inverted signal of the fourth node.

* * * * *